United States Patent [19]

Clark, II et al.

[11] Patent Number: 5,455,576
[45] Date of Patent: Oct. 3, 1995

[54] APPARATUS AND METHODS FOR LEMPEL ZIV DATA COMPRESSION WITH IMPROVED MANAGEMENT OF MULTIPLE DICTIONARIES IN CONTENT ADDRESSABLE MEMORY

[75] Inventors: Airell R. Clark, II, Corvallis; Jeffrey P. Tobin, Albany, both of Oreg.; Gadiel Seroussi, Cupertino, Calif.

[73] Assignee: Hewlett Packard Corporation, Palo Alto, Calif.

[21] Appl. No.: 192,878

[22] Filed: Feb. 7, 1994

Related U.S. Application Data

[63] Continuation-in-part of Ser. No. 996,808, Dec. 23, 1992, Pat. No. 5,373,290.
[51] Int. Cl.[6] ................................................. H03M 7/30
[52] U.S. Cl. ........................................... 341/50; 341/87
[58] Field of Search .................................. 341/50, 51, 59, 341/60, 81, 82, 87, 95, 106; 358/261.1

[56] References Cited

U.S. PATENT DOCUMENTS 4,929,946  5/1990  O'Brien et al. ........................ 341/87

5,342,054  8/1994  Chang et al. ........................ 273/186.1

Primary Examiner—Brian K. Young

[57] ABSTRACT

A class of lossless data compression algorithms use a memory-based dictionary of finite size to facilitate the compression and decompression of data. To reduce the loss in data compression caused by dictionary resets, a standby dictionary is used to store a subset of encoded data entries previously stored in a current dictionary. In a second aspect of the invention, data is compressed/decompressed according to the address location of data entries contained within a dictionary built in a content addressable memory (CAM). In a third aspect of the invention, the minimum memory/ high compression capacity of the standby dictionary scheme is combined with the fast single-cycle per character encoding/decoding capacity of the CAM circuit. In a fourth aspect of the invention, a selective overwrite dictionary swapping technique is used to allow all data entries to be used at all times for encoding character strings.

23 Claims, 27 Drawing Sheets

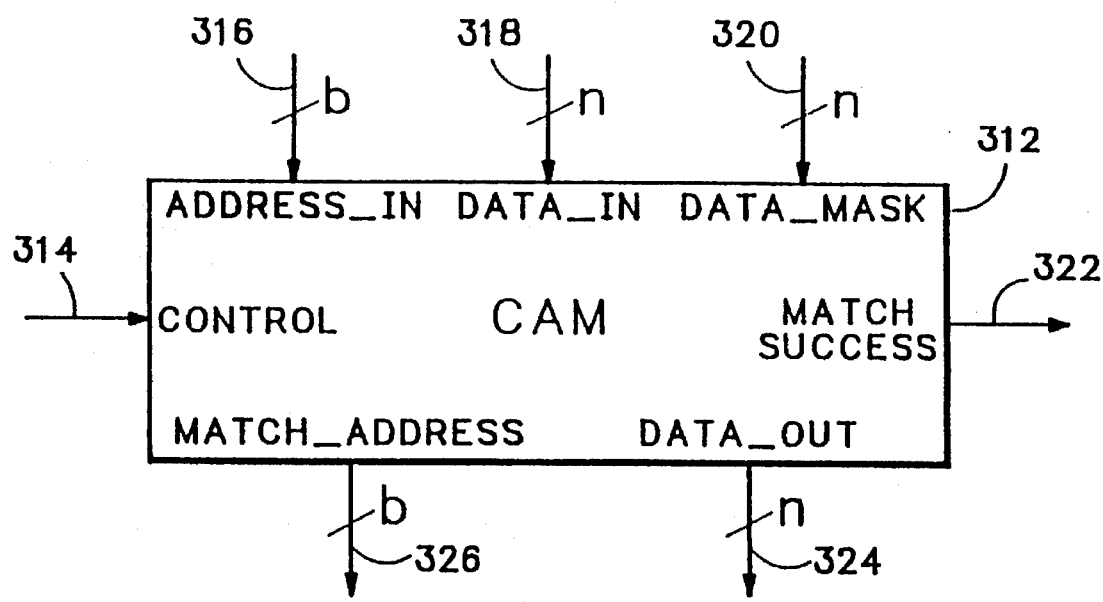
FIG. 11
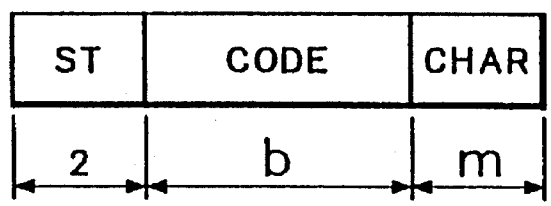
FIG. 12
| ST FIELD | STATE S=0 | S=1 | S=2 | S=3 |
|---|---|---|---|---|
| FREE | 00 | 10 | 11 | 01 |
| CD | 10 | 11 | 01 | 00 |
| SD | 11 | 01 | 00 | 10 |
| INV | 01 | 00 | 10 | 11 |
FIG. 13

|  | CODE | CHAR | ST |  |
|---|---|---|---|---|
| ADDR 0 | PREVCODE 1 | CH1 | CD | ← PREVCODE1, CH1 |
| ADDR 1 | PREVCODE 2 | CH2 | CD | ← PREVCODE2, CH2 |
| ADDR 2 | PREVCODE 3 | CH3 | CD | ← PREVCODE3, CH3 |
| ADDR 3 | PREVCODE 4 | CH4 | CD | ← PREVCODE4, CH4 |
| ADDR 4 | NULL | NULL | FREE/ PD |  |
| ADDR 5 | NULL | NULL | FREE/ PD |  |
| ADDR 6 | NULL | NULL | FREE/ PD |  |
| ADDR 7 | NULL | NULL | FREE/ PD |  |

FIG. 22(A)

| CODE | CHAR | ST |  |
|---|---|---|---|
| PREVCODE 1 | CH1 | SD | ← PREVCODE1, CH1 |
| PREVCODE 2 | CH2 | CD |  |
| PREVCODE 3 | CH3 | CD | ← PREVCODE3, CH3 |
| PREVCODE 4 | CH4 | CD | ← PREVCODE4, CH4 |
| NULL | NULL | FREE/ PD |  |
| NULL | NULL | FREE/ PD |  |
| NULL | NULL | FREE/ PD |  |
| NULL | NULL | FREE/ PD |  |

FIG. 22(B)

APPARATUS AND METHODS FOR LEMPEL ZIV DATA COMPRESSION WITH IMPROVED MANAGEMENT OF MULTIPLE DICTIONARIES IN CONTENT ADDRESSABLE MEMORY

This application is a continuation in part of copending U.S. application Ser. No. 07/996,808 filed Dec. 23, 1992 now U.S. Pat. No. 5,373,290.

BACKGROUND OF THE INVENTION

This invention relates generally to data compression and decompression methods and apparatus, and more particularly to implementations of lossless data compression algorithms which use a dictionary to store compression and decompression information.

A major class of compression schemes encodes multiple-character strings using binary sequences or "codewords" not otherwise used to encode individual characters. The strings are composed of an "alphabet," or single-character strings. This alphabet represents the smallest unique piece of information the compressor processes. Thus, an algorithm which uses eight bits to represent its characters has 256 unique characters in its alphabet. Compression is effective to the degree that the multiple-character strings represented in the encoding scheme are encountered in a given file of data stream. By analogy with bilingual dictionaries used to translate between human languages, the device that embodies the mapping between uncompressed code and compressed code is commonly referred to as a "dictionary."

Generally, the usefulness of a dictionary-based compression scheme is dependent on the frequency with which the dictionary entries for multiple-character strings are used. If a fixed dictionary is optimized for one file type it is unlikely to be optimized for another. For example, a dictionary which includes a large number of character combinations likely to be found in newspaper text files is unlikely to compress efficiently data base files, spreadsheet files, bit-mapped graphics files, computer-aided design files, et cetera.

Adaptive compression schemes are known in which the dictionary used to compress given input data is developed while that input data is being compressed. Codewords representing every single character possible in the uncompressed input data are put into the dictionary. Additional entries are added to the dictionary as multiple-character strings are encountered in the file. The additional dictionary entries are used to encode subsequent occurrences of the multiple-character strings. For example, matching of current input patterns is attempted only against phrases currently residing in the dictionary. After each failed match, a new phrase is added to the dictionary. The new phrase is formed by extending the matched phrase by one symbol (e.g., the input symbol that "breaks" the match). Compression is effected to the extent that the multiple-character strings occurring most frequently in the file are encountered as the dictionary is developing.

During decompression, the dictionary is built in a like manner. Thus, when a codeword for a character string is encountered in the compressed file, the dictionary contains the necessary information to reconstruct the corresponding character string. Widely-used compression algorithms that use a dictionary to store compression and decompression information are the first and second methods of Lempel and ziv, called LZ1 and LZ2 respectively. These methods are disclosed in U.S. Pat. No. 4,464,650 to Eastman et al., and various improvements in the algorithms are disclosed in U.S. Pat. Nos. 4,558,302 to Welch, and 4,814,746 to Miller et al. These references further explain the use of dictionaries.

When working on a practical implementation, the amount of memory available for compression/decompression is finite. Therefore, the number of entries in the dictionary is finite and the length of the codewords used to encode the entries is bounded. Typically, the length varies between 12 and 16 bits. When the input data sequence is sufficiently long, the dictionary will eventually "fill up." Several courses of action are possible at this point. For example, the dictionary can be frozen in its current state, and used for the remainder of the input sequence. In a second approach, the dictionary is reset and a new dictionary created from scratch. In a third approach, the dictionary is frozen for some time, until the compression ratio deteriorates, then the dictionary is reset.

The first alternative has the disadvantage of losing the learning capability of the basic compression algorithm. If the statistics of the input data change, the dictionary no longer follows those changes, and a rapid deterioration in compression ratio will occur.

A dictionary reset method maintains the learning capability of the algorithm, but suffers from a temporary deterioration in compression ratio when switched to an empty dictionary (e.g., all previously accumulated knowledge of the source is lost). For example, upon reset, all entries of the dictionary are indiscriminately disabled. Therefore, recently obtained dictionary entries, that would likely be utilized in further data compression, are lost along with older data entries that have a lower probability of further assisting in the compression and decompression process. Since all data entries are lost during a dictionary reset, the compression ratio is likely to temporarily deteriorate. Thus, the compression efficiency is less than optimal.

One method for increasing the efficiency of dictionary based data compression is discussed by Bunton and Borriello in PRACTICAL DICTIONARY MANAGEMENT FOR HARDWARE DATA COMPRESSION, Communications of the ACM, January 1992, Vol 35, No. 1. Entire dictionary resets are avoided by replacing one dictionary entry at a time. The least recently used (LRU) code is selected and then overwritten with the next input character string. The Bunton, et. al. method improves the compression ratio but has the disadvantage of requiring a large number of additional bits for each dictionary entry to identify LRU status. Additional bits for each dictionary entry result in significantly increased hardware costs.

One method for reducing the number of required dictionary resets is to increase the dictionary memory size. Increased memory size, however, increases cost and can increase the time required to search dictionary data entries. In addition, present LRU tracking methods become less practical with increased memory size.

Another bottleneck to compression/decompression performance is the amount of time required to search the dictionary for previously encountered character strings. Traditionally, hashing algorithms are used to search for previously-stored dictionary entries and to locate available memory locations for new character strings. Typical arrangements use a RAM memory with two to four storage locations for each dictionary entry, as disclosed in U.S. Pat. No. 4,558,302 to Welch (LZW).

The hashing algorithm maps each unique dictionary entry into the RAM space at an address based on some simple arithmetic function of the data word contents. Since such an algorithm uses the entire word or fields within the word to calculate the mapping address, more than one data word might map to the same location in memory, causing a hashing collision. In this case, an alternative location must be found for the data. Inevitably, as the RAM locations fill up, a second dictionary entry will hash to a previously-used location. This situation must be resolved before compression can continue. Hashing circuitry and, specifically, hashing collisions, add considerable complexity to the compression/decompression system logic, and reduce system throughput.

Typically, the dictionary based upon the data being compressed will be a small subset of all possible data entries. Therefore, one method for reducing hashing collisions is to increase the number of dictionary storage locations. This approach, however, increases system complexity and cost and prohibits integrating the memory with the compression/decompression control logic. In addition, a larger memory could increase the search time required to determine if a character string has previously been loaded into memory.

Another bottleneck to data compression/decompression is the amount of time and circuit complexity required to encode and decode data character strings. For example, during data compression, after a character string is found not to match any of the data phrases previously stored within memory, it must be stored in an unoccupied data memory location. A codeword must be generated that uniquely identifies the stored character string and subphrases within a character string that previously matched dictionary data entries. The codeword must then be stored so that it can be combined with additional characters during further data compression operations.

During data decompression, a compressed data codeword may represent an uncompressed data character and an additional codeword, for example, a link to the rest of the uncompressed data string, as described in *Hewlett-Packard Journal*, June 1989, pp. 27–31. The described HP-DC scheme encodes codewords sequentially and stores the codewords (OMEGA) concatenated with a next byte (K) at dictionary address locations determined by a compressed code. Therefore, the dictionary must be read several times before the actual decompressed data string is generated. Since the compressing and decompressing process is iterative, any additional clock cycles, other than the clock cycles used for dictionary access, significantly increase overall compression and decompression time. Present encoding, decoding, and dictionary search methods, however, require more than one clock cycle to compress or decompress each input character. In addition, these encoding and decoding algorithms require complex compression and decompression hardware.

Accordingly, there is a need for improving the performance of dictionary-based data compression systems and for improving the encoding and decoding of data in a dictionary-based data compression/decompression system.

SUMMARY OF THE INVENTION

It is, therefore, an object of the invention to minimize the loss in data compression created when the dictionary in a dictionary-based data compression system is reset.

A second object of the invention is to increase the adaptation properties of data compression systems for input data sequences with changing statistical characteristics.

Another object of the invention is to reduce the amount of time required to encode/decode a character string in a dictionary-based data compression/decompression system.

Another object of the invention is to maximize data compression capacity in a dictionary-based data compression/decompression system with a minimal amount of memory.

An additional object of the invention is to minimize the amount of hardware and time required to selectively update a dictionary-based data compression/decompression system.

One aspect of the invention is a data compression/decompression system that simultaneously builds a current dictionary and a standby dictionary. The current dictionary serves the same purpose as the dictionary in a standard data compression engine. The standby dictionary is built in parallel with the current dictionary, so as to contain a subset of the phrases of the current dictionary. This subset is chosen to best characterize the patterns occurring in the source data. When the current dictionary fills-up, it is replaced by the standby dictionary, and a new standby dictionary is built "from scratch" as the new current dictionary continues to be built and used for compression. Therefore, the compressor never switches to an empty dictionary, and the deterioration in data compression caused by having a limited dictionary memory size is reduced.

The current dictionary starts with sufficient empty space to add new data entries thereby allowing continued adaptation to the source data. This feature is of paramount importance in compressing source data with varying statistics. Although some information is lost by switching to a smaller number of data entries in the standby dictionary, the time to rebuild the dictionary to maximum efficiency is still less than a complete dictionary reset. Therefore, a smaller dictionary memory can be used with less negative impact on the data compression ratio.

The criteria for selecting the subset of the current dictionary that goes into the standby dictionary can vary depending upon the specific application. For example, an encoded data string is copied to the standby dictionary if it has been matched at least once with a data entry in the current dictionary. Alternatively, the entries in the standby dictionary can be selected according to string length, most recent data entry matches, or any criterion that identifies entries that maximize compression in a given application.

In addition, the criteria for switching (resetting) from the current to standby dictionary can be changed depending on the type of data or application. For example, the current dictionary can be reset when it is filled with valid data entries. In the alternative, the current dictionary can be reset when using it for compression falls below a predetermined performance threshold, as described in U.S. Pat. No. 4,847,619 to Kato et al.

In a second application of the standby dictionary, mainly in situations where the data characteristics are stationary, the compressor makes two passes at the data. In the first pass, the compressor scans a large sample of the data. The sample is large enough to cause the current dictionary to fill up many times, thereby causing the standby dictionary to replace the current dictionary a proportional number of times. At each dictionary switch, the current dictionary is "refined" until, after several iterations, the algorithm has built a dictionary strongly customized to the data sample. The customized dictionary is then set as the sole dictionary reference used by the compression engine during a second pass to compress the input data. The customized dictionary thereby performs significantly better than a single dynamic dictionary for the same data.

A second aspect of the invention is a dictionary-based compression/decompression system architecture and method which utilizes the address values of stored data entries in the dictionary of a compression/decompression system to simplify encoding as well as decoding circuitry. The system preferably uses a content addressable memory (CAM) with additional logic circuitry including local feedback circuitry to provide special functions that speed up memory access and simplify external compression/decompression logic. The memory structure has unique features, that can provide lossless data compression or decompression at a sustained rate of one character per clock cycle without hashing or potential for hashing collisions.

Specifically, the system preferably comprises an associative memory that encodes character strings according to the address locations of data entries contained within the memory. An input character string combination which has not previously occurred within the input data stream is stored as a new data entry within the dictionary. The CAM is organized into "words" which each store a unique character string data entry. The memory performs an associative parallel search with an input character string with selected bits in a "word," on all words previously stored in the dictionary. In the event of a match, a match line associated with the data entry is activated. All the match lines are then encoded into a single codeword representing the character string. The codeword is then combined with the next input character and again compared with the data entries previously stored in memory. Thus, character strings are assigned codewords according to their address locations in memory. When a search fails, the codeword (OMEGA) representing the last previously-matched character string (e.g., its address) is output and another search is started with a new character string starting with the character (K) that caused the match to fail. The compressed data character (codeword) is a pointer to a data entry in the dictionary. Therefore, character strings are decoded by using the compressed data character as an address into the decompression dictionary. For example, initially, an external compressed character is used as an address into the dictionary. The data entry at the decoded address location is then read. If the data entry output from memory does not require further decompression (e.g., the memory output is the "root" of a linked list) then the data entry is output. If the data entry contains another codeword (e.g., a further encoded link to another dictionary address location), then the character at that address is output and the codeword at that address is fed back to memory as the next dictionary address.

An internal address generator is used for both compression and decompression and resets coincident with a memory reset. Any write to the memory (an explicit write or a failed match) will result in the address incrementing to the next address. Incrementing need not be sequential but may be, for example, pseudorandom, as long as both compressor and decompressor address generators are initiated to the same state and increment in the same way, with the result that both compression and decompression dictionaries will be identical. This logic eliminates the need for generating/ storing addresses in external control logic, and can result in improved compression decompression performance (e.g., fewer clock cycles and faster data compression).

To further reduce the time required for data compression, special update circuitry allows a memory search and a data write to be performed during the same clock cycle. When a character string is compared with the data entries within memory, a failed search requires the string to be stored as a new data entry. The next available address location is already known from the address generator and the character string is already residing at the memory data input. Therefore, control logic can be used to automatically write the character string into memory if no match occurs during the search. Thus, the memory is automatically updated during the memory search clock cycle. If a match is found during the search operation, the update circuitry prevents the character string from being loaded into memory as a valid data entry.

The system and method summarized above thereby provides a simple, inexpensive, and versatile system for fast compression and decompression of data. It can be implemented in software on a general purpose computer or in hardware using custom or semicustom integrated circuitry. The system and method can be used to implement storage/ retrieval of linked list data structures. And it can be readily adapted to various adaptive dictionary-based encoders.

The third aspect of the invention combines the minimum memory/high compression capacity of the standby dictionary scheme with the fast single-cycle per character encoding/decoding capacity of the CAM circuit. The circuit uses multiple dictionaries within the storage locations of a CAM circuit. The CAM circuit receives compressed and uncompressed character strings and stores them as data entries into one of the dictionaries. Codewords representing each data character string are then generated according to the address of the dictionary data entry that matches the character string.

To support multiple dictionaries, each memory location in the CAM contains a status field and a data field. The data field stores data entries and the status field indicates which dictionary is assigned to that data entry. During a search operation, the circuit can mask certain bits of both the status field and the data field. This allows the system to determine which dictionary is assigned to a data entry and to determine if certain memory locations are not currently assigned to a dictionary.

Dictionary assignments for each data entry are easily switched by changing the state of the compression/decompression circuit. By changing the circuit state, at least one dictionary is reset. This allows the storage locations previously assigned to that dictionary to now constitute free storage locations no longer assigned to any dictionary. These free storage locations are now available for storing new character strings. The state changes can be triggered by different events to maximize the compression ratio and the adaptability of the system to different types of data. For example, the compression/decompression circuit can automatically change states when one of the dictionaries becomes full or alternatively change states when the compression ratio falls below a predetermined performance level.

To further increase the compression ratio of the compression/decompression system, a second Lempel-Ziv compression/decompression system (LZSD2) is utilized to selectively replace individual data entries with new character strings. The LZSD2 priority system allows the use of all dictionary entries for string matching at all times, but still uses the above described Standby Dictionary methodology. Therefore, only two bits are needed to identify the next overwrite location, regardless of dictionary size. Dictionaries are then capable of being updated without negatively affecting the data compression rate since each data entry remains assigned to a dictionary after a dictionary reset. Implementation can also be performed with the same compression/decompression hardware as described above without negatively impacting the data compression rate.

To provide a single clock cycle search capability, the compression/decompression circuit constructs a standby dictionary in parallel with a current dictionary and searches multiple dictionaries at the same time.

The foregoing and other objects, features and advantages of the invention will become more readily apparent from the following detailed description of a preferred embodiment which proceeds with reference to the drawings.

BRIEF DESCRIPTION OF THE DRAWINGS

FIG. 11 is a block diagram showing a CAM designed for use in a multi-dictionary compression/decompression system according to the invention.

FIG. 12 shows the different fields contained within each dictionary entry in the CAM shown in FIG. 11.

FIG. 13 shows the dictionary values for each compression/decompression state in the ST field of FIG. 11.

FIGS. 22A–22E are graphical depictions of a second Lempel-Ziv Standby Dictionary (LZSD2) compression method.

DETAILED DESCRIPTION

In the following description, the first and second sections separately describe the standby dictionary and content addressable memory aspects of the invention. The third section describes a combined implementation of the first two aspects of the invention. The fourth section describes an alternative method of operation using the system described in the third section.

I. Data Compression/Decompression System Using A Standby Dictionary

Figure 1:
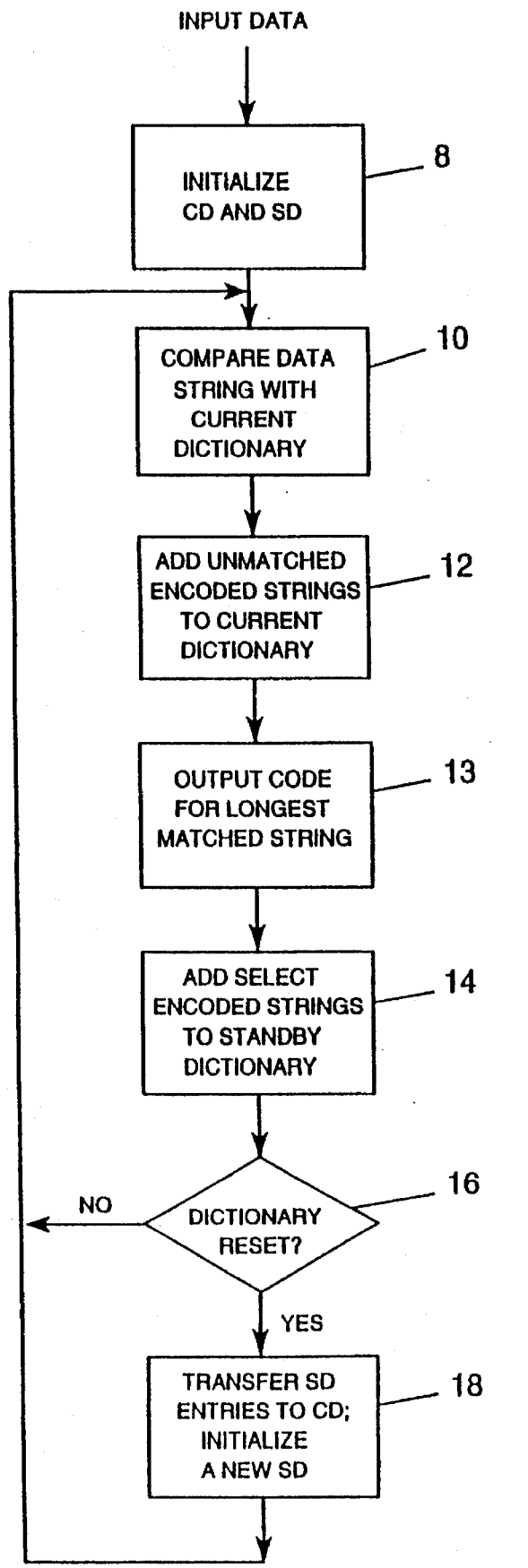
FIG. 1 is a data flow diagram for a data compression system with current and standby dictionaries in accordance with the invention.

FIG. 1 is a data flow diagram for a data compression/decompression system with current and standby dictionaries. The method illustrated in FIG. 1 begins at block 8 with initialization of both the current dictionary (CD) and the standby dictionary (SD). For example, codewords representing every single character possible in the uncompressed input data are put into the dictionaries. Alternatively, the initial dictionaries could be empty. The encoding of character strings from the data sequence is implemented using any desired encoding scheme.

In block 10, input data is compared with previously encoded data entries of a current dictionary to determine whether the character string and any of the dictionary data entries match. Block 12 stores an unmatched character string as a new encoded data entry in the current dictionary. When a match can no longer be extended, the code for the longest matched string is output at block 13.

Block 14 stores a subset of the previously encoded data entries of the current dictionary (CD) in the standby dictionary (SD). The subset selection process in block 14, as stated above, is alterable for specific input data to produce the highest compression ratio with a given number of data entries in the standby dictionary. For example, data entries for the standby dictionary can be selected based on the number of times an input character string matches a data entry within the dictionary. Alternatively, the standby dictionary subset can be selected according to the number of input characters represented by the encoded character string. In general, any preference scheme can be applied at this stage.

Decision block 16 determines if a dictionary reset is required. For example, a reset is required when the current dictionary reaches a predetermined number of encoded character string entries or when the compression ratio has fallen below a given performance threshold. If the current dictionary does not need to be reset, the compression engine reads a new character string and the process returns to block 10. If the current dictionary is reset, block 18 then replaces the current dictionary with the entries in the standby dictionary, initializes a new standby dictionary, reads a new character string and then returns to block 10.

A dictionary based compression/decompression method according to FIG. 1 can be used to generate a static customized current dictionary that is used to compress data. For example, a data sample of the input data sequence is selected. The current dictionary is then customized by repeatedly replacing the current dictionary With the standby dictionary. The customized current dictionary is then locked in a read-only function and used by the compression engine exclusively for compression or decompression of the data sequence.

Figure 2:
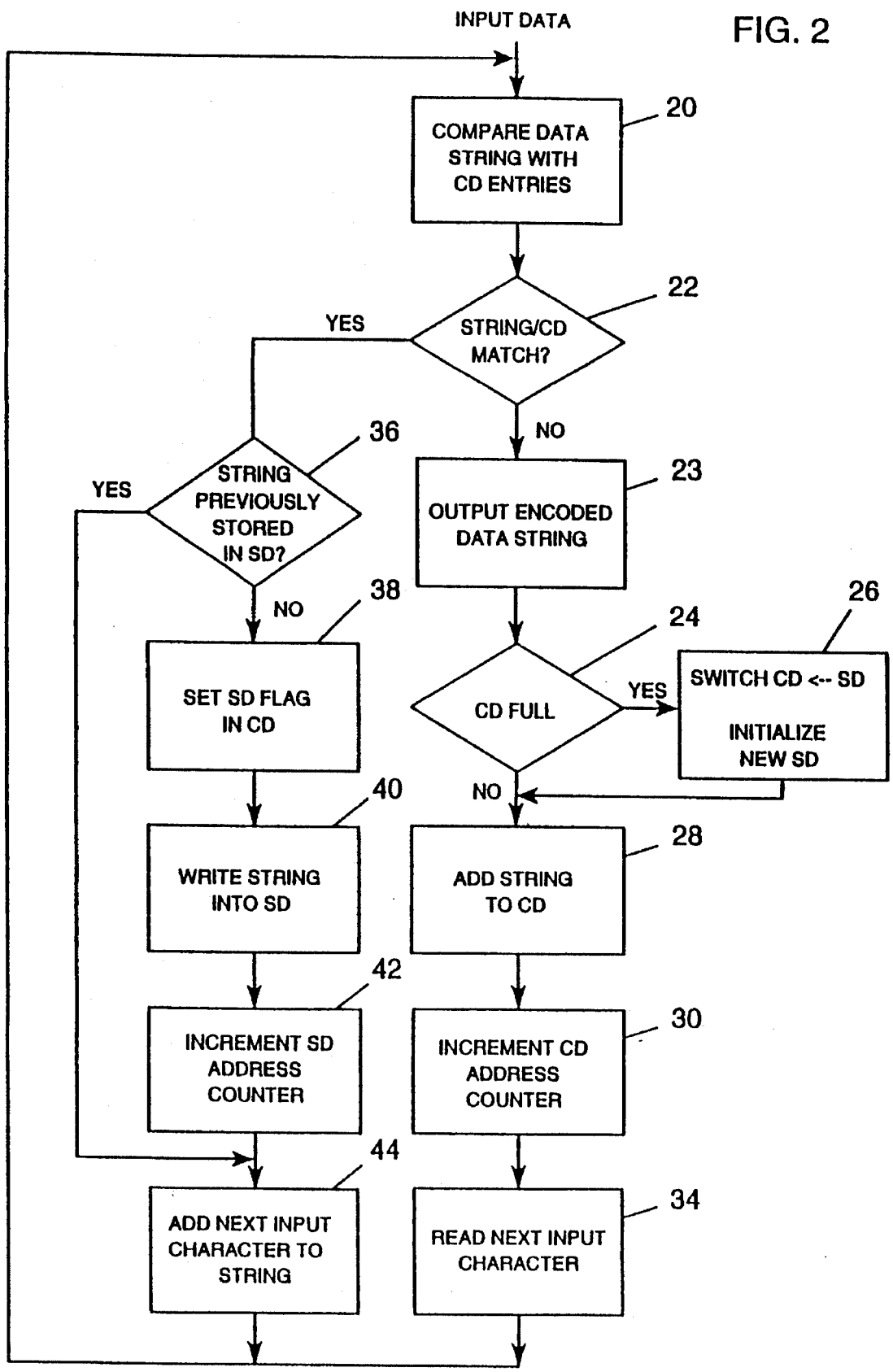
FIG. 2 is a detailed data flow diagram illustrating one example for the standby dictionary data selection process of FIG. 1.

FIG. 2 is a detailed data flow diagram illustrating one example of a data compression algorithm that utilizes a current and standby dictionary. FIG. 2 illustrates a method wherein a data string is copied into the standby dictionary when the input data string matches an entry in the current dictionary. This procedure assures that the data string has been "seen" at least twice in the input. The current and standby dictionary are switched when the current dictionary is full (e.g., reached a predetermined number of valid data entries). As mentioned above, alternative dictionary switching criteria and standby dictionary data entry selection criteria are easily implemented according to specific application requirements.

An input data string is compared with data entries of the current dictionary in block 20. Decision block 22 branches to blocks 23 and 24 if there is no match between the input data and the entries in the current dictionary. The longest matched data string is then encoded and output at block 23.

Decision block 24 determines if the current dictionary is full. If the current dictionary is not full, block 28 stores the data string as a data entry in the current dictionary. If the current dictionary is full, block 26 switches the current dictionary with the standby dictionary. The data string is then stored in the new current directory. Since the current dictionary is now replaced with a smaller subset of data entries, (e.g. data entries of the standby dictionary) there is now space available to store new data strings. Block 30 increments the address counter of the current dictionary. A new input character is read from the input data in block 34, then the compare process in block 20 is repeated.

When decision block 22 determines there is a match between the input data and an entry in the current dictionary, decision block 36 checks to determine if the data string has previously been stored into the standby directory. If the data string has not been previously copied into the standby dictionary, a flag is set in a status field within the current dictionary. Alternatively, the flag could be set in any case, eliminating block 36. The flag is associated with the current dictionary data entry that matched the data string. The flag indicates to the compression engine that the data entry has previously been copied into the standby directory. This prevents multiple copying of the same data entry into the standby dictionary. Block 40 writes the data string into the standby dictionary and block 42 increments the standby directory address counter. Since the data string did match with a data entry in the current dictionary, block 44 adds the next input character to the present data string and returns to block 20. If decision block 36 indicates that the data string has previously been stored in the standby dictionary, the process goes directly to block 44 and continues as described above.

Figure 3:
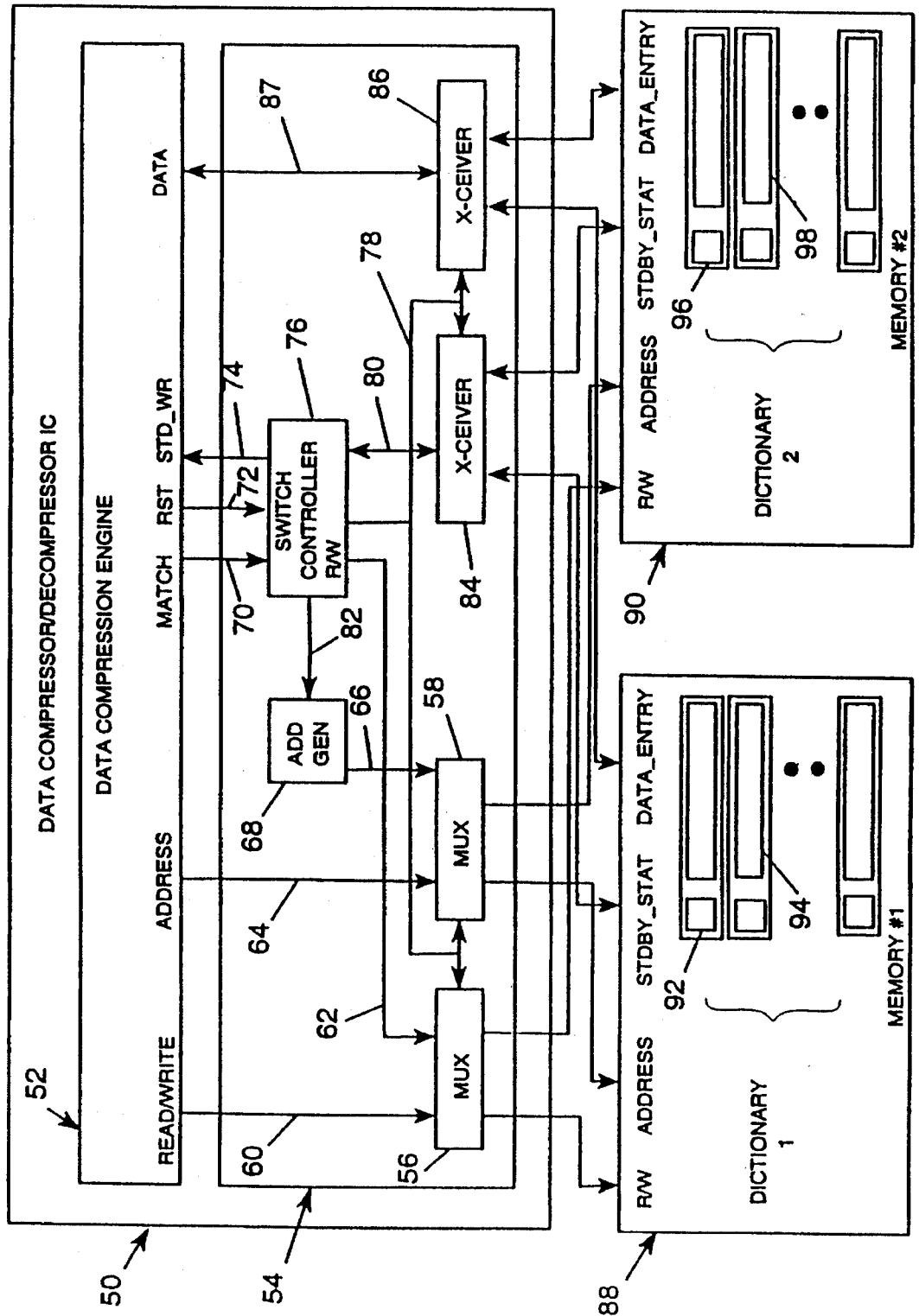
FIG. 3 is a block diagram of an example of a data compression circuitry implementing current and standby dictionaries according to the invention.

FIG. 3 shows an example implementation of the invention in a data compressor/decompressor integrated circuit (IC) 50 which is a presently preferred embodiment. The data compressor/decompressor (DCD) IC 50 includes a data compression/decompression engine 52 in combination with a data compressor interface circuit 54. The DCD IC 50 is used in combination with dictionary 1 (D1) comprised within random access memory (RAM) 88 and dictionary 2 (D2) comprised within RAM 90. The circuitry shown herein is conveniently implemented in a single IC or as separate ICs 50, 88, and 90. D1 and D2 are illustrated as RAMs but can be conveniently implemented in content addressable memory or any alternative memory structure. The RAM is conventional. Each RAM dictionary memory location in D1 and D2 includes a data entry field (data_entry) 94 and 98, respectively, and a standby status field (stdby_stat) 92 and 96, respectively.

The data entry field stores unique data strings occurring in the input data sequence. The standby status field includes a standby dictionary status flag that indicates whether the data entry in the current dictionary has previously been stored in the standby dictionary. The standby status field can conveniently include a dict_valid field for identifying valid data entries. The use of a multi-bit dict_valid field in a data compression system is described in commonly assigned U.S. Patent application entitled DICTIONARY RESET PERFORMANCE ENHANCEMENT FOR DATA COMPRESSION APPLICATIONS, Ser. No. 07/766,475, filing date 9/25/91, and is incorporated by reference.

The data compression engine 52 is preferably designed to implement the LZ2 or LZ1 compression algorithm, but can be designed to implement any suitable dictionary-based compression scheme. Also, if desired, the compression engine may incorporate or be used in conjunction with automatic means for controlling dictionary reset, such as disclosed in U.S. Pat. No. 4,847,619. Being otherwise conventional, the particular algorithm and architecture of the data compression engine need not be further described.

The data compressor interface circuit 54 comprises two main subcircuits. A switch controller subcircuit 76 monitors dictionary reset request signals 72 and data string match signals 70 which are output from the data compression engine 52 or from other circuitry associated with the data compressor/decompressor IC. Subcircuit 76 controls which RAM operates as the current dictionary and standby dictionary. This subcircuit reads the stdby_stat field from the current dictionary to determine if the present encoded data entry has previously been copied into the standby dictionary.

Address generator circuit 68 sequences through the binary values of the data_entry field for the dictionary operating in the standby mode. A typical implementation of this subcircuit is a binary counter but other forms of sequencer can be readily used. Associated with the subcircuits are multiplexers 56 and 58 and transceivers 84 and 86. Multiplexer 56 selects between read/write signals 60 and 62, respectively, from the data compression engine 52 and the switch controller circuit 76. Multiplexer 58 selects between address signals 64 and 66, respectively, from the data compression engine 52 and address generator 68. Transceiver 86 operates as a bus controller selecting between either data_entry field 94 or 98 to connect to data bus 87 connected to data compression engine 52. Transceiver 84 selects between stdby_stat fields 92 or 96 for connecting to switch controller 76. The multiplexers and transceivers are controlled by control signal 78 and address generator 68 is controlled by control signal 82. Both control signals are from the switch controller circuit 76.

DCD circuit 50 permits conventional data transfer between one of the dictionaries (current dictionary) and the data compression engine 52 during normal compression/decompression operations. The system also allows the standby dictionary to receive data from data compression engine 52 or directly from the current dictionary to create the data entry subset in accordance with the invention.

In operation of circuit 50, switch controller 76 selects between D1 and D2 as the current dictionary, for example D1. The compression engine then begins performing a data compression, reading and writing encoded data to the data__entry field 94 of D1. When the compression algorithm determines that an encoded data string is a candidate for writing into the standby dictionary (D2), for example, when an encoded data string matches a data entry within the current dictionary (D1), match signal 70 is activated. Switch controller 76 thereby checks the stdby__stat field 92 from the current dictionary to determine if the data entry has previously been copied into the standby dictionary. If not, the data string is written into the dict__entry field 98 of D2, at the location provided by address generator 68. In addition, the stdby__stat field 92 in the current dictionary is "set" by switch controller 76, to prevent the same encoded data string from being copied into the standby dictionary twice.

When data compression engine 52 activates reset signal 72, switch controller 76 alters the value of control signal 78. The new control signal changes the connections for the multiplexers and transceivers so that D2 is now operating as the current dictionary and D1 is now operating as the standby dictionary. The subset of data entries loaded into D2 is then used as the initial set of data entries for compression engine 52. Thus, when the data compression engine illustrated in FIG. 3 is reset, the dict__entry field of the new dictionary contains a high compression ratio subset of the previously encoded input data.

Switch controller 76 can be shut off by the data compression engine by activating a specific combination of match signal 70 and reset signal 72. This allows the data compression engine to read/write encoded data exclusively to/from a single dictionary. This is used for the customized data dictionary operation described above and for compatibility with single-dictionary schemes.

The above-described method has proven to be advantageous. For example, 550 files containing user operating manuals were compressed using the standard UNIX "compress" command (a traditional implementation of LZ2). Then, a customized dictionary was built using the above-described current/standby dictionary method and the files were then compressed using the customized dictionary created from the data sample. The results are summarized below:

Original file size: 6,602,300 bytes

Unix compress: 2,781,686 bytes

Customized dictionary: 2,025,742 bytes

Compression improvement: 37%

Therefore, the customized dictionary provides a substantial compression improvement over prior compression methods.

This aspect of the invention can be modified in arrangement and detail without departing from its basic principles. For example, it is possible to implement the current and standby dictionaries both on the same RAM by having a field that indicates whether the entry is in the standby dictionary or not. Upon reset, all non-standby dictionary entries are cleared. The address generation circuitry is more complicated since, after reset, entries are not in consecutive locations. This approach is well-suited for a content addressable memory (CAM) implementation as described below.

Figure 4:
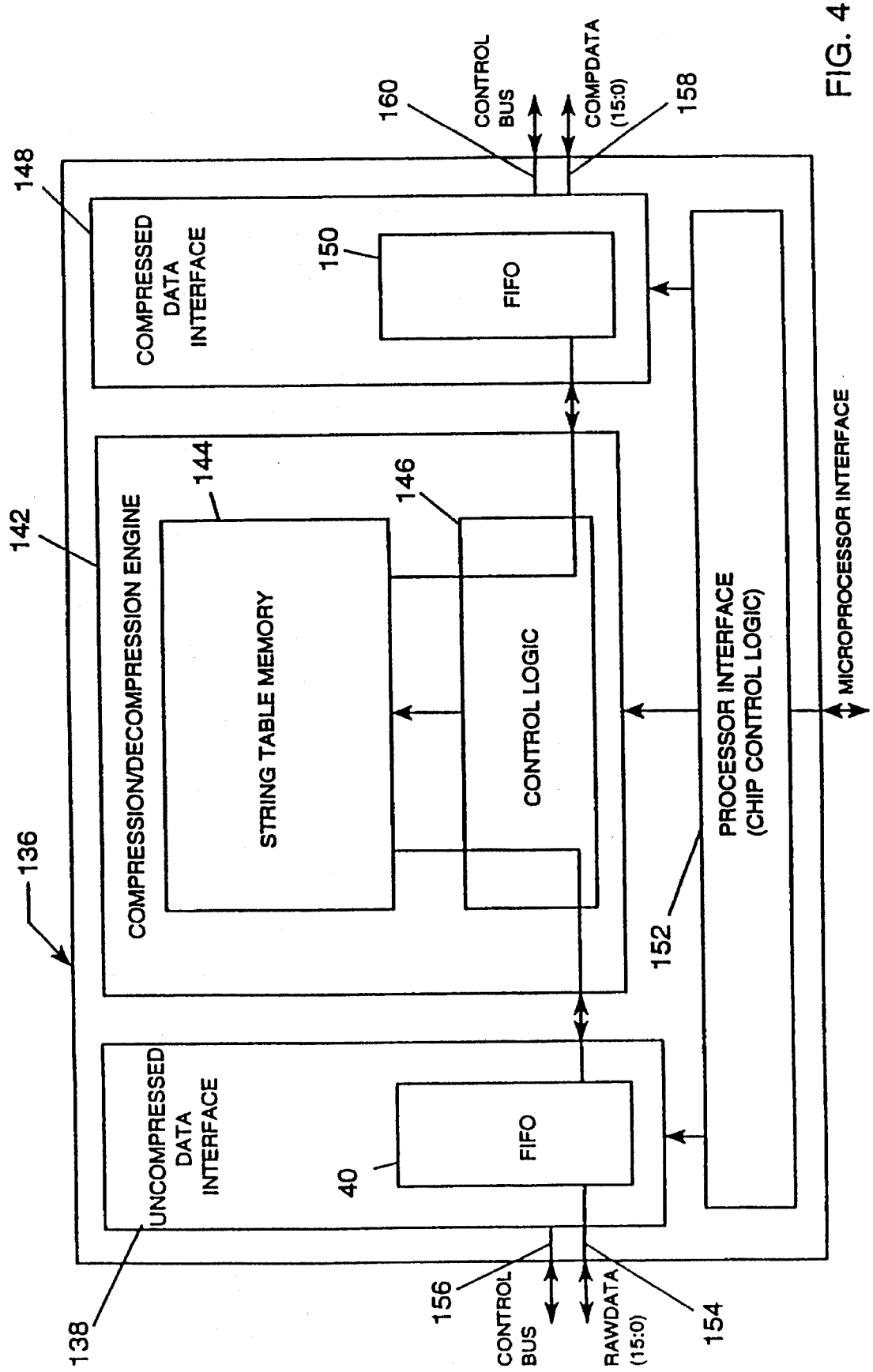
FIG. 4 is a high level block diagram showing a data compression/decompression system embodying the present invention.

II. Memory Circuit For Lossless Data Compression/Decompression Dictionary Storage FIG. 4 is a block diagram showing the overall arrangement of a circuit 136 for a CAM compression/decompression system according to the second aspect of the invention. The circuit 136 includes a data compression/decompression (CD) engine 142, an uncompressed data interface 138, a compressed data interface 148, and a processor interface 152. The CD engine 142 comprises a string table memory 144 and control logic 146. The uncompressed data interface 138 transfers uncompressed data (RAWDATA) over data bus 154 and compressed interface 148 transfers compressed data (COMPDATA) over data bus 158. External control signals for interfaces 138 and 148 are received over control buses 156 and 160, respectively. Each interface contains a First-in/First-out data buffer (FIFO) 140, 150 and additional conventional interface circuitry (not shown).

The circuit 136 can be used in either a compression or a decompression mode or state and can be switched between modes for bidirectional communications. Alternatively, the circuit 136 can be used as dedicated compressor with simplified dedicated decompression circuit with a RAM replacing blocks 182, 184, 192 and 194 in FIG. 5. The following description assumes circuit 136 is used for both compression and decompression.

In the compression mode, the uncompressed data interface 138 receives uncompressed data characters from the data bus 154 and supplies them via data buffer 140 to compression/decompression engine 142. The string table memory 144 and control logic 146 within CD engine 142 compress the characters into codewords that are output on data bus 158 via data buffer 150. In the decompression mode, the compressed data interface 148 receives compressed data codewords from the data bus 158 and provides them to the CD engine 142 via data buffer 150. String table 144 in cooperation with control logic 146 decompress the data codewords into character strings and output the result on data bus 154 via data buffer 140. A microprocessor (not shown) controls registers for setting the direction of data flow and compression/decompression mode, and controls other miscellaneous functions through processor interface 152.

Figure 5:
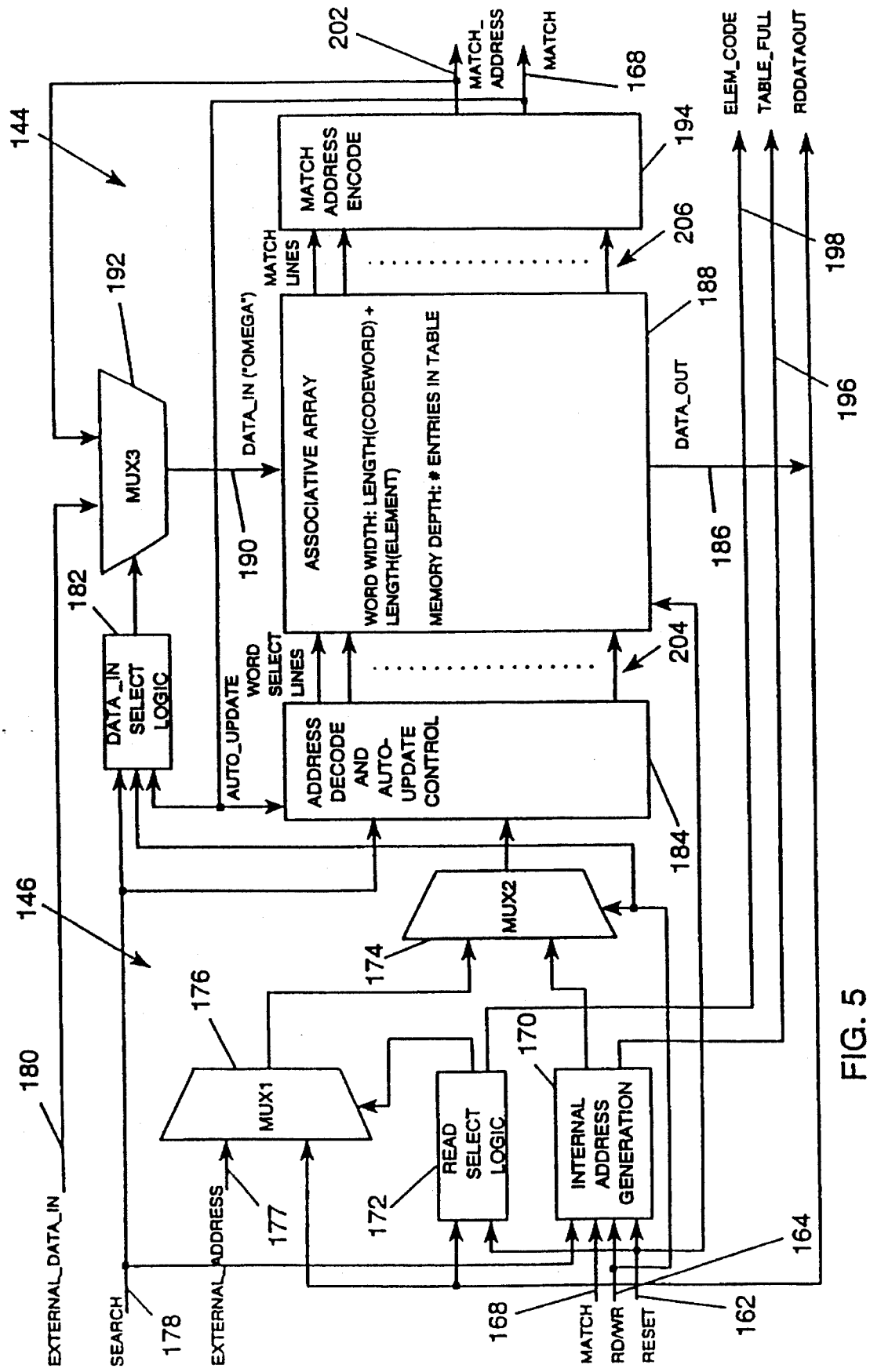
FIG. 5 is a detailed block diagram of the memory and control logic circuitry of FIG. 4.

FIG. 5 is a detailed block diagram of the string table memory 144 and the control logic 146 in FIG. 4. The string table memory comprises an associative array in the form of a content-addressable RAM (CAM) 188 with additional internal logic that reduces compression/decompression process time. The CAM 188 is organized into "words" (e.g., 3832×20 bits) whereby each word stores a separate character string entry. Data is written into memory 188 on a data bus 190 (DATA__IN). Data bus 190 receives an external character string (K) input on bus 180 and an encoded character string (OMEGA) on data bus 202 via multiplexer 192 (MUX3). The external characters on bus 180 come from the uncompressed data stream on RAWDATA bus 154 (FIG. 4) and the codewords come from the output of encoder 194. A data input select logic circuit 182, through multiplexer 192, controls which bits of DATA__IN come from the external character string on bus 180 and the codeword on bus 202. The data input select logic circuit 182 is driven by a search signal input 178, a read/write signal input 164, both from control logic 146 (FIG. 4), and a match signal input 168 from encoder 194.

Memory 188 provides a set of match signals via match lines 206 (e.g., 264 through 4095). There is one match signal associated with each word in memory 188. When the character string on bus 190 matches one of the data entries in memory 188, the match signal associated with that memory location is activated. Encoder 194 encodes all match signals from memory 188, in turn generating the codeword provided on bus 202. The codeword is thereby equal to the address location of the matched data entry in memory 188. Encoder 194 also generates a match signal 168 that is activated when any data entry in memory 188 is matched with the character string on data bus 190.

An address decoder 184 selectively receives either external compressed characters over external address bus 177, the internal character string output from memory 188 on data bus 186, or an internal address from an address generator 170 and accesses the associative array 188 via word select lines 204 (e.g., 264 through 4095). The external compressed characters on bus 177 come from the compressed data stream on COMPDATA bus 158 (FIG. 4). The internal address generator 170 is controlled by match signal 168 from encoder 194, search signal 178, a read/write signal 164, and a reset signal 162. The read/write and reset signal come from control logic 146 (FIG. 4). The address generator includes a counter which is reset (e.g., to 264) upon initialization and subsequently incremented as the dictionary is built up.

The source of the address supplied to address decoder 184 is controlled by read select logic 172 and the read/write signal 164 through multiplexers 176 and 174 respectively. Read select logic 172 is controlled by reset signal 162 and the compression status of the data entry output 186 from memory 188. The data entry compression status can be determined by the value of data entry characters. For example, values greater than 256 may be allocated for encoded character strings and values less than 256 may comprise single data characters. Multiplexer 176 (MUX1) selects an input from either bus 177 or bus 186 and multiplexer 174 (MUX2) selects between the output of mux 176 and the output of address generator 170. Decoder 184 also includes an automatic update feature described below that allows a data search and memory update to be performed in the same memory access cycle.

Figure 6:
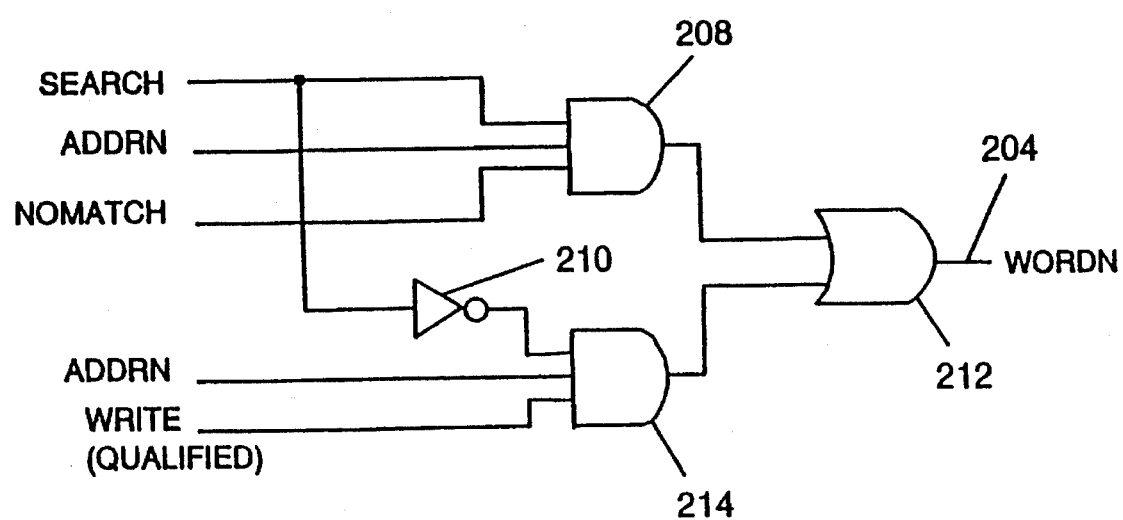
FIG. 6 is a logic diagram of the auto-update circuitry within the address decoder of FIG. 5.

FIG. 6 is a logic diagram of a preferred implementation of the automatic update feature of address decoder 184 in FIG. 5. Each address (ADDRN[19:0]) input into address decoder 184 from MUX2 174 is fed into two AND gates. AND gates 208 and 214 illustrate a single address line. AND gate 208 is also fed search signal 178 (FIG. 5) and the inverted value (NOMATCH) of match signal 168 (FIG. 5). The search signal is also inverted and fed into AND gate 214 along with a "qualified" write signal. OR gate 212 receives the outputs from the two AND gates and generates a word select signal (WORDN). The equivalent function can be provided by multiplexers or other combinational logic.

The update circuit is activated when a data search is performed during data compression operation. If a search fails during a data compression, the character string must be placed into the next available address in memory. To eliminate the additional clock cycle necessary to write the data word into memory after a data search, gate 208 goes high if a match does not occur. Since the character string is already on data bus 190 and the address for the next available address is already set by address generator 170, a write can be performed immediately after a match indication occurs. Thus, the inverted match signal NOMATCH activates gate 208 activating the word line (WORDN) associated with the next available memory location.

If a match is found during the search operation, the word select line is disabled and no write operation takes place. The qualified write signal is used to force data writes even when no match occurs in memory, for example, during an external microprocessor write operation. This update feature provides true 1 cycle per byte performance since dictionary writes are "transparent," not requiring an extra memory access.

In the alternative, the circuit in FIG. 6 may be used to set a "data_valid" field within memory. For example, the system in FIG. 5 can copy each new character string into memory prior to checking for a match in memory. If a match does occur, the WORDN signal is then used to activate a "data_valid" field associated with the newly stored data string.

Data Compression

In operation of circuit 144, for compression, a microprocessor (not shown) initializes the system for compression and resets memory 188. The microprocessor control signals (search signal 178, read/write signal 164, reset signal 162) come from the uncompressed data interface 152 via control logic 146 (FIG. 4). The reset line may be used for various initialization operations. For example, the reset line is coupled to memory 188 to reset the data_valid field associated with each memory location. In addition, the reset line initializes the address generator to a starting memory location for storing character strings.

Several different techniques may be used for initializing single input characters. For example, single input characters may be algorithmically encoded as part of the compressed data stream. Alternatively, a set of encoded values each representing any single input data character may be loaded into memory.

The read/write line 164 directs mux 174 to connect the address provided by address generator 170 to address decoder 184. An external character string from uncompressed data interface 138 (FIG. 4) is supplied to the byte field (DATA_IN [7:0]) and the codeword field (DATA_IN [19:8]) of bus 190. Search signal 178 is then activated, causing memory 188 to compare the codeword/byte string with each location in memory 188. No match will initially occur since nothing has been previously written into memory 188. Therefore, the codeword/byte string on bus 190 is written into the first available address location in memory 188 (e.g., the initialized address generated by address generator 170). Address generator 170 is then incremented and a new input character from bus 180 is read into the byte field of the memory data input. The process is repeated, continuing to write unmatched codeword/byte strings into memory 188.

On a successful match, input data select logic 182 directs multiplexer 192 to place the codeword generated from encoder 194 in the codeword field of data bus 190 (DATA_IN [19:8]). A new external character from bus 180 is then fed into the byte field (DATA_IN [7:0]) of data bus 190. The codeword thereby represents the previously matched character string. Because the codeword assigned to the character string is derived directly from the matched data entry address, significantly less control logic is required to encode input characters. In addition, by feeding the codeword back into multiplexer 192 (MUX 3) and combining the codeword with the next input character, an input character can be processed each clock cycle.

The new codeword/byte string is then compared with the data entries within memory 188. The process is repeated until no match is found. At this point, the compressor outputs the codeword from the last match and writes the new codeword/byte string into memory 188. The last input character (K) fed into the byte field is then compared with the updated dictionary (in the case of dictionary initialized to contain "root" codewords) by searching memory for the byte K paired with a null codeword, thereby generating a root codeword to commence a new string. A new external character (K) from bus 180 is then fed into the byte field and the match process is repeated building on a new string (per LZW). Alternatively, the last character K can be output following OMEGA (as in LZ2) or the address of K can be output as the codeword for K following OMEGA.

When the dictionary fills up, address generator 170 activates a table-full signal 196 that indicates to the rest of the compression system (FIG. 4) that no further character strings can be written into memory. Any additional input data is then compressed according to the present entries stored within memory 188.

Data Decompression

For data decompression, in circuit 144 the operation starts by resetting memory 188 and initializing the circuit for compressing input data. Decompression involves linked-list decompression traversal. For example, a compressed data address may simply refer to an address in memory where the decompressed data string is located (e.g., a "root" codeword of a linked list). The address however may have a "non-root" codeword (e.g., the codeword is a link to the next address required to further decompress the encoded character string). As mentioned above, "root" and "non-root" codewords can be determined in a variety of ways. For example, by the value of the codeword or in the alternative with an identifier bit within memory.

When the compressed data interface 148 (FIG. 4) has compressed data available, it is written to decoder 184 on external address bus 177. After receiving a "non-root" codeword, the memory is read, and (assuming a valid location) the byte field (DATA_OUT [7:0]) of bus 186 is pushed onto a LIFO stack inside control logic 146 (FIG. 4). The codeword field (DATA_OUT [19:8]) of bus 186, if a non-root codeword, is fed back to address decoder 184 via MUX1 and MUX2 and another memory read is performed. Prior to the non-root codeword feedback, the last byte of the data entry read from memory is pushed into FIFO 140. This process terminates when a memory read results in a "root" codeword, at which time a new codeword is read from external address bus 177.

After a root codeword is identified, the last decoded character output is concatenated with the previous external encoded character and read into the next available address in memory 188. Read select logic 172 checks for "root" codewords and directs multiplexer 176 accordingly to connect external address bus 177 or the DATA_OUT bus 186 back into address decoder 184. Read select circuit 172 also supplies a coded element signal 198 to control logic 146 to indicate a completely decompressed codeword. FIFO 140 then dumps the decompressed decoded characters on bus 154.

The system in FIG. 5 simplifies the decompression operation. Since decompression involves linked list traversal, the built-in logic provides feedback of the memory output data back into the address decoder without additional interaction with external decompression logic (FIG. 4). Therefore, each decompression cycle will require less time and the decompression control logic is simplified. There are a number of different implementations for "qualifying" valid words and codewords in memory 188. One method is to use a comparator scheme, and another is to use an extra, resettable bit for each word. The technique used is dependent upon specific application requirements. In a unidirectional system (e.g., CDROM), the decompression circuit can be further simplified, using a conventional RAM with feedback circuitry as described above for linked list traversal.

Figure 7:
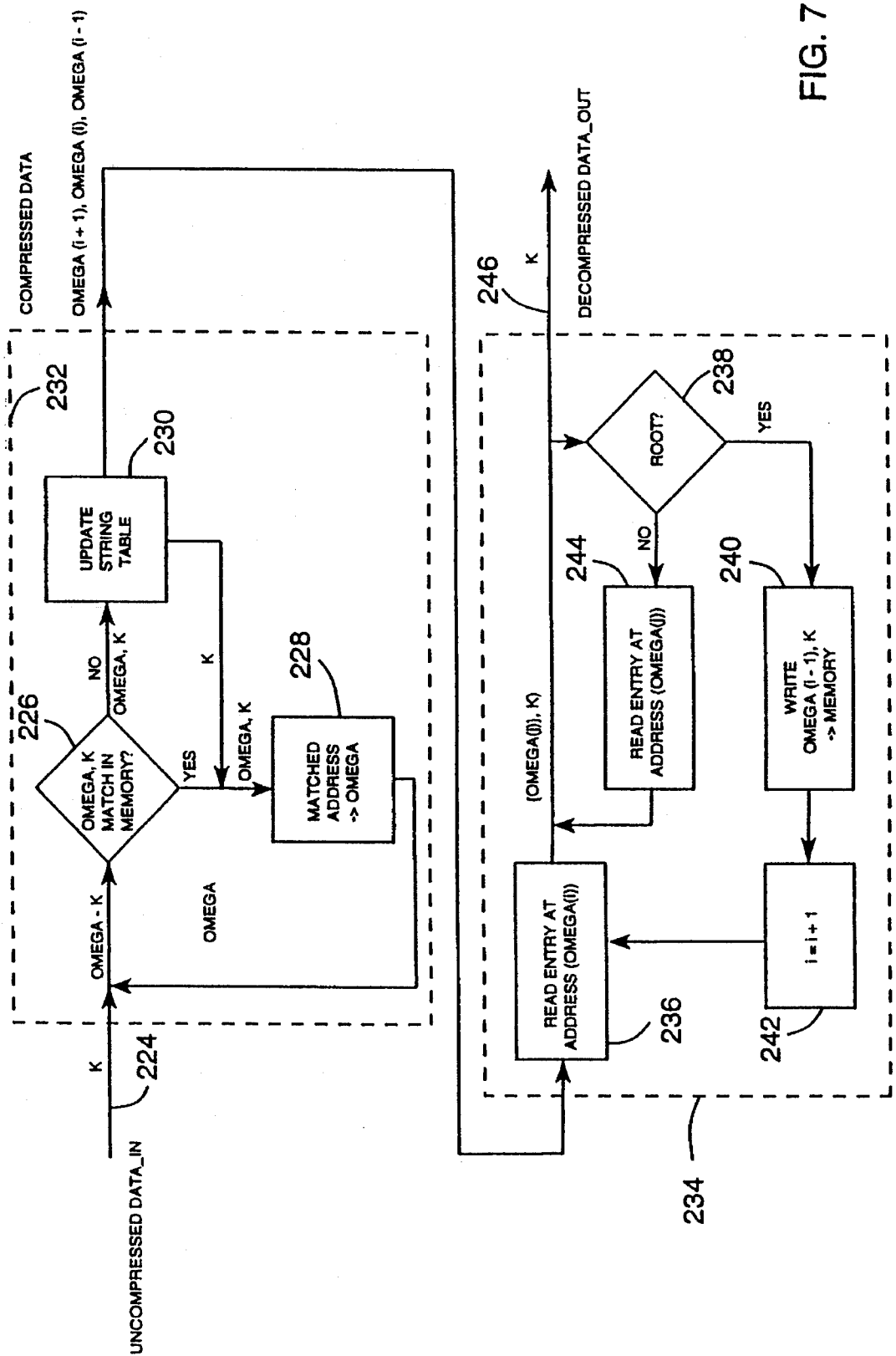
FIG. 7 is a generalized data flow diagram for the method of data compression/decompression using a content addressable memory (CAM) according to the invention.

FIG. 7 is a data flow diagram showing the general method for data compression/decompression or linked list storage/retrieval in a system according to the above-described aspect of the invention. The method illustrated below is adaptive such that the dictionary is embedded in the codewords and thereby does not need to be transferred separately with the compressed data. Alternative methods, for example, where the dictionary is transferred with the compressed data, can also be implemented using the present system.

Dashed block 232 is the compression process and dashed block 234 is the decompression process for the system. Uncompressed data (K) at input 224 is supplied to decision block 226 along with the coded character string (OMEGA) output from block 228. As noted above, OMEGA represents an address of a data entry encoding a character string. OMEGA and K are concatenated together and compared with the entries within the dictionary in decision block 226. If the OMEGA-K input matches an entry in memory, block 228 encodes the input with the address of the matched data entry. This encoded value (new OMEGA) is then fed back, concatenated with the next external character K and input into decision block 226. This process is repeated until an OMEGA-K string does not match any entries within memory. Block 230 then updates the string table memory with the OMEGA-K string, outputs OMEGA, and feeds the character K into coding block 228. K is encoded in Block 228 and concatenated with the next external data character K before being fed back into decision block 226.

The encoded data, OMEGA, is sent to block 236 for decompression. A given encoded input character (OMEGA(i)) is used as an address for accessing the string table memory. Decision block 238 determines if the data entry at the address OMEGA(i) is a root character. If it is, there are no additional encoded characters in the data entry output from memory (e.g., OMEGA(j) does not exist). The memory data entry for K is then output as a decompressed output character on line 246. Decision block 238 jumps to block 240 where the previous encoded character (OMEGA(i−1)) is concatenated with K and written into the next available memory address location. Block 242 then directs block 236 to use the next encoded character (OMEGA(i+1)) in the input stream as the address location for the next data entry read from memory.

If the output from the string table memory is not a root (e.g., the output comprises an encoded character (OMEGA(j) and a decoded character K), K is output on line 246 and decision block 238 jumps to block 244. Block 244 uses the encoded character (OMEGA(j)) as the address for the next data entry output from memory. The data entry at memory location OMEGA(j) is then processed as described above. The process is repeated until every encoded input character is decompressed.

Figure 8:
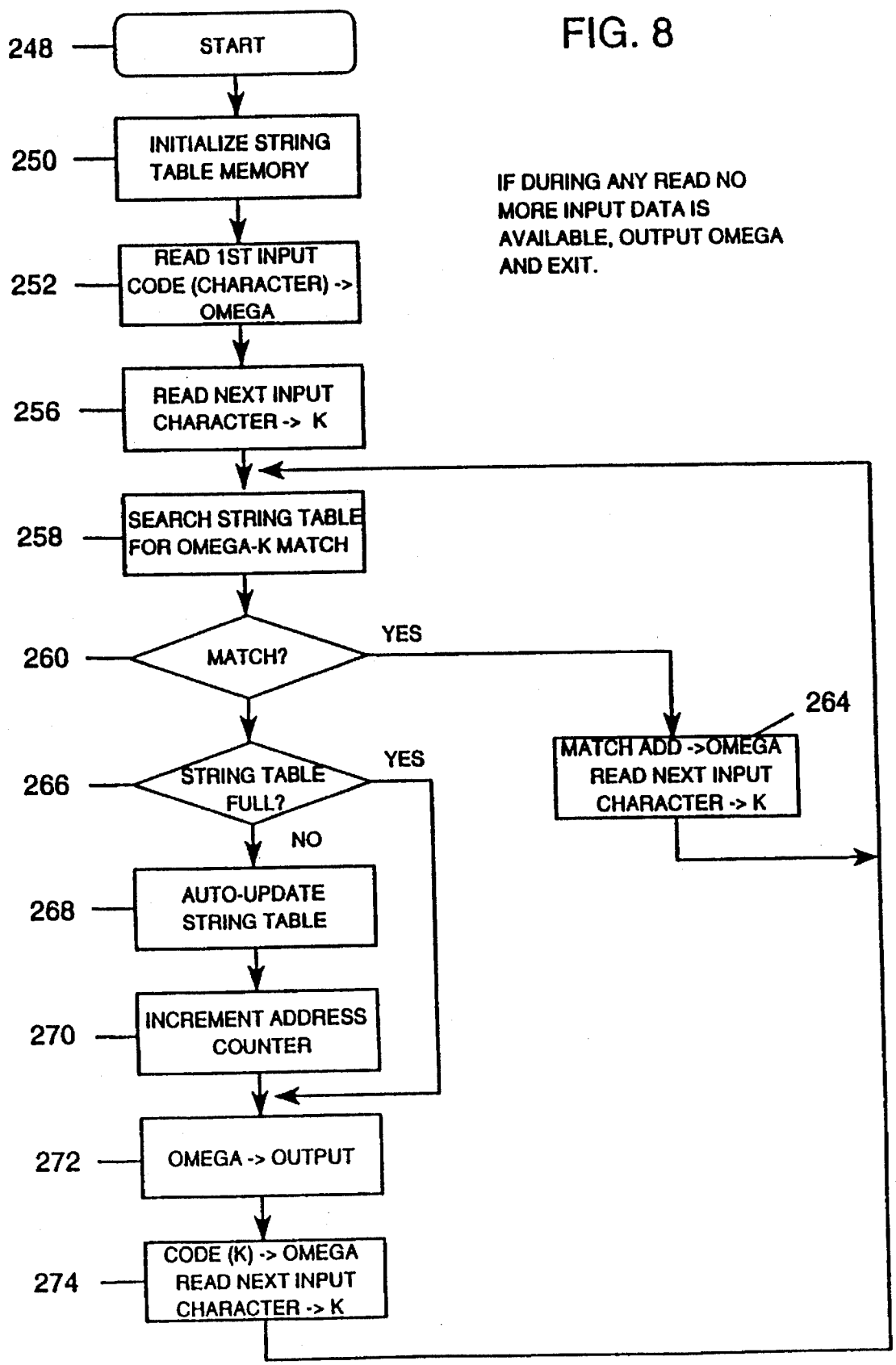
FIG. 8 is a detailed data flow diagram for the data compression procedure of FIG. 7.

FIG. 8 is a detailed data flow diagram of dashed block 232 in FIG. 7. The data compression process begins when a start or reset signal is instigated in block 248. A memory circuit (described below), is initialized in block 250, for example, to operate in the compression or decompression mode and to reset the dictionary. Any dictionary valid bits need to be initialized, preferably in parallel. The dictionary may be initialized either with single character codewords or with a set of codewords externally generated in accordance with a selected coding algorithm, such as LZW disclosed in Welch U.S. Pat. No. 4,558,302 or DCLZ disclosed in the ECMA-151 Standard, paired with a null codeword to identify the entry as a single character or "root" codeword. Alternatively, rather than pre-storing a set of codewords, they could be generated real time each time a match fails, for example, as disclosed in commonly-assigned U.S. Pat. No. 5,142,282, on Data Compression Dictionary Access Minimization. Other initialization schemes can be used, including an empty dictionary.

The first character in an input data stream is read in block 252 and either stored directly in the OMEGA field or encoded (e.g., CODE(CHAR)) then stored in the OMEGA field. Then, the next input character (K) in the input data stream is read in block 256. Block 258 shows a process which combines OMEGA and K together as a character string (i.e. concatenates OMEGA-K) and then searches the dictionary for a data entry that matches the OMEGA-K string. Since no data string has yet been stored in the dictionary, decision block 260 indicates that there is no match. Since the OMEGA-K string is not presently represented, it is stored in memory if decision block 266 determines there is available storage space. If the memory is not full, the operation in block 268 automatically loads the OMEGA-K string into the next available memory storage location (ADDR(N)). Block 270 then increments an address counter to identify the next available storage location in memory (ADDR(N+1)). The encoded value OMEGA (an address) for the first input character, if applicable, is output as the first character in the encoded data string in block 272.

When the memory is full, the compression system can simply be disabled from writing any additional character strings into memory. For example, if decision block 266 determines that the memory is full, the character string loading step of block 268 and the address counter incrementing step of block 270 are skipped and the process jumps to the encoding and output process of block 272, further described below.

After OMEGA is output, the step of block 274 replaces the first input character (OMEGA) with the second input character (K) or code(K). The next input character from the input data stream is then read (K) thereby providing the next OMEGA-K string. The process then loops back to block 258 where the memory is searched with the new OMEGA-K string.

If a match is indicated by decision block 260, the process jumps to block 264 where the OMEGA field is replaced with an encoded value representing the OMEGA-K string, which is equal to the match address. The next input character from the data stream is then copied into the K field. The OMEGA and K fields are combined, forming a new OMEGA-K string which now represents three input characters. The process returns to block 258 where dictionary data entries are compared with the new character string. Additional input characters are added to the character string as long as the previous character string matches a data entry in memory. When a new character string no longer matches a data entry, decision block 260 jumps to block 266 where the memory update procedures of blocks 266, 268, and 270 are performed as described above. Block 272 outputs the value OMEGA (e.g., the encoded character string from the last input character string/data entry match). Block 274 takes the last character in the character string (e.g., the character that caused the character string to no longer match any data entry in the string table) and copies it into the OMEGA field. Block 274 then copies the next input character from the input data stream into the K field and the process loops back to block 258. The character string is thereby compressed since the single encoded value of OMEGA output from the compression process represents multiple input characters.

Figure 9:
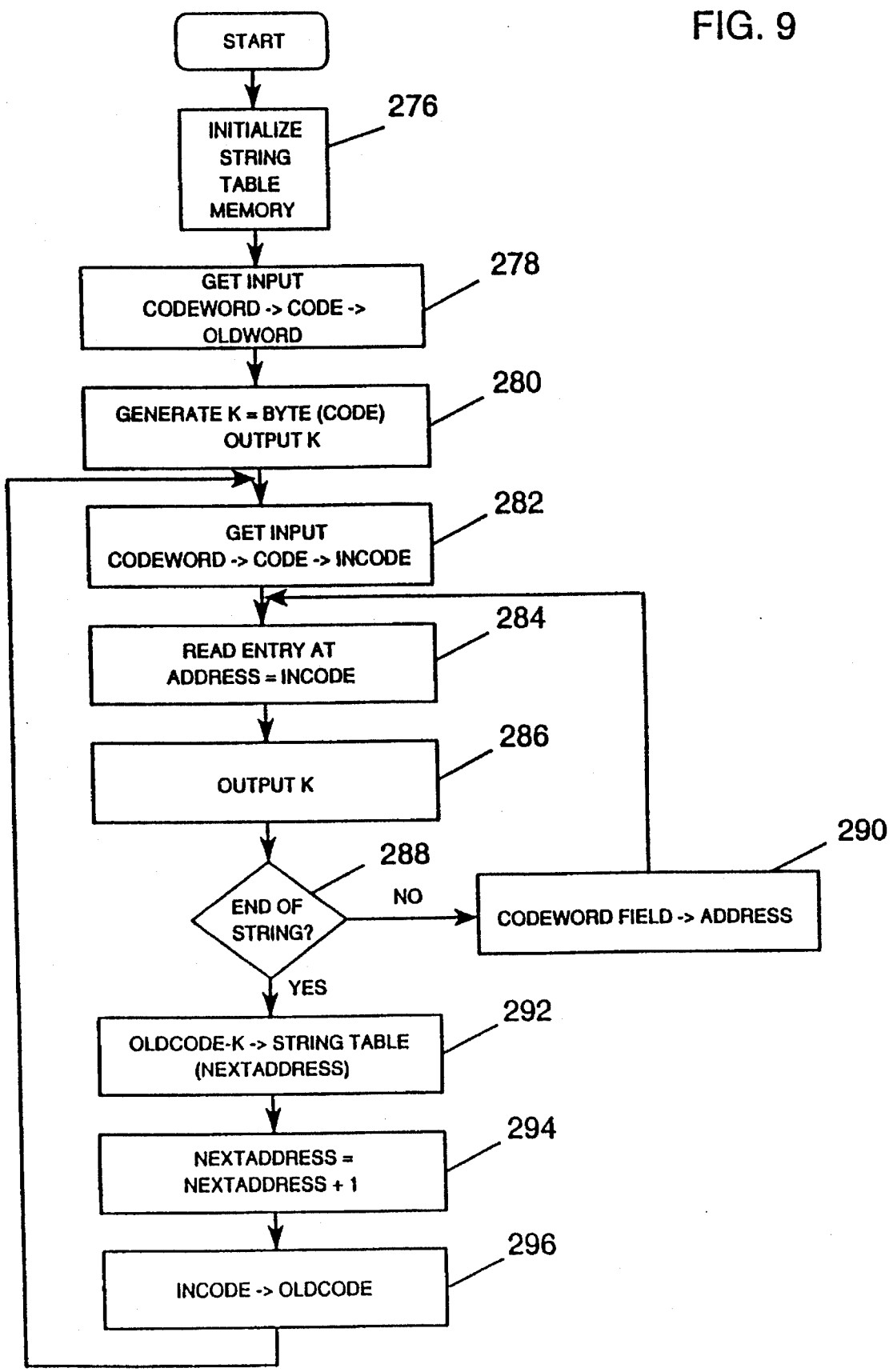
FIG. 9 is a detailed data flow diagram for the data decompression procedure of FIG. 7.

FIG. 9 is a detailed flow diagram of decompression circuit 246 in FIG. 7. Block 276 initializes the string table memory for decompression. Block 278 gets the first encoded word (OLDWORD). If no more data is available during this or any subsequent input read step, then the process is exited. The first encoded word is decoded at block 280, either algorithmically or by reading a preloaded entry in the string table memory. The first encoded word is a root character and is therefore decoded and output.

Block 282 gets the next encoded word (INCODE) and block 284 uses INCODE as the address of the data entry output by the string table. Initially, in one implementation, the string table will consist of only single character bytes, so block 284 will output a byte K. Byte K is then output in block 286. In later cycles, block 284 will return OMEGA-K as discussed further below.

Decision block 288 determines whether the byte is the end of a string (e.g., root character) and, if so, jumps to block 292. Block 292 builds a new data entry in the next available address in the string table which consists of the concatenation of the first encoded input word (OLDCODE) and the last byte output (K). Block 294 points to the next unused address location and block 296 replaces OLDWORD with the last encoded input word (INCODE) and returns to block 282.

Block 282 reads the next encoded input word (INCODE) and block 284 outputs the data entry at the address INCODE. If the data entry output at address INCODE is not a root, it will include a decoded byte K and a codeword field pointing to a next address for further decoding (OMEGA). Block 286 will then output K and decision block 288 will jump to block 290. Block 290 uses the codeword field (OMEGA) as the address of the next data entry output from the string table and then loops back to block 284. The process is repeated until the data entry output from the string table contains a root character (i.e., is the end of a string). Decision block 288 then proceeds to block 292 where the previously read encoded word (OLDCODE) is concatenated with the last output byte (K). The functions in blocks 294 and 296 are then performed and then the process returns to block 282. Thus, the decompression process regenerates the original data stream compressed in the compression process of FIG. 8.

Figure 10:
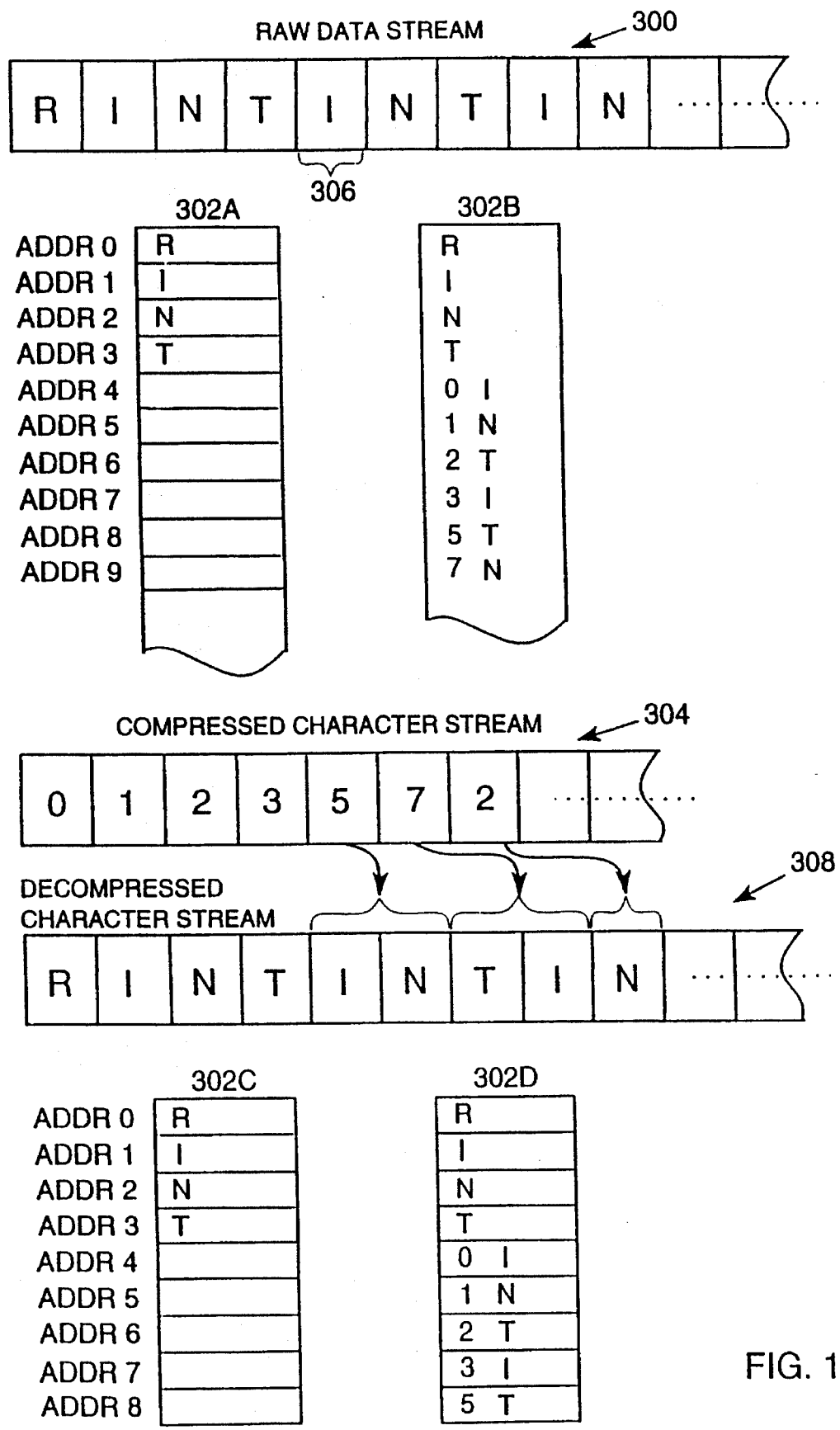
FIG. 10 is a graphical depiction of the compression and decompression procedures in FIGS. 8 and 9.

FIG. 10 is a graphical depiction of the compression and decompression algorithms in FIGS. 8 and 9. A raw data stream 300 comprises an uncompressed string of characters which are input to the data compression/decompression process illustrated in FIG. 7. In this example, single characters R,I,N, and T have been loaded during initialization into locations ADDR0, ADDR1, ADDR2, and ADDR3 of memory 302A respectively. Input characters are encoded by assigning each character the value of its address location, however, to increase compression speed, single input characters can be encoded algorithmically prior to initiating the process described below. Memory 302A illustrates the dictionary in its state immediately after initialization and memory 302B illustrates the dictionary after compression is complete.

The first input character R, from data stream 300, matches the data entry at address location ADDR1. Since there was a match, the compression system concatenates the encoded value for R (Addr0=0) with the next input character "I", and memory 302A is searched for a "0I" match. Because there is no "0I" match in memory, "0I" is written into the next available memory location (ADDR4), as illustrated in memory 302B. The codeword for the largest matched sequence (i.e., the codeword for "R"=0) is output as the first encoded character in compressed character stream 304. The compression system now searches memory 302B for the string comprising the encoded value for "I" (i.e., ADDR1=1) concatenated with the next input character "N". Since the string "1N" is not in the dictionary, it is written into the next available memory location (ADDR5), as shown in 302B. The value 1 (e.g., last matched character string="I") is output as the second encoded character in compressed character stream 304.

The process continues to built memory 302B and encode input characters in a similar manner until the second "I" in the uncompressed character stream 300 is processed (e.g., character 306). The compression system encodes "I" with the value 1, since "I" is located at address location ADDR1. The encoded value 1 is concatenated with the next input character N and the string "1N" is compared with the data entries in memory 302B. Since the sequence "1N" has occurred previously in character stream 300, the string "1N" matches an entry in memory (e.g., data entry at Addr5). The string "1N" is therefore encoded as "5" and concatenated with the next input character "T". Since the string "5T" does not match any entry in memory 302B, "5T" is written into the next available address location (ADDR8) and the codeword for the last matched character string "5" is output in character stream 304. The encoded value for input character "T" (ADDR3=3) is then concatenated with the next input character "I" and the process is repeated. Memory 302B shows all characters built for the dictionary from character stream 300. Character stream 304 is the complete compressed character stream for raw data stream 300. Notice that only six encoded characters are required to represent the nine characters in character stream 300.

The decompressor dictionary is reinitialized for decompression as illustrated in 302C so the first four address locations contain the decoded values for the single input characters R, I, N, and T respectively. Again, single character decoding may also be preformed algorithmically. The first encoded input character "0" is used as an address into memory 302C. The decompression system determines that the value "0" is a root codeword, for example, by checking that the value is less than 4. The data entry at ADDR0 (e.g., "R" ) is thereby output as the first character in decompressed character stream 308. The decompression system then reads the next encoded input character "1". This value is again a root codeword and therefore the data entry at ADDR1 is output as the second character "I" in decompressed character stream 308.

At this point, a new dictionary entry is built using the last decompressed character "I" concatenated with the previous codeword "0". The string "0I" is then written into the next available address location (ADDR4), as shown in memory 302D. The next codeword "2" is input and the process is repeated. This time the data entry at address location ADDR2 (e.g., N) is output and then the string "1N" is written into memory at address location ADDR5.

The process is repeated in the same manner until input character "5" is read by the decompression system. The decompression engine uses this codeword to reference the data entry at ADDR5. The encoded character "5" is not a root since it is greater than three, therefore, the decompression system outputs the last byte of the data entry at address location ADDR5 (e.g., "N"). The rest of the data entry (e.g., "1") is used as the next address. Since the codeword "1" is a root, the data entry at ADDR1 (e.g., "I") is output and no further decompression is required. The decompressed characters "IN" are then placed in character stream 308. A new data entry is written in memory into address location ADDR7 using the last decompressed output character "I" and the previous encoded input character "3". The process is repeated until all characters in character stream 304 are decompressed. It will be noted that dictionaries built using the HP-DC scheme with hashing are different. In contrast, the compression and decompression dictionaries 302B and 302D built by the present system and method have identical addresses/entries.

III. Using Multiple Dictionaries in a CAM Compression/Decompression System

To further reduce the amount of memory required to compress data using a CAM, the CAM data compression system previously illustrated in FIG. 5 is used in conjunction with a standby dictionary (see FIG. 3). The CAM, while having the capacity to process one character each clock cycle, can now compress data using minimal memory. In addition, the data compression ratio is increased by maintaining a useful set of character strings in the current dictionary after a reset. The method illustrated below is adaptive whereby the dictionary is embedded in the codewords so that a separate dictionary does not have to be transferred before each decompression process.

FIG. 11 is a high level block diagram of the combined CAM multi-dictionary compression/decompression system. For illustrative purposes, the system is implemented using a $2^b \times (b+m+2)$ CAM 312 similar to that illustrated in FIG. 5. The CAM 312 comprises a control bus 314 coupled to a control processor (not shown). An address bus 316 (b-bits wide) and a data bus 318 (n-bits wide) are coupled to CAM 312. The zero bits of a n-bit wide DATA_MASK bus 320 disable the corresponding bits during a CAM search. For example, a "0" signal on the first mask bit (DATA_MASK [0]) disables the first DATA_IN bit (DATA_IN[0]) fed into CAM 312. A disabled DATA_IN bit is not taken into account when searching CAM 312 for a data entry that matches the signal on line 318. Data masking circuits are well known in the art. Therefore, the details of the masking circuit used in CAM 312 will not be shown in detail. A match success line 322 goes active whenever the data on bus 318 matches a previously stored entry in CAM 312. MATCH_ADDRESS bus 326 contains the address of a matched data entry and DATA_OUT line 324 is used to output data entries previously stored in CAM 312.

FIG. 12 shows the different fields contained within each dictionary entry in the CAM. Each CAM data entry has three fields: a character field (CHAR) which is m-bits wide for storing the suffix character K, a code field (CODE) b-bits wide for storing the encoded character value OMEGA, and a status field (ST) two-bits wide for storing the dictionary status bits for the associated CODE and CHAR fields. The status field (ST) takes one of four possible values as follows:

FREE: The CAM memory location is presently unused in the current dictionary;

CD: The CAM location contains a data entry that belongs to the current dictionary, but not to the standby dictionary;

SD: The CAM location contains a data entry that belongs to both the current and standby dictionaries; and INV: Invalid value, should not occur in normal operation.

The binary values corresponding to FREE, CD, SD and INV are not fixed. The compressor and decompressor operate as state machines that can be in any one of four possible states (S), where 0≦S≦3. The specific binary values for the status field (ST) are functions FREE(S), CD(S), SD(S), and INV(S) of the state (S) and are defined in FIG. 13. For example, in state S=0, if the bits [0:0] exist in the status field of a CAM data entry, that memory location is FREE and regarded as not presently being used in the current dictionary. If the compressor/decompressor system is in state S=2, however, a CAM location with bit values [0:0] in its status field is regarded as a data entry that has been assigned to the standby dictionary.

Initially, the system is in state S=0, and all the ST fields are set to [0:0] (e.g., ST=FREE(S)). This is the only time a global initialization is necessary, as will be explained further below, minimizing the initialization time delay that would occur during subsequent dictionary resets. The compressor, initially in state S=0, starts reading input characters, compressing input strings and building, in parallel, the current dictionary (CD) and standby dictionary (SD). When the CD becomes full, a dictionary switch occurs whereby the data entries in the SD become the new data entries in the CD. The SD is essentially emptied, removing all valid data entries.

Figure 14:
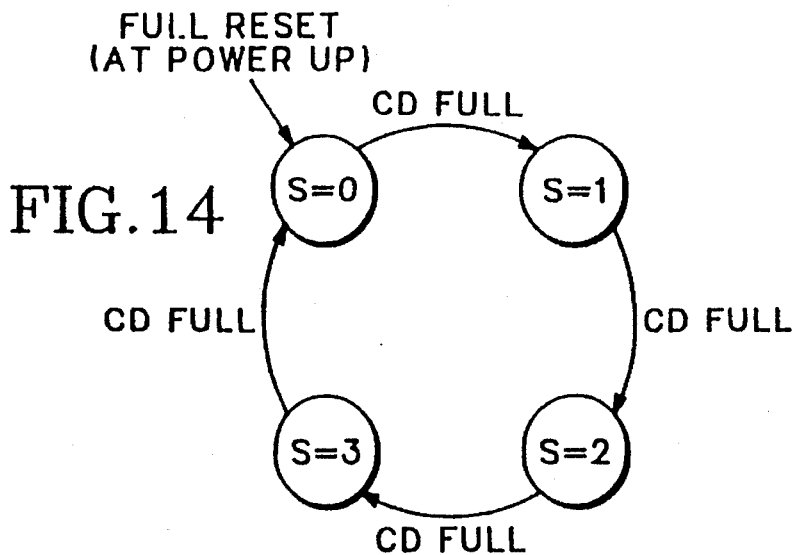
FIG. 14 illustrates the state transition changes for the CAM multi-dictionary compression/decompression system.

The dictionary switch occurs when the system makes the state transition S=0→S=1. Referring to FIG. 13, in state S=1, the free entries are those with ST=[1:0], which is the same as the CD value in state S=0. In state S=1, CD entries are those with ST=[1:1], which is the same as the SD value in state S=0. A state transition occurs only when the CD becomes full, so all entries in the CAM will either be marked CD or SD (i.e. no entries in the status field with a FREE value and the value INV is never written). Therefore, immediately after the state transition from S=0 to S=1, all entries have the value FREE or CD (with the exception of the initial single-character strings, which are not actually kept in dictionary memory, as will be explained below). There are no entries with the value SD, so the new SD starts empty. A similar situation occurs in the state transitions; S=1→S=2, S=2→S=3, and S=3→S=0. FIG. 14 illustrates the state transition changes for the compression/decompression system as described above.

Figure 15:
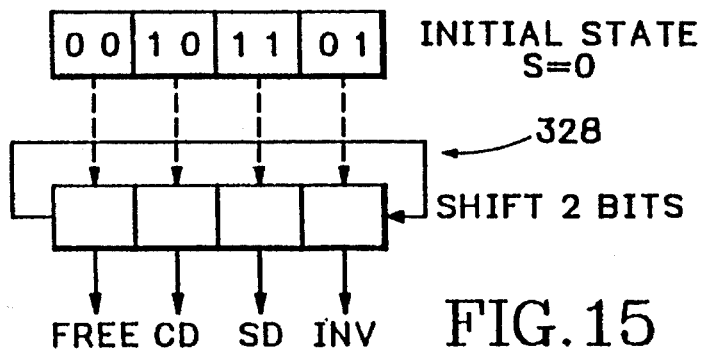
FIG. 15 is a logic diagram illustrating a simple hardware implementation for changing compressor/decompressor states.

FIG. 15 illustrates a simple hardware implementation for changing compressor/decompressor states. The initial bit values of a status register 28 are illustrated at state S=0. For each state transition, the bits in the status register shift cyclically so that; FREE→INV→SD→CD→FREE. Thus, state control is simply implemented using an 8-bit cyclic shift register and shifting register 328 two bits to the left for each state change.

In describing the CAM-based standby dictionary compressor, the contents of a CAM memory location are denoted by a triplet (ST,CODE,CHAR), and code(A) represents the encoded value for a single-character string "A". For description purposes, codewords are assigned values corresponding to memory address locations. However, codeword values are also easily derived as simple functions of memory address locations and would be easily implemented by one skilled in the art. It is assumed that the codes (code(A)) within a predefined address space (e.g. addresses 0 to $2^m-1$) are immediately available without need to access the dictionary. As explained previously (see FIG. 5), the memory locations corresponding to these codes do not need to physically exist in the CAM. Therefore, it is assumed that all CAM searches exclude these locations. For simplicity, "end of file" conditions are also ignored.

Implementation of the CAM Based Multi-Dictionary System

Figure 16:
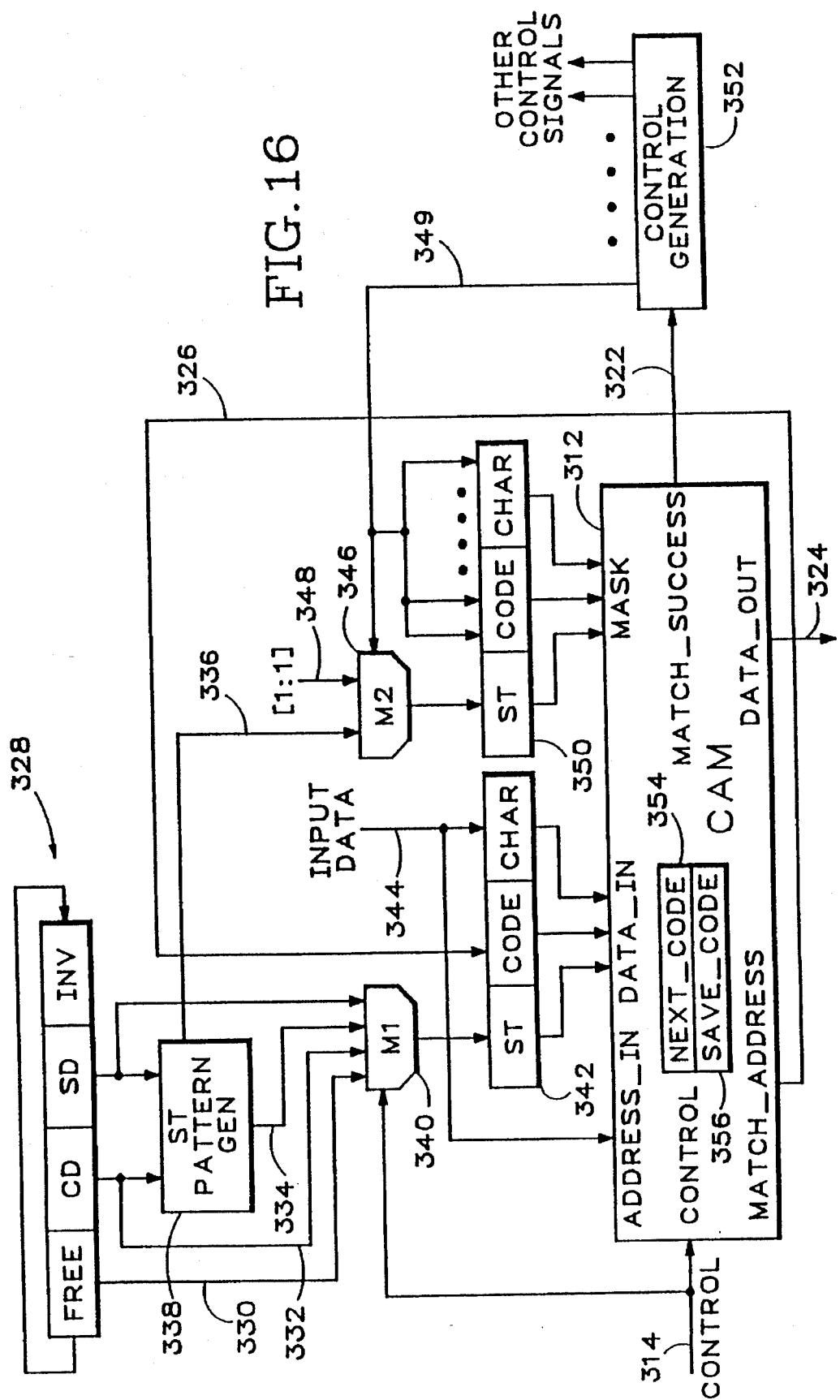
FIG. 16 is a detailed circuit diagram of the main components for the CAM multi-dictionary compression/decompression system shown in FIG. 11.

FIG. 16 is a detailed circuit diagram of the CAM-based multi-dictionary compression/decompression system. The circuit diagram in FIG. 16 illustrates the additional functional components necessary to provide multi-dictionary compression/decompression. The CAM compression/decompression circuit 312 is the same as that illustrated in FIG. 11 and the status register 328 is the same as that illustrated previously in FIG. 15. A DATA_IN register 342 and a MASK register 350 feed the ST, CODE, and CHAR fields through the DATA_IN and MASK ports respectively of the CAM 312. The ST field for each data entry in the CAM is controlled directly through the status register 328 or indirectly through a ST pattern generator 338. The ST pattern generator is illustrated in detail in FIG. 17.

The specific CD and SD lines feeding the DATA_IN port are controlled through a multiplexer 340 (MUX M1) by manipulating a control bus 314. The signals on control bus 314 come from a system processor (not shown) and control compression/decompression functions within CAM 312. Control bus 314 contains the same read, write, search, and reset signals as previously illustrated in FIG. 5. The internal compressor/decompressor control logic within CAM 312 is also similar to that illustrated in FIG. 5. Minor modifications to this logic may be required to implement some of the specific features described below. These circuit modifications are easily implemented by one skilled in the art and are therefore not illustrated in detail.

A line 326 couples the MATCH_ADDRESS port of CAM 312 to the DATA_IN port of CAM 312. An external data bus 344 is coupled directly to the ADDRESS_IN port and coupled to the DATA_IN port through register 342. A ST pattern generator line 336 and a data input line 348 feed the ST field of the MASK register 350 through a multiplexer 346 (MUX M2). A search type signal on line 349 and various other control signals from a control generation circuit 352 are controlled by the MATCH_SUCCESS signal on line 322. The DATA_OUT signal on line 324 outputs compressed or decompressed data to data interfaces as shown in FIG. 4. An internal address pointer 354 (NEXT_CODE) can write data to a second address pointer 356 (SAVE_CODE) or can receive data from the CAM DATA_IN port.

Figure 17:
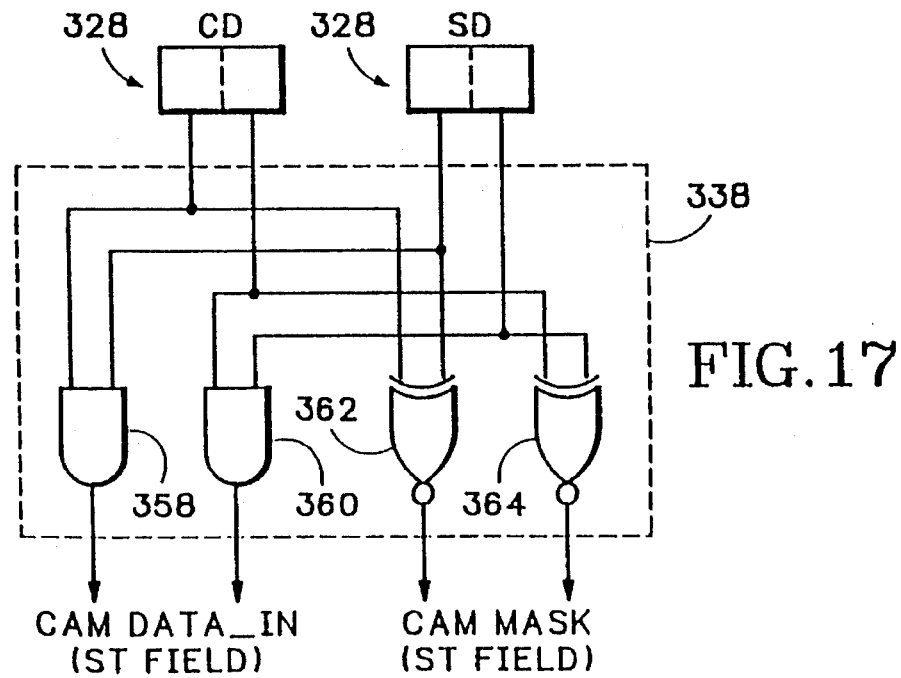
FIG. 17 is a detailed circuit diagram of a ST pattern generator.

FIG. 17 is a detailed circuit diagram of the ST pattern generator 338 from FIG. 16. The first bit from the CD field and the SD field of status register 328 (FIG. 16) are input to an AMD gate 358 and an EXCLUSIVE-NOR gate 362. The second bit from the CD and SD fields are coupled to AND gate 360 and an EXCLUSIVE-NOR gate 364. The AND gates feed the ST field of the CAM DATA_IN port and the EXCLUSIVE-NOR gates feed the ST field of the CAM MASK port (FIG. 16).

The compression/decompression system must be able to search for both CD and SD dictionary entries simultaneously (as discussed in detail below). This is performed by manipulating the bits in status register 328 (FIG. 16). One of the bits in the CD and the SD will always match and the second bit will always be different (see FIG. 13). Thus, the matching bit is used to search for a valid SD or CD dictionary entry and the second bit is masked out. For example, in state S=0, the bit values for the current dictionary CD are [1:0] and the bit values for the standby dictionary are [1:1]. This drives the outputs of AND gate 358 and EXCLUSIVE-NOR gate 362 high and drives the outputs of AND gate 360 and EXCLUSIVE-NOR gate 364 low. Therefore, any ST field in the CAM dictionary with a "1" located in its first bit position (e.g. CD(S) or SD(S)), is identified as a valid dictionary entry of either the CD or SD.

Data Compression

The system in FIG. 16 compresses data in the following manner. The system is set to state S=0 by loading the status register 328 with bit values as illustrated in FIG. 15. All ST fields in the CAM dictionary are set to ST=FREE(S) (i.e., [0:0]) and the address pointer NEXT_CODE is set to the first available address in the CAM. As discussed previously for the CAM illustrated in FIG. 5, the single input characters can be encoded algorithmically during data compression, in which case all the CAM addresses are available for storing character strings. If single data characters are stored in the CAM, however, the first available address for writing an encode character string will typically be the address location after the last single character location.

If necessary, a first input character is encoded by reading the first data character from input data line 344 and generating the address for the input character/data entry match on line 326. The encoded first character (OMEGA) is then concatenated in register 342 with a second input character (K) from input data line 344 to generate an OMEGA, K character string. A search is performed in the CAM for a data entry that matches the OMEGA, K string. At the same time, the ST field is searched for a CD or SD value that matches the value generated by ST pattern generator 338 (e.g. an OMEGA, K string that has already been stored as a CD or SD entry). All bits of SEARCH_TYPE signal 349 take a value "1" when searching for a match, which enable the CODE and CHAR fields of the CAM mask. MUX M1 and MUX M2 select the ST fields for the MASK and DATA_IN ports respectively from the ST pattern generator 338 as previously illustrated in FIG. 17.

Since this is the first OMEGA, K string fed into the CAM, the MATCH_SUCCESS signal on line 322 indicates no match. In turn, OMEGA is output on line 324 and the character string CD(S), OMEGA, K is written into the ST, CODE, and CHAR fields respectively at CAM dictionary location NEXT_CODE. The character K of the OMEGA, K string is then encoded (code(K)) and used as the new value for OMEGA. The CD(S) value written into the ST field is supplied directly from register 328 by altering the input of MUX 340 which feeds into the ST field of register 342.

The system then searches for the next available CAM dictionary entry (e.g. ST=FREE(S)). Accordingly, the SEARCH_TYPE signal 349 takes the value "0", masking out the CODE and CHAR fields and enabling the ST field via the [1:1] bit values on line 348. At the same time, control line 314 coupled to MUX 340 selects the value FREE from register 328 as the value searched in the ST field. The match address from line 326 is used as the NEXT_CODE for storing the next unique OMEGA, K string. The process extracts the next character from the input data string on line 344 and concatenates it with OMEGA, generating the OMEGA, K string for the next search. If a match is found on the next search, the address location of the match is fed back into the DATA_IN port on MATCH_ADDRESS line 326 for the next match attempt. This address is used as the new OMEGA value representing the previous OMEGA,K string. At the same time, the SD(S) value from register 328 is written into the ST field at the match address.

As described above, after a new OMEGA, K string is written into a CAM location, a search is performed to find the next FREE value in the status field. A failed search indicates the current directory is full and causes the system to switch into state S=1. This is performed by rotating the contents of register 328 two bit positions to the left. The status field locations previously having SD(S) values now constitute CD(S) values. Because all the status fields in the CAM had been set to either CD(S) or SD(S) in state S=0, (e.g. no FREE status field values exist just prior to the state change), all FREE memory locations in state S=1 will be previous CD(S) entries from state S=0. In addition, the standby directory will be empty except possibly for the initial single-character strings in state S=1 since the INV value is never written in state S=0. Compression continues as described above with the system in state S=1. This process continues generating compressed data characters and switching states until all of the input data is compressed.

Data Decompression

Data decompression using the system in FIG. 16 is performed in the following manner. The CAM is initialized by resetting the bits in register 328 to state S=0. The FREE bit values are written into the status field of each available memory dictionary location. The internal address pointer 354 (NEXT_CODE) is set to the first available memory location in the CAM (e.g. NEXT_CODE=$2^m$) and internal address pointer 356 (SAVE_CODE) is set to zero.

Decompression is performed in the same manner as described above in FIG. 5. For example, the first encoded character from the encoded character string (OMEGA) is read on line 344. OMEGA is then used as the address fed into the CAM ADDRESS_IN port. If the value of the CODE field output on line 324 is not a "root", the CHAR field is output on line 324 and the CODE field is fed back into the CAM as the next address location. This process is repeated until a "root" CODE field is read out from the CAM.

After a compressed input character (OMEGA) has been decompressed and the decompressed character string output on line 324, the ST field at address location OMEGA is set to SD(S). This is performed by writing the SD(S) value from register 328 into the ST field of register 342. The dictionary is then built by feeding back the first character (K) from the decompressed data string into the CHAR field of register 342 at address location SAVE_CODE. The CD(S) value from status register 328, the OMEGA value originally read over line 344, and the first character from the decompressed OMEGA output string (K) are written into the ST, CODE, and CHAR fields of the CAM dictionary at address location NEXT_CODE. The value of address pointer NEXT_CODE is then written into address pointer SAVE_CODE. A "0" value is placed on line 349 and the [1:1] bit values on line 348 allow a "status field only" search. The next dictionary entry in the CAM with a FREE status field is then found by searching the ST fields for a FREE value. The address value of the FREE status field is written into address pointer NEXT_CODE over line 326. The next encode character OMEGA is then read from line 344.

If the current dictionary is full (e.g. no FREE status field values exist), the system is switched to state S=1 by shifting the bits in register 328 as described above and the value of address pointer NEXT_CODE is reset. The current dictionary will therefore only contain entries from the previous standby dictionary. The system then reads the next encoded character (OMEGA) from line 344 and the data decompression process is continued.

Figure 18:
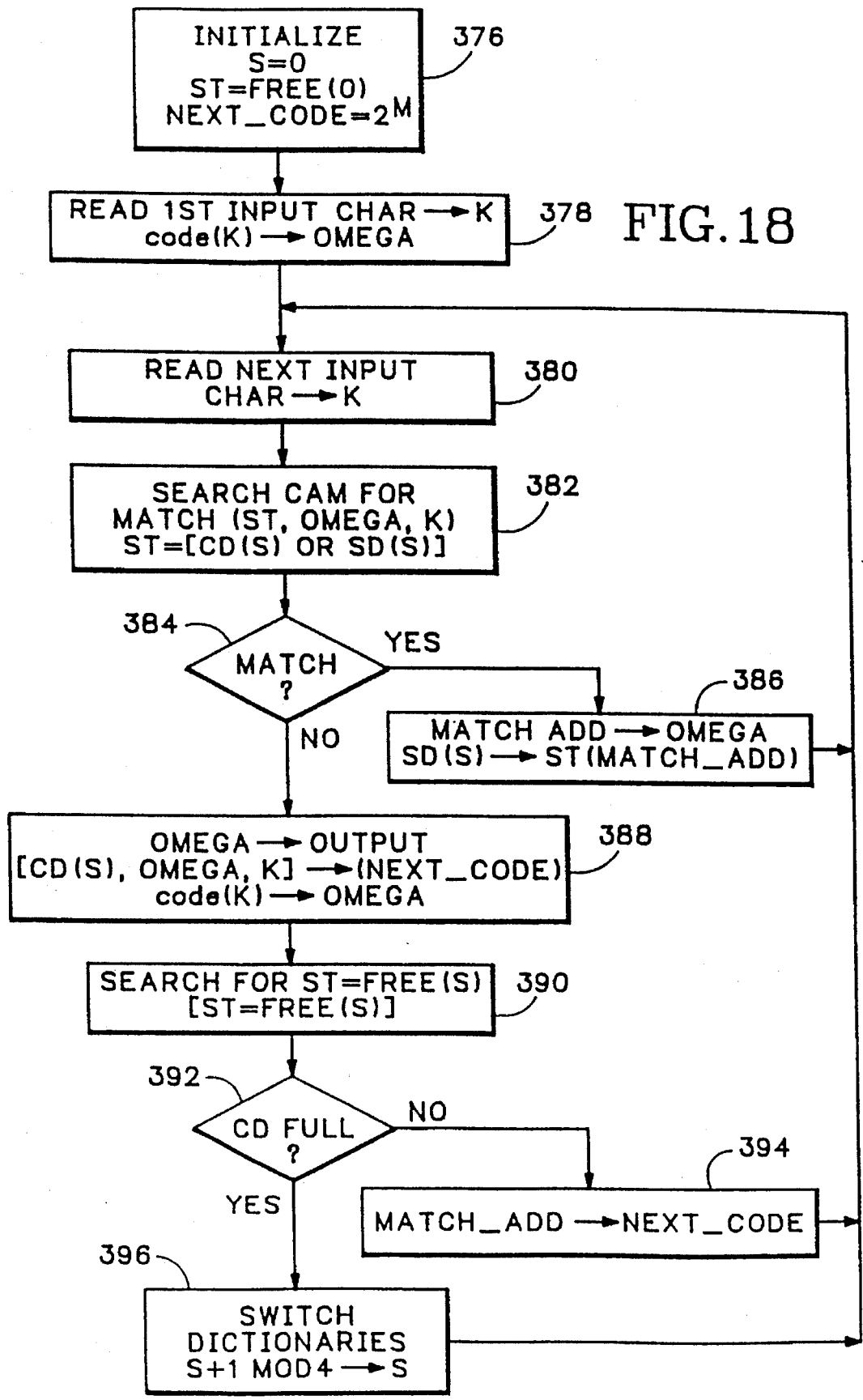
FIG. 18 is a data flow diagram showing the general method for data compression using a CAM with a standby dictionary.

FIG. 18 is a data flow diagram showing the general method for data compression using a CAM with a standby dictionary. Block 376 is an initialization process that sets the state and status conditions for the system. Specifically, the system is set to state S=0, all status registers in the CAM dictionary are set to ST=FREE(S), and the address pointer is set for the next available address in the CAM (e.g. $2^m \rightarrow$ NEXT_CODE).

A first character from an input data stream (CHAR→K) is read in block 378 and encoded (e.g., code(K)) to provide the value OMEGA. The next input character (K) in the input data stream is read in block 380. Block 382 combines OMEGA, and K together as a character string (e.g. concatenates OMEGA, K). A search is then conducted that not only looks for a data entry matching the OMEGA, K string but that also matches one of two alternate status register patterns (ST=CD(S) or ST=SD(S)). The search must look for both current and standby values since either value indicates a valid character string (e.g. OMEGA, K) has been written into the CAM. For example, a status register value ST=CD(S) indicates that the associated CODE and CHAR fields have been previously loaded with an OMEGA,K character string during the present process state. A status register value ST=SD(S) indicates the associated CODE and CHAR fields have been loaded with an OMEGA,K character string and have matched at least once in the present processor state with a second OMEGA, K character string. Thus, both status register values (CD(S) and SD(S)) indicate valid CAM data entries that should not be overwritten.

If no data string has yet been stored in the CAM, decision block 384 indicates that there is no match. The encoded value OMEGA is output as the first character in the encoded data string in block 388. The OMEGA, K string is written into the first available CAM address location (NEXT_CODE). The status field (ST) at the address location NEXT_CODE is written with the value CD(S) indicating a valid data entry in the CAM. Block 388 then replaces OMEGA with the encoded value of the second input character (code(K)→OMEGA).

Block 390 searches the CAM for the next available address location with ST=FREE(S). If a status register with a FREE(S) value is not found, the current dictionary in the CAM is full. Decision block 392 thereby replaces the current directory (CD) with the standby directory (SD) by changing the CAM into its next state S=S+1 mod 4. During a state change, the values of each status register are reassigned as previously described (see FIG. 13). The ST field values are reassigned as follows; FREE→INV→SD→CD→FREE. The process returns to block 380, where the next input character (K) is read. The matching process is then repeated as described above. If the current dictionary is not full, decision block 392 jumps to block 394. Block 394 determines the next address in the CAM having a FREE status register value and assigns that address to NEXT_CODE (e.g. match_address→NEXT_CODE). The process returns to block 380, where the next input character (K) is read.

If a match is indicated by decision block 384, the process jumps to block 386 where the OMEGA field is replaced with the address of the dictionary entry that matched the OMEGA,K string. The matched character string (represented by the CODE and CHAR fields at the match address) are automatically assigned to the standby directory by setting the status field ST at the match address to SD(S), The process then returns to block 380 where the next input character (K) is read from the data stream. The match address (OMEGA) and K are concatenated to form a new OMEGA, K string which now represents three input characters. Block 382 then searches the current and standby dictionaries for a character string match.

Actual building of the standby dictionary is done in block 386 when the ST field, at the address of the OMEGA,K character string match, is set to SD(S). This will often be an "overkill", since this location might already have been marked with SD(S). However, not having to check the ST field makes for simpler hardware implementation.

Figure 19:
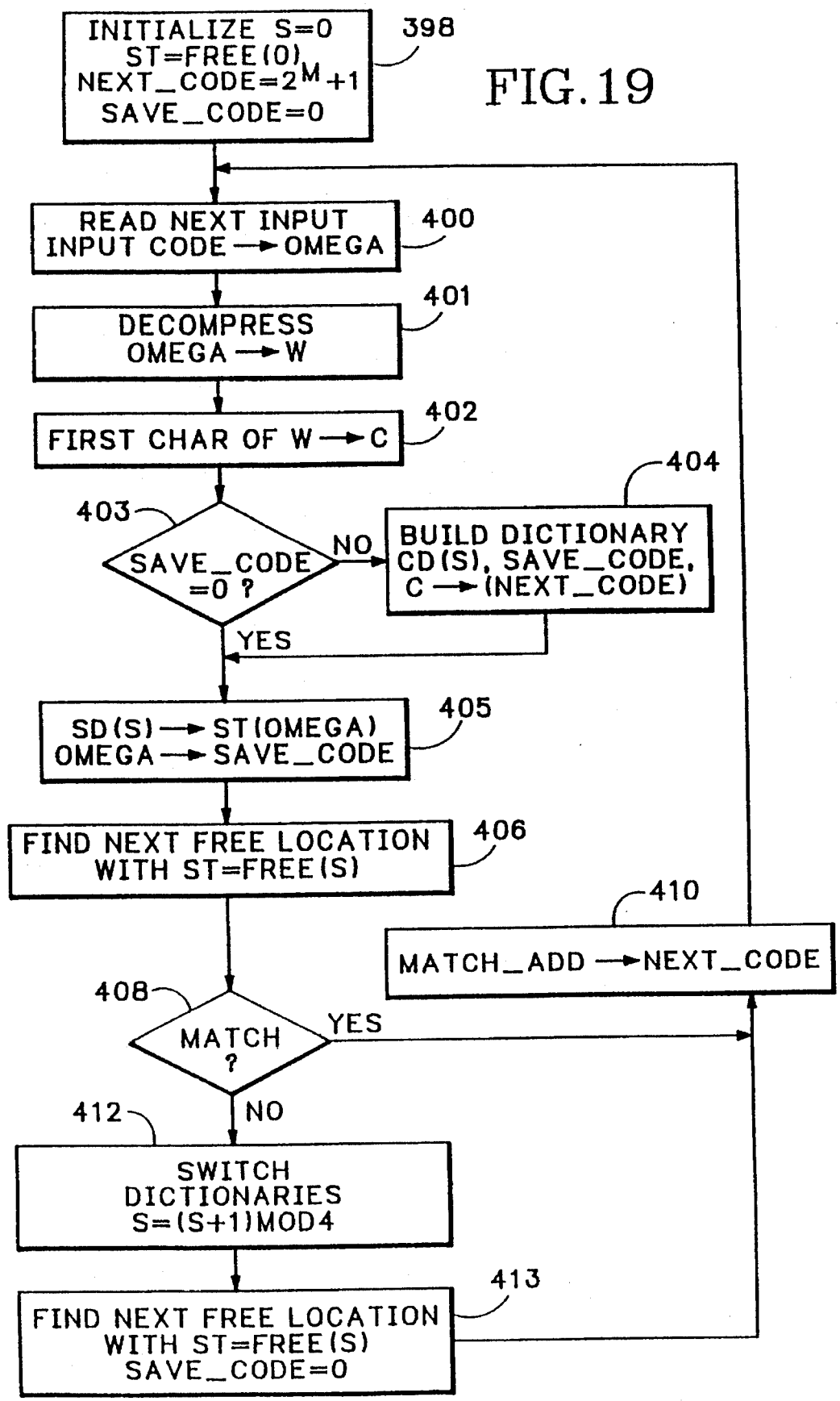
FIG. 19 is a data flow diagram showing the general method for data decompression using a CAM with a standby dictionary.

FIG. 19 is a data flow diagram showing the general method for data decompression using a CAM with a standby dictionary. Block 398 initializes the system to state (S=0) and initializes the ST field for all available dictionary entries to a value ST=FREE(O). The address pointer NEXT_CODE is set to the first free address location (NEXT_CODE=$2^m$+1) and a second address pointer SAVE_CODE is set to zero. The first coded character from the compressed data string (OMEGA) is read in block 400.

Block 401 decompresses OMEGA into a decompressed character string W as described above in FIG. 16. For example, by using OMEGA as an address, the CHAR field at memory location OMEGA is output by the CAM. If the CODE field from address OMEGA is not a "root", it is used as the next address fed into the CAM. The CHAR field for the next address is then output as the next decompressed character K. If the CODE field at address OMEGA is a "root", the CHAR field at address OMEGA is output and the CODE,CHAR fields at address OMEGA are assigned to the standby dictionary (e.g., SD(S)→ST). Block 402 assigns the first character of character string W to a register C.

If the address pointer SAVE_CODE is not zero, decision block 403 jumps to block 404 where the dictionary is built by writing the character string CD(S), SAVE_CODE,C into the CAM dictionary at address location (NEXT_CODE). If SAVE_CODE is equal to zero or after block 404 has written the character string, block 405 assigns the status field at address location OMEGA to the standby dictionary (SD(S)→(OMEGA)) and replaces the present SAVE_CODE value with the value of OMEGA. Block 406 searches for the next status field with a value ST=FREE(S). If a FREE ST field is located decision block 408 jumps to block 410 where the match address is assigned to address pointer NEXT_CODE (e.g. MATCH_ADD→NEXT_CODE). The process then returns to block 400 where the next encoded character from the compressed data stream (OMEGA) is read and decompressed.

If no ST field has a FREE(S) value, decision block 408 jumps to block 412. The process is then changed to the next state causing the current dictionary to be switched with the standby dictionary (i.e., S=S+1 mod 4). This also causes the current dictionary entries from the previous state to become FREE locations. Block 413 searches for the next free location with ST=FREE(S), resets the value of address pointer SAVE_CODE to zero, and jumps to block 410. Block 410 assigns the address value of the FREE location located in block 413 to address pointer NEXT_CODE. Block 410 then returns to block 400 where the process continues until all the data from the compressed data stream is decompressed.

Figure 20:
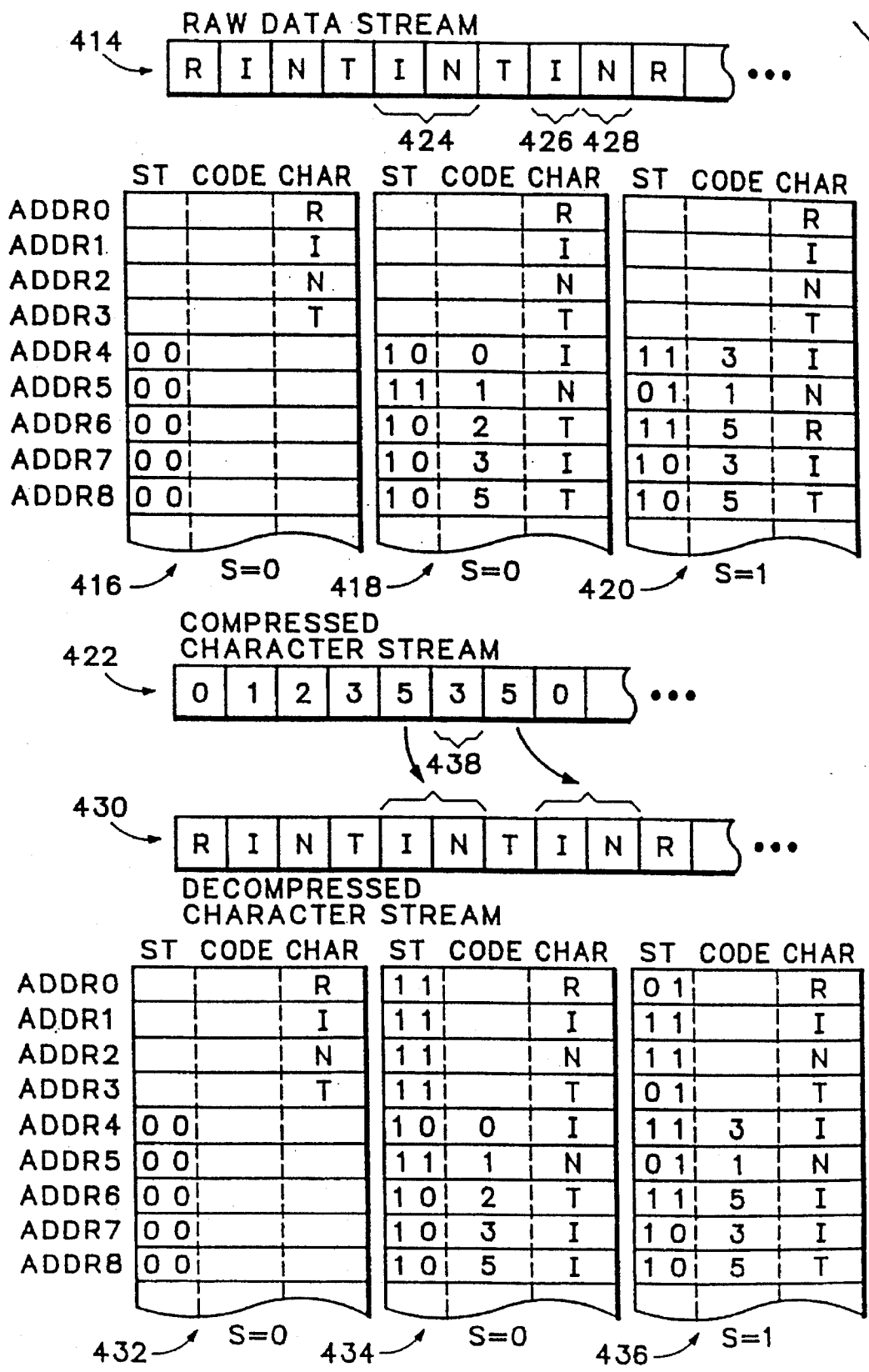
FIG. 20 is a graphical depiction of the compression and decompression methods in FIGS. 18 and 19.

FIG. 20 is a graphical depiction of the compression and decompression algorithms in FIGS. 18 and 19. A raw data stream 414 comprises an uncompressed string of characters which are input to the CAM compression process illustrated in FIG. 18. In this example, single characters R, I, N, and T have been loaded during initialization into locations ADDR0, ADDR1, ADDR2, ADDR3 of memory 416 respectively. Single-character inputs are encoded by assigning each character the value of its address location, however, to increase compression speed, single-input characters can be encoded algorithmically prior to initiating the process described below. Memory 416 illustrates the dictionary in state S=0 immediately after initialization and memory 418 illustrates the dictionary in state S=0 immediately before replacing the current dictionary with the standby dictionary (e.g. changing from state S=0 to state S=1). Memory 420 illustrates the dictionary in state S=2 after compressing raw data stream 414.

Each memory location in the dictionary is separated into a status field (ST), a code field (CODE), and a character field (CHAR). For illustration purposes, it is assumed that there are only 5 dictionary locations in the CAM available for storing character strings (e.g. ADDR4-ADDR8). Address locations ADDR0-ADDR3 are designated for single characters and are not searched as available dictionary locations. The bits of each status field are initialized to a value FREE=[0:0](e.g., FREE(S)=0) and an address pointer NEXT_CODE is initialized to the first available CAM memory location (NEXT_CODE=ADDR4).

The first input character "R", from raw data stream 414, matches the data entry at address location ADDR0, and is used as the first value of OMEGA (e.g. OMEGA=0). The compression system concatenates OMEGA with the next input character "I", (OMEGA, K) and searches for a "0I" match in the CODE and CHAR fields in memory 416. At the same time, the corresponding ST field in memory 416 is searched for the bit combinations "1:0" or "1:1" (e.g. CD(S) or SD(S) in state S=0). All memory locations are FREE and no "0I" string has been previously written into memory, therefore, no match will be found. Therefore, the value of OMEGA ("0") is output as the first character in a compressed stream 422 and the character string (CD(S), OMEGA, K) is written into the first FREE memory location (ADDR4). The character "I" is then encoded generating the next value for OMEGA (e.g. OMEGA=1).

The CAM dictionary is searched for the next ST field with a FREE value and that address location is assigned to the address pointer NEXT_CODE (e.g. NEXT_CODE=5). The next character from the raw data stream (K="N") is then concatenated with OMEGA (OMEGA="1") and the CAM is searched for the "1N" character string. Again no match will occur in the CAM and the character string (CD(S), 1, N) is written into address location ADDR5. The process is repeated in the same manner writing into the ST, CODE, and CHAR fields of the next available address after a character string is found not to match any previous entries.

The first character string/data entry match occurs from the combination of the characters 424 ("IN") from the raw data stream 414. Characters "IN" comprise the encoded OMEGA, K character string ("1N"). Since the CODE and CHAR fields of address location ADDR5 are "1" and "N" respectively, and the status field was previously set to ST=CD(S), a character string match occurs. The match address is used as the new OMEGA value (OMEGA=5) and the data entry at ADDR5 is assigned to the standby dictionary (ST=SD(S)=[1:1] for S=0). The next character "T" is read from the raw data stream 414 and concatenated with OMEGA. The new OMEGA, K string ("5T"), which now represents three characters, is then searched as previously described. No OMEGA,K string with the value "5T" exists in the CAM, so it is written into the next available address location (ADDR8). The encoded character "5" is output to compressed character stream 422 and the encoded value for "T" is used as the next OMEGA value (OMEGA=3).

Memory 418 illustrates the status of the CAM immediately after writing the character string "5T" into address location ADDR8. The process searches memory 418 for the next FREE status field. Assuming ADDR8 is the last available location in the CAM current dictionary, no FREE status field is found. This indicates that the current dictionary is full and the system is accordingly changed to state S=1. In state S=1, the status field bit values [1:0] constitute a FREE memory location, and bit values [1:1] constitute a current dictionary entry (see FIG. 13). Therefore, all dictionary locations in the current dictionary in state S=1, except the character string at address ADDR5, are available for storing character strings. With a state change, the address pointer NEXT_CODE is reset to the first FREE memory location (NEXT_CODE=4).

Referring to memory 420 in state S=1, the next input character 426 ("I") is then extracted from raw character stream 414 and concatenated with OMEGA for the next OMEGA, K search ("3I"). The string "3I" resides in memory location ADDR7, however, the status field at that location is now FREE. Therefore, no match is found, and the encoded value "3" is output as character 438 in compressed character stream 422. The character string (CD(S), 3, I) is written into memory location ADDR4 and the character "I" is encoded as the next OMEGA value (OMEGA=1). The address location of the next FREE status field is assigned to the address pointer (NEXT_CODE=6). Note that address location ADDR5 is skipped because its status field indicates a current dictionary entry after switching from state S=0 to state S=1.

The next input character 428 from raw data stream 414 is concatenated with OMEGA comprising the new character string ("1N"). A match occurs at address location ADDR5 and therefore OMEGA is assigned the match address value, and the status field at address location ADDR5 is assigned to the standby dictionary. The bit assignment for the standby dictionary in state S=1 are [0:1] (See FIG. 13). The next input character from raw data stream 414 is concatenated with OMEGA and the search process is repeated. The process continues to change the state of the system each time the current dictionary "fills up" until all the characters from the raw data stream 414 are compressed.

Memory 432 illustrates the memory ready for decompression immediately after initialization for decompression. Memory 434 illustrates the system in state S=0 immediately before changing from state S=0 to state S=1. Memory 436 illustrates the data entries in state S=1 after decompressing the compressed character stream 422. The dictionary in memory 432 is initialized so that the first four address locations contain the decoded values for the single input characters R, I, N, and T respectively. Again, single character decoding may also be performed algorithmically. The system is set to state S=0 and all dictionary status registers are set to FREE(S). The address pointer NEXT_CODE is set to the first available dictionary location (ADDR4) and the address pointer SAVE_CODE is set to zero.

Decompression is conducted as described earlier, whereby OMEGA is used as the address pointer into memory 432. The first input code from compressed character stream 422 constitutes an OMEGA value (OMEGA=0). The decompression system determines that the value "0" is a root codeword, for example, by checking that the value is less than 4. The data entry at ADDR0 (e.g. "R") is thereby output as the first character in the decompressed character stream 430. The status field at address location OMEGA is then set to SD(S).

The dictionary is rebuilt by writing the first character K from the decompressed codeword (e.g. "R") back into the CHAR field of address location SAVE__CODE. In this case, "R" is rewritten into the CHAR field of ADDR0. The character string (CD(S), 0, R) is then written into address location NEXT__CODE (e.g. ADDR4) and SAVE__CODE is set to the value of NEXT__CODE (e.g. SAVE__CODE=4). The address pointer NEXT__CODE is then assigned the value of the next free address in memory 434 (e.g. NEXT__CODE=5).

The character "1" is read from compressed character stream 422 and serves as the next value for OMEGA. OMEGA is decompressed and the decoded character "I" is output as the next character in decompressed character stream 430. The ST field of address ADDR1 is set to SD(S) (e.g. [1:1]) and the first character from the decompressed OMEGA value ("I") is written into the CHAR field at address location SAVE__CODE (ADDR4). The character string (CD(S), 1, I) is then written into the ST, CODE, and CHAR fields of memory 434 respectively at address NEXT__CODE (e.g. ADDR5). The value of NEXT__CODE is used as the new value for SAVE__CODE. The next FREE status register is located and NEXT__CODE set to that address (NEXT__CODE=5).

The process continues in a similar manner for encoded characters "2" and "3" from compressed character stream 422. The first "5" from compressed character stream 422 is the first non-root code word, and the data entry at address ADDR5 is the character string "1N". Therefore, the CODE field at ADDR5 ("1") is fed back as the next memory location read by the CAM. The output at ADDR1 ("I") along with the previous CHAR field "N" are then output by the CAM, and the ST field at ADDR5 is set to SD(0). The first character from the decompressed codeword ("I") is written into the CHAR field of memory location ADDR7 (e.g. SAVE__CODE=7), the character string (CD(S), 5, I) is written into CAM location NEXT__CODE (e.g. ADDR8), and the value of SAVE__CODE is set to the value of NEXT__CODE (e.g. SAVE__CODE=8). Memory 434 shows the status of the current dictionary immediately after writing this character string into memory.

The next search indicates no status field contains a FREE value. Therefore, the system is switched into state S=1 and the status register values are reassigned as illustrated in FIG. 13. Referring to memory 436, the address pointer NEXT__CODE is assigned the first FREE memory location (ADDR4). Address locations ADDR0-ADDR3, and ADDR5 are now entries in the current directory while address locations ADDR4, and ADDR6-ADDR8 constitute FREE locations in state S=1. Character 438 from compressed character stream 422 is set to OMEGA (OMEGA=3) and decompressed in the new decompression state S=1. The decoded character "T" is output in decompressed character stream 430 and the ST field at ADDR3 is assigned the value SD(S) for state S=1 (e.g. [1:0]). SAVE__CODE points to ADDR8 so the character "T" is written into the CHAR field at ADDR8 in memory 436. The character string (CD(S), 3, T) is written into address location ADDR4 and SAVE__CODE is assigned the value NEXT__CODE. The next FREE dictionary location is ADDR6 and accordingly is assigned to the address pointer NEXT__CODE. The process continues in the same manner until all characters in compressed character stream 422 are decompressed.

In traditional LZ2 implementations, codes are assigned sequentially, with single-character strings being assigned codes in the following order $C_0, C_0+1, C_0+2, \ldots, C_0+(2^m-1)$ where $C_0$ is some small constant (e.g. $C_0=0$). The new multiple character strings are assigned codes $C_0+2^m$, $C_0+(2^m+1), \ldots, 2^b-2, 2^b-1$, in that order, where each subsequent character string has a sequential address value in the CAM. Hence, assignment of codes to strings is achieved simply by keeping a counter initialized to $C_0+2^m$, and incrementing it every time a new dictionary string is created. This allows the compressor to use variable length output codes, using codes of length m+1 after a dictionary reset, and subsequently increasing the length of the output code by one bit every time the number of entries in the dictionary reaches the next power of 2. Therefore, the length of the output codes vary between (m+1) and b, where $2^b$ is the maximum size of the dictionary. This yields some gain in compression ratio, since the compressor uses shorter output codes when the dictionary address code is shorter. The decompressor builds its dictionary in lock-step with the compressor, and can keep track of the expected length of the compression codes.

In the process illustrated in FIG. 16, the encoded value for a new character string is the address of the first FREE dictionary location. Immediately after a dictionary switch, the CD consists of character strings from the previous standby dictionary with locations in the CAM that are not necessarily contiguous. These strings preserve their old addresses and thereby their codes, after the switch. Therefore, the addresses (codes) returned by the search for FREE do not form a contiguous sequence. Also, every encoded character string C in the range $0 \leq C \leq 2^b-1$ is potentially available immediately after dictionary reset.

As a consequence, the output stream must use fixed length codes. However, the negative impact of this on compression ratio is not significant. Since the CD starts partially filled after a dictionary reset, even if the codes in the CD were reordered, the number of bits required to represent codes would not be far from the maximum bit length (b). For example, in experiments, it was found that the current dictionary typically starts between ¼ and ½ full. This means that b-1 bits would be required after the switch even if the codes were aligned in contiguous order. It is possible, however, to use a variable length code during the building of the first current/standby dictionary (CD, SD) or the current dictionary could be reordered after each reset.

Compression Results

Figure 21:
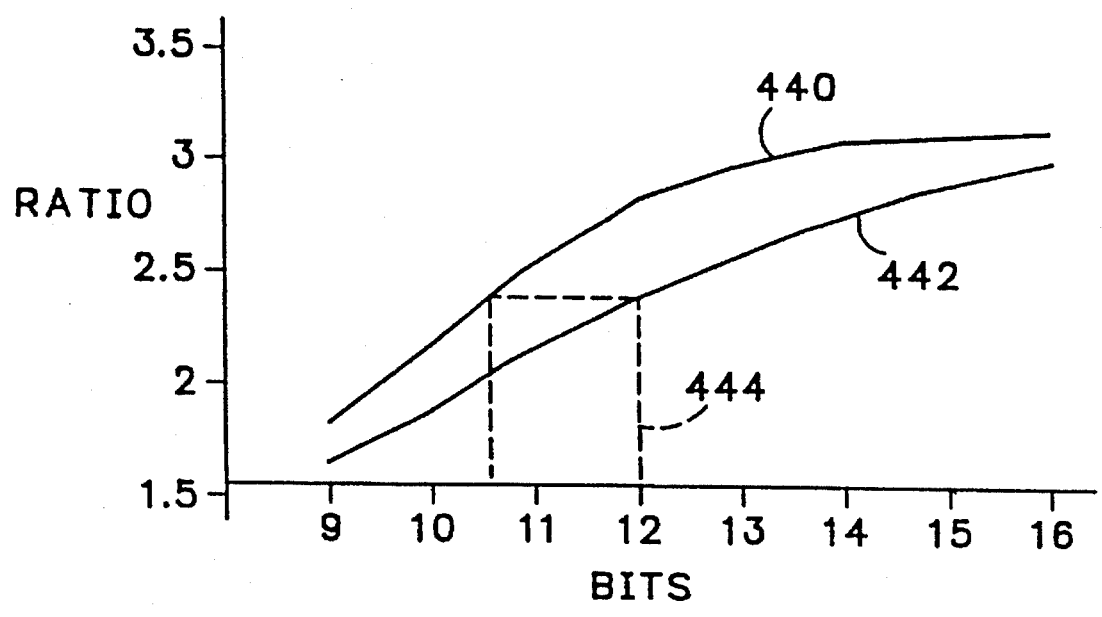
FIG. 21 is a graph showing the compression results for the CAM multi-dictionary system and for a standard LZW compression scheme.

The compression and decompression processes for the CAM multi-dictionary system were applied to various types of data, including source code, executable object code, ASCII data files, test files, and bitmap image files. The same files were compressed with a traditional LZW scheme using variable length output codes. An overall result of the compressions are shown in FIG. 21. Line 440 is the graphical representation of the compression ratio for the CAM multi-dictionary system and line 442 illustrates the compression ratio for a standard LZW algorithm. Lines 440 and 442 plot compression ratio (original file size/compressed file size) as a function of b, the maximum number of bits in the output codes (i.e. $\log_2$ of the dictionary size).

To emphasize the advantage of the CAM/standby dictionary method, a dashed line 444 is draw in the plot at the compression ratio achieved by a 12-bit LZW compressor. The value of b for the CAM multi-dictionary process achieving the same compression ratio is then located. As illustrated in FIG. 21, the CAM multi-dictionary system provides the same compression ratio with ½ to ¼ of the number of dictionary entries as the standard LZW compressor (e.g. one less bit=½ the required memory space). This compression ratio is achieved with CAM dictionary entries that are only 1 or 2 bits longer than a conventional LZW compressor data entry.

For clarity, a minimal implementation of the standby dictionary scheme has been illustrated. Many modifications can be implemented to further increase the compression ratio. For example, the compression/decompression process illustrated in FIGS. 18 and 19 assumes initialization of the dictionary with a set of all single-character strings in the input alphabet. Alternatively, an empty or intermediate initialization could be used as previously described. A process based on a combination of intermediate initialization and standby dictionaries can also produce high compression ratios using very small dictionaries.

An additional method for implementing the system does not switch dictionaries immediately after the current dictionary fills up. Instead, the current dictionary is frozen, and a dictionary switch is based on the compression ratio (i.e., the ratio falling below a certain level). While freezing the current dictionary, the standby dictionary can also be frozen or it can continue to be built until the next dictionary switch.

Another modification, specific to the standby dictionary method, makes use of the status field value INV denoted in FIG. 13. Currently, INV is not used for the dictionary entries. INV may be used to define a second level of standby dictionaries, denoted SD2. An entry that is already labeled SD, upon being referenced more than once, would be changed to SD2 (a new name for the current INV value). At dictionary switching time, CD entries would become FREE, SD entries become CD entries, and SD2 entries become SD entries. The first standby dictionary (SD) would be started from the set of character strings in SD2, and a new SD2 would start from scratch. This modification is easily implemented in the system illustrated in FIG. 16 by one skilled in the art.

Thus, a variant of the Lempel-Ziv data compression algorithm has been shown that builds a standby dictionary in parallel with the current compression dictionary. When the current dictionary fills up, the standby dictionary replaces it, and a new standby dictionary is started. The standby dictionary contains a selected subset of the character strings of the main dictionary, which allows for the implementation of both dictionaries on the same memory buffer. The preferred system implementation uses a content addressable memory module. To reduce processing time and circuit complexity, dictionary switching is based on a simple state transition scheme which eliminates the need for dictionary initialization after power-up. Therefore, the CAM multi-dictionary compressor/decompressor system achieves compression ratios comparable with traditional data compression implementations, using only a fraction of the memory, and with only a moderate increase in the complexity of the control circuitry.

IV Selective Overwrite Method of Data Compression/Decompression in a CAM-Based Multiple Dictionary System A second Lempel-Ziv Standby Dictionary (LZSD2) data compression and decompression method is now described that uses the compression/decompression system previously shown in FIG. 14. The LZSD2 allows all dictionary entries to be used for character string matching at all times. By filling available CAM storage locations with encoded data entries and keeping each available storage location assigned to a dictionary, reduced compression performance typically occurring after a dictionary swap is eliminated. Therefore, overall system compression performance is improved over multiple dictionary swapping schemes that discontinue using a number of previously stored data entries after each dictionary swap.

LZSD2 Compression

Three dictionaries are used for LZSD2 compression. The Current Dictionary (CD) holds new strings and strings demoted from the Standby Dictionary. The Standby Dictionary (SD) holds strings that have been matched by a dictionary search and are therefore "good" strings. There are also alternative criteria for assigning data entries to the standby dictionary. The FREE Previous Dictionary (FREE/PD) contains storage locations not currently assigned data entries and data entries which have been demoted from the Current Dictionary. Data entries in the (FREE/PD) dictionary are also selectably overwritten with new character strings. When the FREE/PD locations are filled up, the CAM changes state, in turn, creating in effect a dictionary swap.

The dictionary swap changes the priority in which data entries are overwritten with new input character strings. For example, data entries in the CD are demoted to FREE/PD and data entries in the SD are demoted to the CD. Therefore, after a dictionary swap, data entries previously assigned to the CD and which were not subject to being overwritten with new character strings, are now demoted to FREE/PD and are subject to being overwritten with encoded character strings.

Figure 22C:
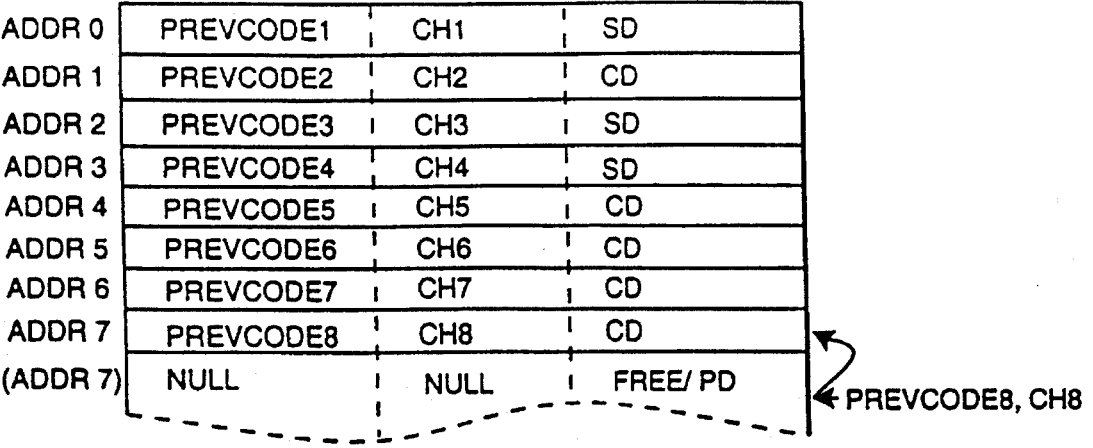

Referring to FIGS. 22A–22E, complete and continuous utilization of all dictionary space is carried out generally by searching the three dictionaries SD, CD and FREE/PD at the same time. Initially, all CODE and CHAR fields in each available storage location in the CAM are reset to a known value typically null and assigned to the FREE/Previous Dictionary (FREE/PD) as shown in FIG. 22A. Available storage locations refer to address locations in the CAM that are available for storing a data entry. A dictionary data entry comprises a string that includes PREVCODE N, which is the address of the best dictionary match that has been found so far and CH N which is the most recent character from the input data stream.

A first character string (PREVCODE1,CH1) is stored in the first available address location (ADDR0) in the FREE/PD dictionary and assigned to the Current Dictionary (CD). The next unique character string (PREVCODE2, CH2) is stored in the next available FREE/PD storage location (ADDR1) and also assigned to CD. Character strings (PREVCODE3,CH3) and (PREVCODE4,CH4) are stored in the CAM at the next available addresses ADDR2 and ADDR3, respectively and both are assigned to CD.

Referring to FIG. 22B, new unique character strings continue to be stored in available FREE/PD storage locations and assigned to CD. If the compression process receives a new character string that has already been stored in the CAM as a data entry and not overwritten, the data entry is reassigned or promoted to the standby dictionary (SD). For example, data entry (PREVCODE1,CH1) has previously been stored at address location ADDR0. Therefore, if a new character string contains the (CODE,CH) values (PREVCODE1,CH1), the data entry at ADDR0 is reassigned to SD.

FIG. 22C shows previously stored data entries, (PREVCODE1,CH1), (PREVCODE3,CH3), and (PREVCODE4, CH4) assigned to the standby dictionary since each such data entry matched a new input character string. The CAM remains in the present state until each available CAM storage location (e.g., the FREE/PD location at ADDR7) is filled with a data entry assigned to either the CD or SD as shown in FIG. 22C. FIG. 22C shows the last available FREE/PD location at address location ADDR7 replaced with a data entry prior to the dictionary swap.

Figure 22D:
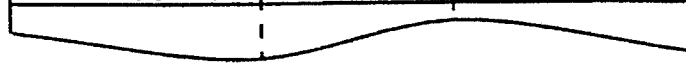
Figure 22E:
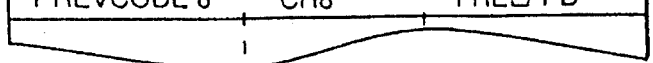

After all FREE/PD locations have been assigned data entries, the CAM changes state, causing a dictionary swap. FIG. 22D shows the status of each data entry immediately after the dictionary swap. For example, all data entries previously assigned to the SD are reassigned to the CD (SD->CD) and all data entries previously assigned to the CD are reassigned to FREE/PD (CD->FREE/PD). It is important to note that after the dictionary swap all data entries remain assigned to a dictionary. There will be no standby dictionary entries after the swap. For example, the data entries previously assigned to the CD at address locations ADDR1, and ADDR4-ADDR7 are reassigned to FREE/PD. Therefore, all data entries remain available for character encoding after a CAM reset. Therefore, data compression performance is maintained since no previously encoded compression data is lost after a CAM reset.

The LZSD2 method also has the capacity to adapt for new input data by selectively replacing data entries assigned to FREE/PD with new character strings not previously stored in the CAM. Specifically, if a new character string matches a data entry in either FREE/PD or the current dictionary (CD), the new character string is reassigned to the standby dictionary (SD). For example, in FIG. 22E, the next input character string (PREVCODE1,CH1) matches the CD data entry at address location ADDR0. Therefore, the data entry at ADDR0 is reassigned to SD. Further, the input character string (PREVCODE5,CH5) matches the data entry at address location ADDR4. Therefore, the data entry at ADDR4 is reassigned from FREE/PD to SD (PREVCODE5, CH5,FREE/PD) (PREVCODE5,CH5,SD).

If an input character string does not match any existing data entry, a new character string is put into a FREE/PD dictionary location and initially assigned to CD. For example, the input character string (PREVCODE9,CH9) does not match any data entry in the CAM. Thus, (PREVCODE9,CH9) is written into the CAM storage location of the FREE/PD with the lowest address (i.e., ADDR1) and assigned to CD (PREVCODE9,CH9,CD). It is also possible to assign data entries based on criteria other than lowest FREE/PD address location. If the same string (PREVSCODE9,CH9) recurs before a subsequent reset and overwrite, this entry would then be promoted to SD.

It can be seen that all data entries in the CD dictionary and those in the FREE/PD dictionary that have not yet been overwritten are still utilized at all times for character string matching. Since all data entries remain assigned to a dictionary after a CAM state change, no compression information is lost. Thus, the dictionaries can be continuously updated without temporary degradations in the data compression rate.

There are several methods for selecting the data entry in the FREE/PD that is overwritten when a new input character string is identified in the compression process. As discussed above, a new character string that does not match any data entry in either the FREE/PD,CD or SD is overwritten into the storage location in FREE/PD with the lowest address.

When the dictionary is initially built, by incrementing the address monotonically (as compared to using a hashing scheme), the lowest FREE/PD address will be the oldest dictionary entry. This situation will remain true however, only until all FREE/PD locations have been overwritten once. Alternatively, individual data entries in the FREE/PD dictionary can also be deterministically selected for replacement with new input character strings.

For example, data entries can be overwritten in FREE/PD according to how long the prior data entry has resided in a dictionary. In this example, each data entry can be assigned a tag that identifies the order in which it was written into a CAM storage location. The LZSD2 search process then selects the FREE/PD data entry with the tag value indicating it was least recently used (LRU). The least recently used data entry in FREE/PD would be the data entry that has resided in the CAM for the largest amount of time without matching an encoded character string.

The LRU data entry in some situations may have the highest probability of not matching a new character string. Therefore, overwriting the LRU data entry has the potential of minimizing any loss of compression information that could occur when an existing data entry is replaced. Utilizing tags to identify LRU data entries is described in detail by Bunton and Borriello in PRACTICAL DICTIONARY MANAGEMENT FOR HARDWARE DATA COMPRESSION, Communications of the ACM, January 1992, Vol 35, No. 1.

Figure 23:
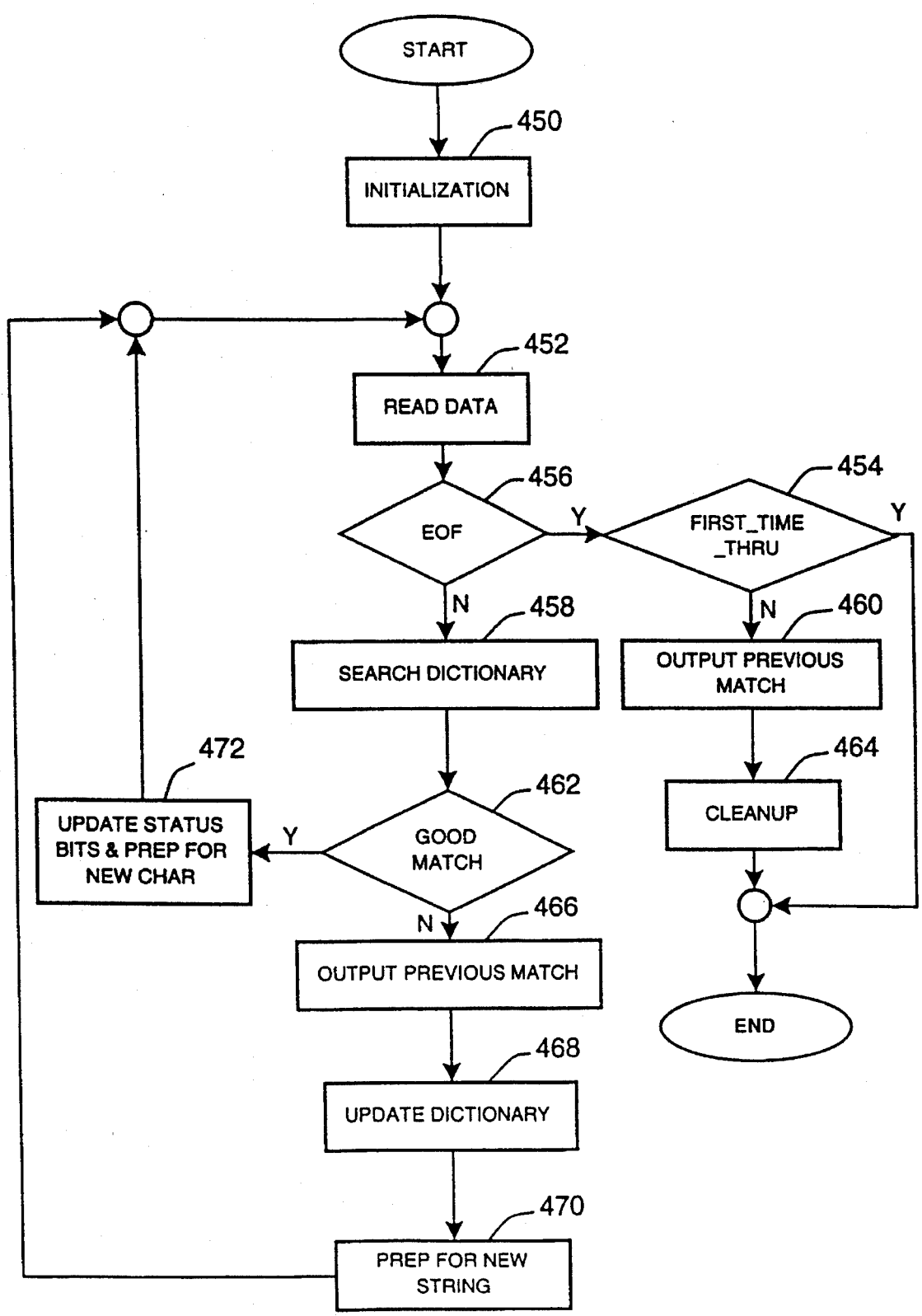
FIG. 23 is a data flow diagram showing the general method for performing LZSD2 compression.

FIG. 23 is a data flow diagram showing the general method for LZSD2 data compression. The compression/decompression system shown in FIG. 4 is initialized for LZSD2 compression in block 450. Input characters (CH) from the input character string are read one at a time in block 452. If an End of File (EOF) condition is identified in decision block 456, decision block 454 then checks to see whether it is the first time through the compression cycle. If the EOF condition is encountered the first time through the compression cycle, decision block 454 ends the LZSD2 compression process. If it is not the first time through the compression cycle when containing the EOF condition is detected, block 460 outputs the previously matched sequence PREVCODE and block 464 provides additional cleanup for ensuring proper formatting of encoded output characters.

Referring back to decision block 456, if an EOF condition is not identified, block 458 searches all three dictionaries (i.e., FREE/PD, CD, and SD) for the extended string (PREVCODE,CH). If the (PREVCODE,CH) string is matched with a previously stored data entry, decision block 462 jumps to block 472. If (PREVCODE,CH) is not already in the SD, block 472 reassigns the CAM location with the matching (PREVCODE,CH) data entry to the Standby Dictionary. The matching data entry is reassigned into the SD by changing the status bits. The (PREVCODE,CH) string is then encoded using the memory address of the matched data entry and assigned to PREVCODE, that is, CODE(PREVCODE,CH)->PREVCODE. Block 472 then jumps to block 452 where the next input character (CH) is combined with the encoded value of (PREVCODE). In this way, the status bits for the stored codes for each substring within a matched string are updated so they will be retained in the subsequent reset.

Once a string has been extended to the point that a match does not occur in decision block 462, block 466 outputs PREVCODE as the best match found. If there is an available FREE/PD location, block 468 updates the dictionary by writing (PREVCODE,CH) into the next available address (e.g., FREE/PD dictionary with lowest address) and assigns it to the Current Dictionary (CD). If there are no available FREE/PD locations, block 468 updates the dictionaries by swapping the current dictionary into the FREE/PD dictionary and swapping the standby dictionary into the current dictionary by changing the status bits, that is, (CD–>FREE/PD, SD–>CD). Block 470 prepares for the next input character string by assigning CH to PREVCODE (CH–>PREVCODE). There are alternate mappings from single character strings to compressed codes. The compression process then returns to block 452 to read and combine the next input character CH with PREVCODE.

FIG. 24 is a detailed data flow diagram for the LZSD2 compression scheme shown in FIG. 23. The following variables are used to describe LZSD2 compression and decompression.

CAM Content Addressable Memory. Each dictionary entry contains ([MAXBITS bit code field],[8 bit character field], [2 bit status field]).

CD Two bit Status value which indicates that the dictionary entry is in the Current Dictionary.

CH Eight bit variable which contains the most recent input character.

CODE_SIZE The number of bits currently used for each output code. The minimum is 9 and the maximum is MAXBITS which is determined by the dictionary size. $2^{(MAXBITS)} >=$(Number of dictionary entries)+(Number of root codes) (typically 256)+(Number of control codes).

DEPTH Variable which contains the number of characters in the string represented by PREVCODE during compression or INCODE during decompression. The size of this variable is determined by MAXDEPTH.

EOF A flag which indicates, when set, that an attempt to read data from the input stream failed because the end of the data stream was reached.

FIRST_CHAR Eight bit variable which contains the first character of the string represented by INCODE.

FOUND_CODE When the dictionary is searched for a data entry that matches the input data string, and a match is found, this MAXBITS bit variable is assigned the address at which the match was found.

FREE/PD Two bit Status value which indicates that the data entry is in the Previous Dictionary. It also indicates that the location can be overwritten.

GROW A CODE_SIZE bit control code which signals the decompressor to start reading one more bit for each compressed code.

INCODE MAXBITS bit variable whose value is read from the compressed data stream.

INVALID This is any MAXBITS bit code that is not a dictionary entry, i.e., INVALID may represent a control code or a root code.

LAST_CODE_BUILT MAXBITS bit variable which contains the address of the most recently built code.

MATCH This indicator is true if a search of the dictionary succeeded in finding a match.

MAXBITS Maximum number of bits in an output code.

MAXDEPTH The maximum string length that a code is allowed to represent.

NEXTCODE MAXBITS bit variable which contains the address of the dictionary entry that is to be overwritten with the new character string.

PREVCODE MAXBITS bit variable which contains the address of the best dictionary match that has been found so far during compression. During decompression PREVCODE represents what INCODE was during the previous cycle.

PREVDEPTH The string length of PREVCODE during decompression only.

SD Two bit Status value which indicates that the dictionary entry is in the Standby Dictionary.

STACK An eight bit by MAXDEPTH LIFO queue used for string reversal.

SWAP_FLAG Indicator flag that is true when a dictionary swap is needed.

TCODE AMAXBITS bit variable used as a temporary storage location when decoding INCODE.

TDEPTH Temporary variable used to keep track of the STACK depth while it is being emptied.

Figure 24A:
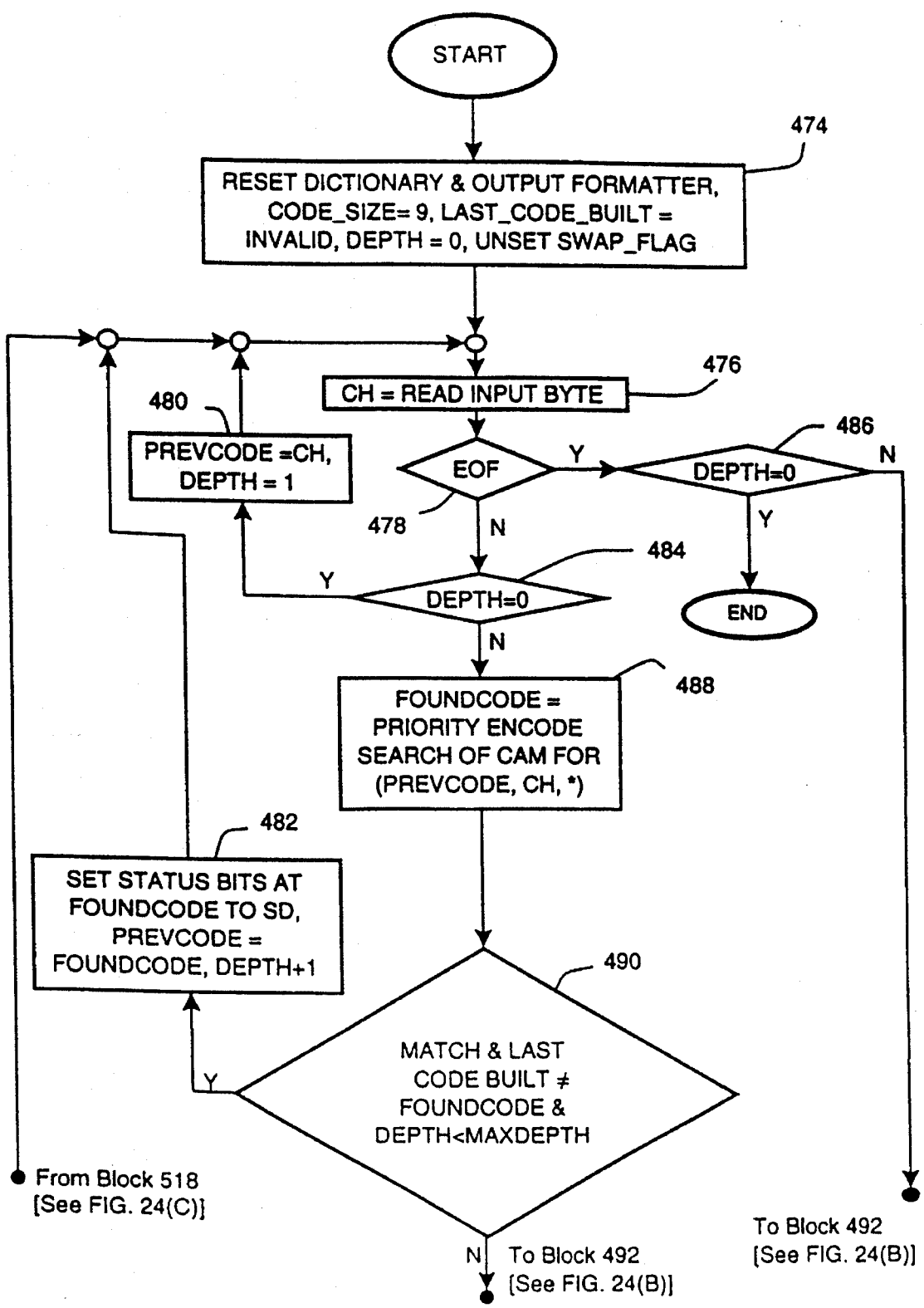
FIGS. 24A, 24B and 24C are a detailed data flow diagram for the procedure shown in FIG. 23.

Referring to FIG. 24A, at start up, block 474 puts the compression/decompression circuit previously shown in FIG. 4 in a known, consistent state. Each dictionary entry is set to a predetermined value. For example, the code field, character field, and status fields are typically set at; 000 Hexadecimal (HEX), 00 Hex, and FREE/PD, respectively. Thus, every dictionary location in the CAM contains the two character string (NULL NULL FREE/PD). It is also possible to initialize each dictionary entry to different string values to further increase the compression ratio. For example, character string combinations that occur frequently in the input character stream can be written into the FREE/PD dictionary prior to beginning the compression process.

Output format control is carried out by the compressed data interfaces 138 and 148 (FIG. 4) and are reset by block 474 to an empty initial state. The CODE_SIZE variable/register is typically set to minimum value such as 9, the LAST_CODE_BUILT register is set to INVALID, the DEPTH register is set to 0, and SWAP_FLAG is unset.

Block 476 reads an eight bit character from the input character stream and assigns it to variable CH. Decision block 478 determines whether a data read failure occurs due to reaching the end of the input stream (i.e., EOF flag). If an EOF condition is detected, decision block 486 ends the compression process and outputs any remaining encoded information. If the data read process succeeds (i.e., no EOF condition), decision block 478 continues the LZSD2 compression process.

When a data read failure occurs, decision block 478 jumps to decision block 486 where the string length of PREVCODE is checked. If DEPTH=0, PREVCODE has a 0 string length and cannot be output. Since the EOF flag also indicated that the end of the input data stream has been reached, DEPTH=0 indicates that there is nothing left to output; compression is finished and block 486 ends the compression process. DEPTH=0 only after initialization which means that no data was input. If DEPTH>0, decision block 486 jumps to decision block 492.

If the data read was successful, decision block 484 checks the value of the DEPTH variable/register. If DEPTH=0, PREVCODE has a 0 string length and cannot be used in dictionary searches. Therefore, block 480 assigns the input character CH to PREVCODE (PREVCODE=CH). PREVCODE now represents a one character string so DEPTH is set to 1. Block 480 then jumps back to block 476 to read the next input character CH.

If DEPTH>0, PREVCODE has a valid character string and the compression process continues to block 488. Block 488 searches all three dictionaries (FREE/PD, CD, and SD)

at the same time for a data entry having PREVCODE in the code field and CH in the character field (PREVCODE,CH). The simultaneous search of all three dictionaries is performed by simply searching only the code and character fields and disregarding the status field value.

It is possible for multiple addresses to match the (PREVCODE,CH) string, therefore, multiple matches must be reduced to one. This is done by using a priority encoder which will select the match address with the lowest value. When a location is found that matches (PREVCODE,CH) block 488 sets the MATCH flag, assigns the match address to FOUNDCODE, and goes to decision block 490.

Locating a (PREVCODE,CH) match in the dictionary is not enough to determine whether FOUNDCODE is an acceptable output code. Two additional tests must also be passed in decision block 490. First, the decompressor will incorrectly decode FOUNDCODE if such code was just built by the compressor. Therefore, FOUNDCODE cannot be equal to LAST_CODE_BUILT which prevents the most recently built dictionary entry from being used as an output code.

Also, in certain rare cases, it is possible that a string in the dictionary is longer than MAXDEPTH. If a code longer than MAXDEPTH were output, the decompressor string reversal register (see FIG. 4) would overflow and cause an error. To prevent this, the string length of FOUNDCODE is also checked in decision block 490.

If the (PREVCODE,CH) string is matched in the dictionary, LAST_CODE_BUILT is not equal to FOUNDCODE, and DEPTH<MAXDEPTH, decision block 490 jumps to block 482 where the dictionary data entry that matches the (PREVCODE,CH) character string is reassigned to the Standby Dictionary (SD). The data entry is reassigned by setting the status field at address location FOUNDCODE to SD. Block 482 then sets PREVCODE equal to the best string match found so far, namely FOUNDCODE (PREVCODE=FOUNDCODE), and the DEPTH variable is incremented to the new string length of PREVCODE, i.e., DEPTH is incremented by 1). Block 482 then jumps to block 476 where the next input character (CH) is read and appended to the new PREVCODE value creating the new string (PREVCODE,CH).

Referring back to decision block 490, if the (PREVCODE,CH) string does not match a dictionary data entry or if either of the two other tests performed in decision block 490 fail, block 496 outputs PREVCODE and the (PREVCODE, CH) string is assigned to the current dictionary in block 514 (i.e., PREVCODE,CH,CD) as described below.

Figure 24B:
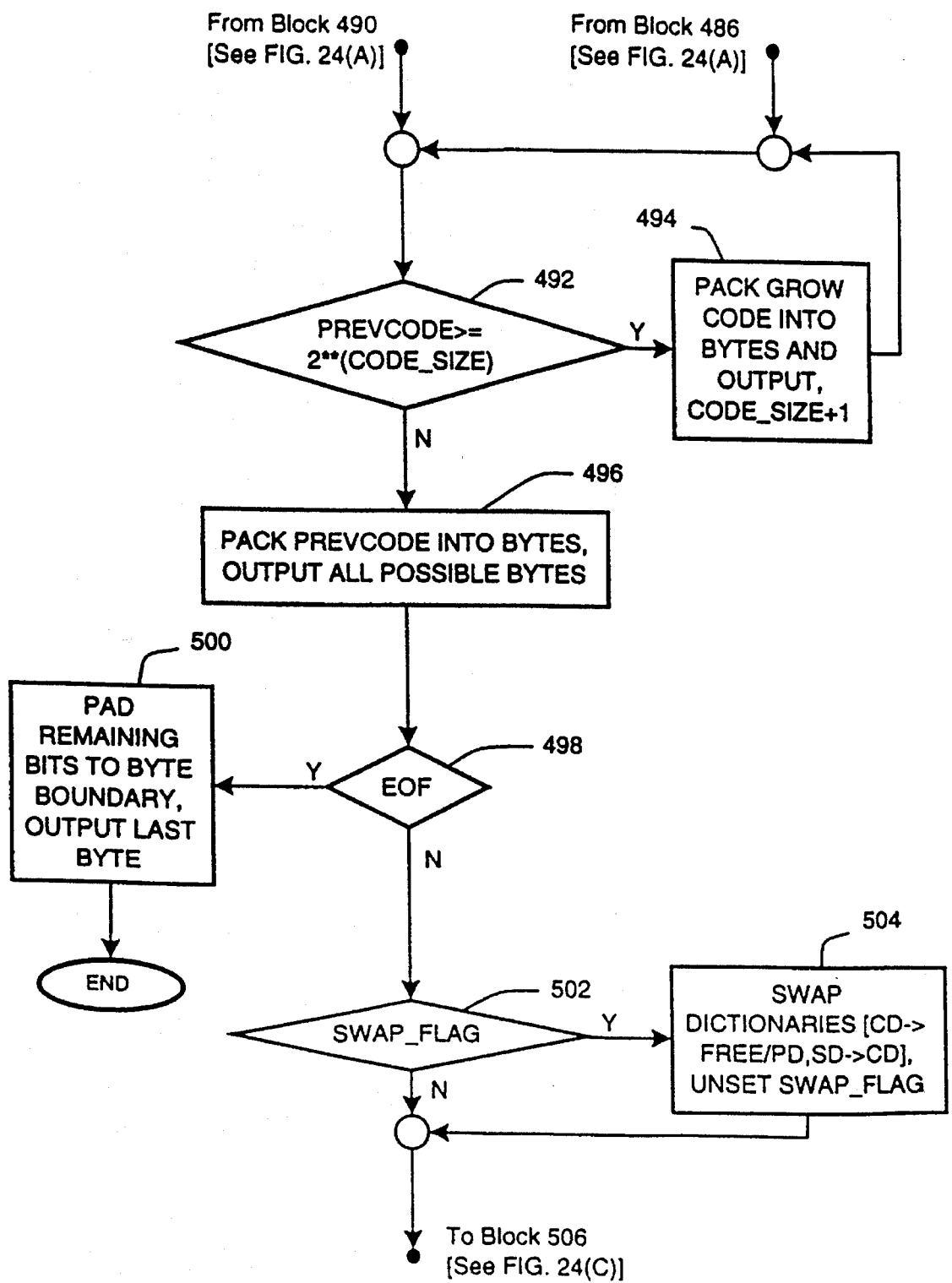
Figure 24C:
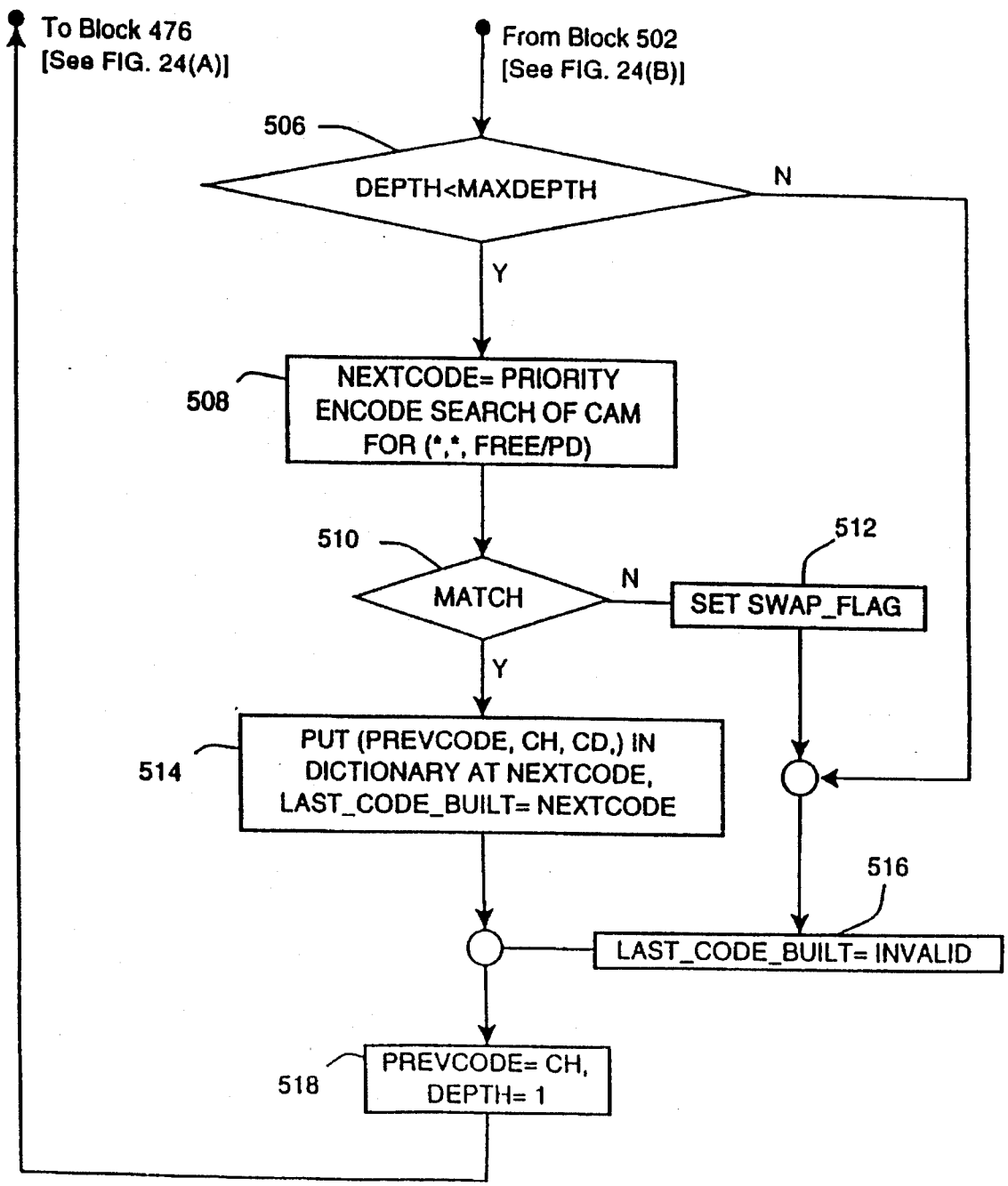

Before being output, the number of bits in PREVCODE is checked in decision block 492 (see FIG. 24B). If PREVCODE is greater or equal to $2^{CODE\_SIZE}$ it cannot be represented by the present number of CODE_SIZE bits (e.g., 9). In this case, block 494 increases CODE_SIZE by one so that all future output codes are represented by an additional bit. Block 494 also outputs a GROW control code using CODE_SIZE bits which must be packed into bytes by the formatter circuit (FIG. 4) before it can be output. The GROW code is a signal to the decompressor (see FIG. 26A) that all future codes will be one bit longer than the current code size. It is possible for PREVCODE to require more than one more bit in order to be output. Therefore, block 494 jumps back to decision block 492 and checks if another GROW must be sent before actually outputting PREVCODE. Block 496 then outputs PREVCODE using CODE_SIZE number of bits. The CODE_SIZE number is used by the formatter to pack PREVCODE into bytes before being output.

Decision block 498 is a continuation of the EOF check previously performed in decision block 478. A detected EOF condition in decision block 478 may come back into the main compression flow at block 492 in order to output the last best match code (PREVCODE) (see decision block 486). In addition, the last code output may not completely fill the last output byte. Statistically, only 1 out of 8 output codes will do so. Therefore, block 500 pads the leftover bits with 0's or 1's, if needed, before outputting the final byte. At this point, the compression process is finished.

If no EOF flag is detected, decision block 502 checks whether the SWAP_FLAG is set. If the SWAP_FLAG is set, the dictionaries are swapped by replacing FREE/PD with CD, and replacing CD with SD (SD->CD, CD->FREE/PD). Swapping the dictionaries does not actually change any data in the CAM but changes how the status field is interpreted by the compression engine (see FIG. 17). After a dictionary swap, the status register code that previously represented SD now represents CD, the status register code representing CD now represents FREE/PD, FREE/PD becomes INV, and INV becomes SD. INV remains empty because FREE/PD is always empty before the swap, thereby keeping INV empty after the swap. Also, since INV was empty before the swap (INV is always empty), the Standby Dictionary (SD) is also empty after the swap.

If decision block 502 determines that the SWAP_FLAG is not set, decision block 506 (FIG. 24C) checks to see if the number of characters in PREVCODE (DEPTH) is less than the maximum allowable string length (MAXDEPTH). If DEPTH=MAXDEPTH, the character string (PREVCODE, CH) is too long to be used as an output code and, therefore, will not be added to the current dictionary. If DEPTH<MAXDEPTH and there is a location available, the character string (PREVCODE,CH) is added to the current dictionary.

First block 508 searches the CAM for an available FREE/PD location by checking the CAM status fields while ignoring the code (PREVCODE) and character fields (CH). Thus, a match can be successful regardless of code or character field values. Since it is possible that there is more than one FREE/PD data entry, a priority encoder selects the match address with the lowest value.

As mentioned above, it is also possible to select between multiple matches according to which FREE/PD dictionary entry was least recently used. For example, a tag could be associated with each dictionary entry indicating the order in which the entries were stored in the CAM. The priority encoder would then select the least recently used data entry from among the multiple matches. The least recently used data entry is most probably the character string that is least likely to match a new encoded character string. Thus, replacing the least recently used data entry minimizes the effect in losing a small amount of compression information. Alternate priority selection methods are also capable of being implemented.

If a FREE/PD status field is located, decision block 510 jumps to block 514 where (PREVCODE,CH) is added to the CAM at the matched address location. Block 514 writes the (PREVCODE,CH) string into the CAM at address NEXTCODE and assigns the string to the current dictionary. The string (PREVCODE,CH) stays in CD until a match occurs with a new input character string whereby (PREVCODE, CH) is then promoted to SD. Otherwise, (PREVCODE,CH) stays in CD until a dictionary swap is performed, then it is reassigned or demoted to FREE/PD.

If the search for FREE/PD fails, block 512 sets the

SWAP_FLAG indicating that a dictionary swap is needed. Failure to find a FREE/PD status field also means that the string represented by (PREVCODE,CH) will not be entered into the dictionary. The dictionary swap is delayed until the next compression cycle (see decision block 502) in order to maintain synchronization with the decompression dictionary.

For example, the LZSD2 decompressor (see FIGS. 25 and 26 below) performs the status field update in a different order than the compressor and initiates the dictionary swap immediately after failing to find a FREE/PD status field. The LZSD2 decompressor updates the status field bits for a given codeword and then attempts to write the previous codeword into the dictionary. Therefore, delaying the dictionary swap in the LZSD2 compression process until after the next code's status fields have been updated, allows the compressor and decompressor dictionaries to be identical when a dictionary swap occurs.

If no codeword was built during the decompression cycle, block 516 sets LAST_CODE_BUILT to an invalid value. The most recently built codeword can then be used in future matches. Therefore, if a (PREVCODE,CH) character sting was not built because the maximum string length was exceeded (DEPTH=MAXDEPTH) or because the dictionary was full, the most recently built dictionary entry does not point to the address of the last (PREVCODE,CH) match (i.e., FOUNDCODE). Thus, block 516 sets LAST_CODE_BUILT to an INVALID address which cannot be matched with FOUNDCODE in the next search operation. Block 518 replaces PREVCODE with CH (PREVCODE=CH). Since PREVCODE now represents a one character string, DEPTH is set to 1.

Block 518 then jumps back to the block 476 to read the next character from the input data stream. The LZSD2 compression continues until all characters in the input character stream are encoded.

LZSD2 Decompression

In the present embodiment, the same three dictionaries used for LZSD2 compression (CD, SD, FREE/PD) are also used for implementing the LZSD2 decompression scheme. When the compressor runs out of locations in which to store new strings (those which have a FREE/PD status register assignment), the decompressor swaps dictionaries in a manner similar to that discussed above for LZSD2 compression. For example, CD becomes FREE/PD, SD becomes CD, and SD becomes empty after a dictionary swap. For data decompression, the processor interface 152 (FIG. 4) controls the flow of compressed data from the compressed data interface 148 through the compression/decompression engine 142 and out the string reversal queue in uncompressed data interface 138.

Figure 25:
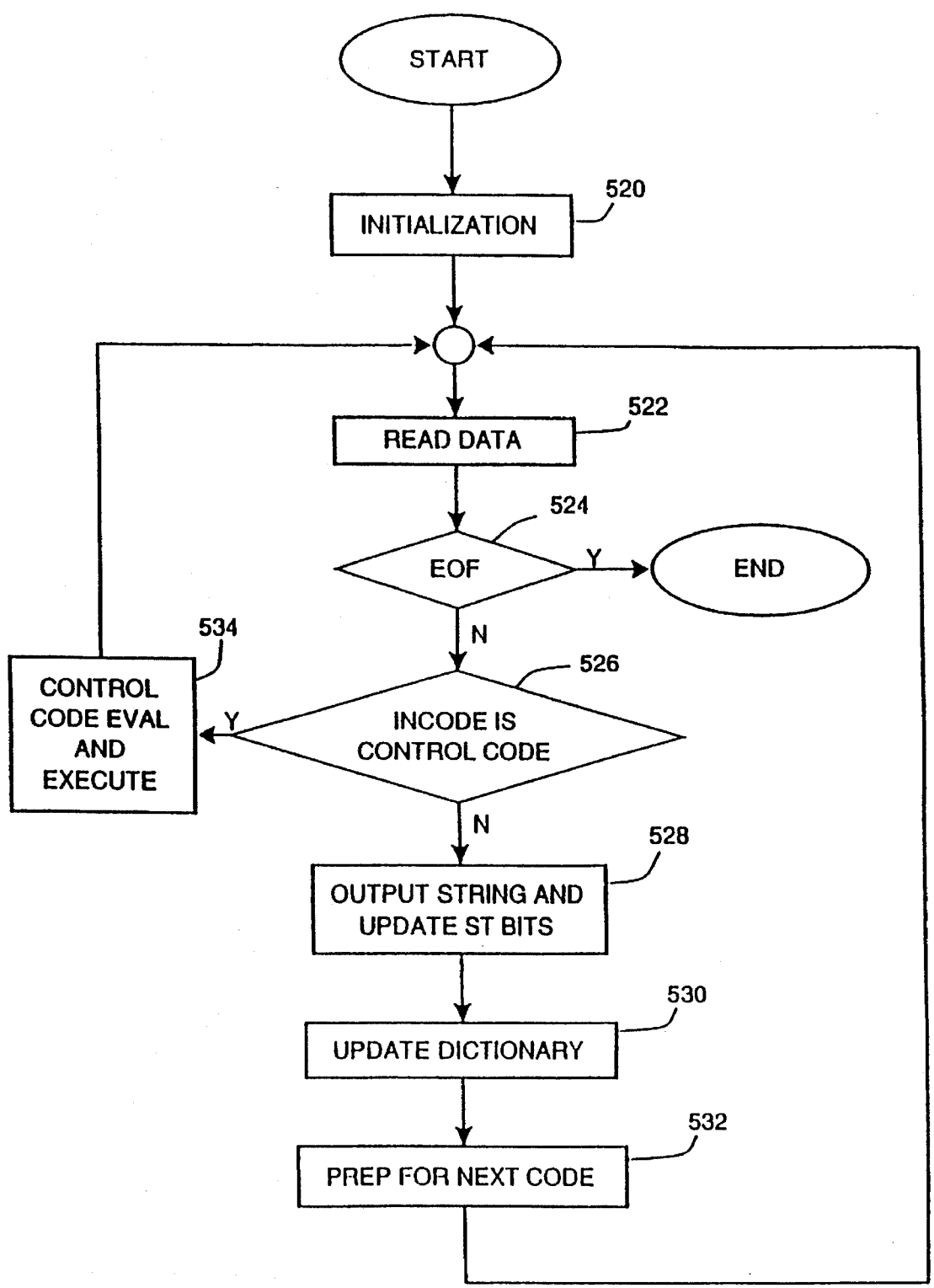
FIG. 25 is a data flow diagram showing the general method for a LZSD2 decompression method.

FIG. 25 is a general flow diagram showing LZSD2 decompression. Block 520 initializes the compression/decompression system shown in FIG. 4 for LZSD2 decompression. Block 522 then reads encoded input strings (INCODE) from a compressed input data stream and stores the encoded characters into a temporary variable/register. The input data stream represents the input character string previously encoded by the LZSD2 compression scheme described above in FIGS. 23 and 24A–C. Decision block 524 checks for a EOF condition indicating the end of the encoded character string. Decision block 526 determines whether the input character INCODE is a control code or an encoded character string.

If the input code INCODE is a control code (i.e., a character containing control instructions for the decompressor), block 534 evaluates the code and executes the required response. If decision block 526 determines that INCODE is encoded data (i.e., characters that identify compressed data from the LZSD2 compression engine), block 528 decodes the root codes (single decoded characters from the encoded data) and pushes the root codes onto a LIFO register (STACK) located in compressed data interface 148 (FIG. 4). Characters are then output as decompressed data by popping characters from the STACK until the STACK is empty.

Block 530 updates the decompression dictionary by combining input characters (FIRST_CHAR) and previous input code (PREV_CODE). The FREE/PD dictionary is then searched for available storage locations and the (PREV_CODE, FIRST_CHAR) string is stored in the next available FREE/PD address and assigned to the current dictionary. If no FREE/PD dictionary location is available, the decompression dictionaries are swapped [CD->FREE/PD, SD->CD]. Block 532 then prepares the decompression scheme for the next encoded string and returns to block 522 to repeat another decompression cycle. The decompression accurately decodes the compressed data back into its original state prior to being encoded in the LZSD2 compressor. It is important to note that the compressed data is lossless and contains all compression information within each encoded character.

Figure 26A:
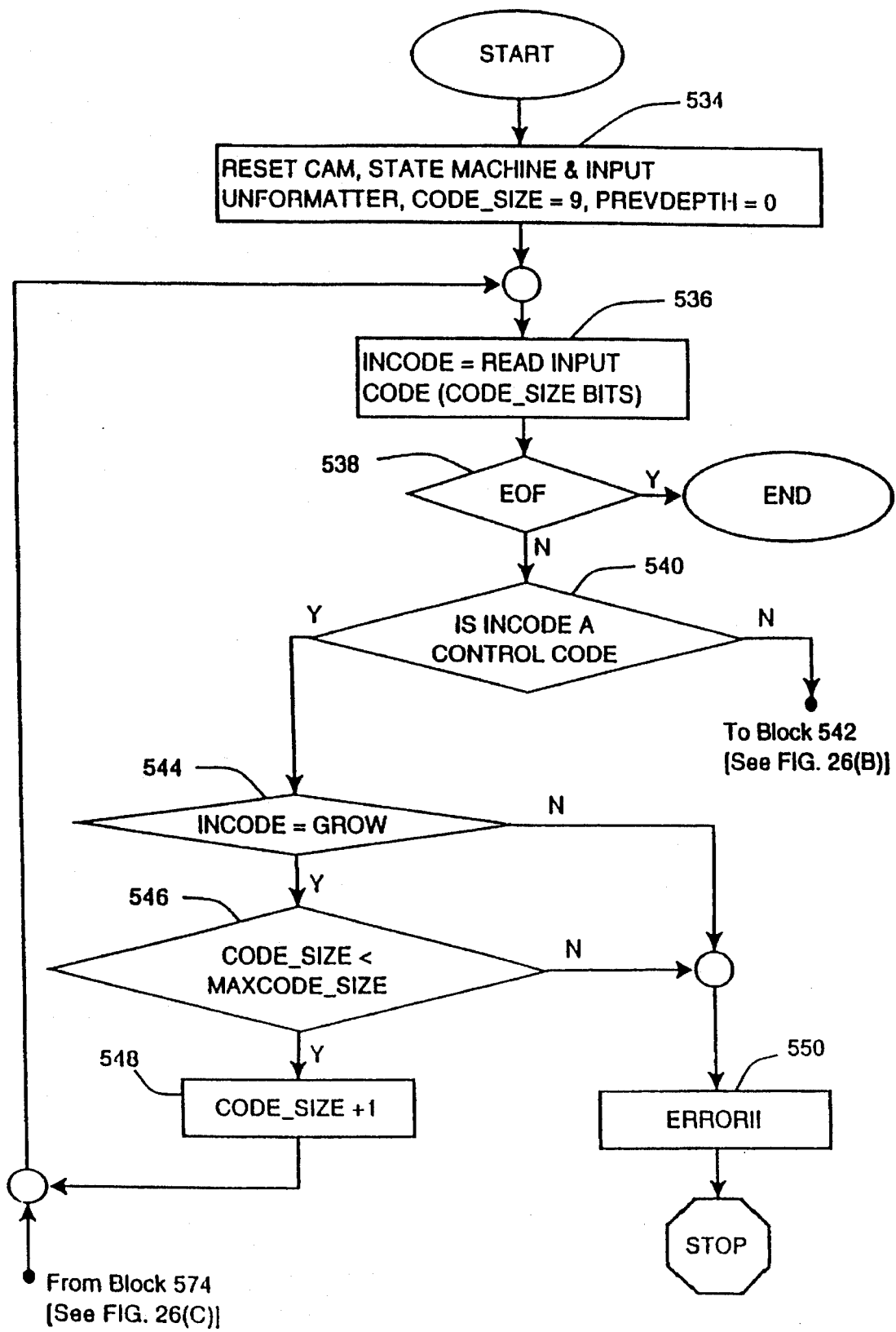
FIGS. 26A, 26B and 26C are a detailed data flow diagram for the procedure shown in FIG. 25.
Figure 26B:
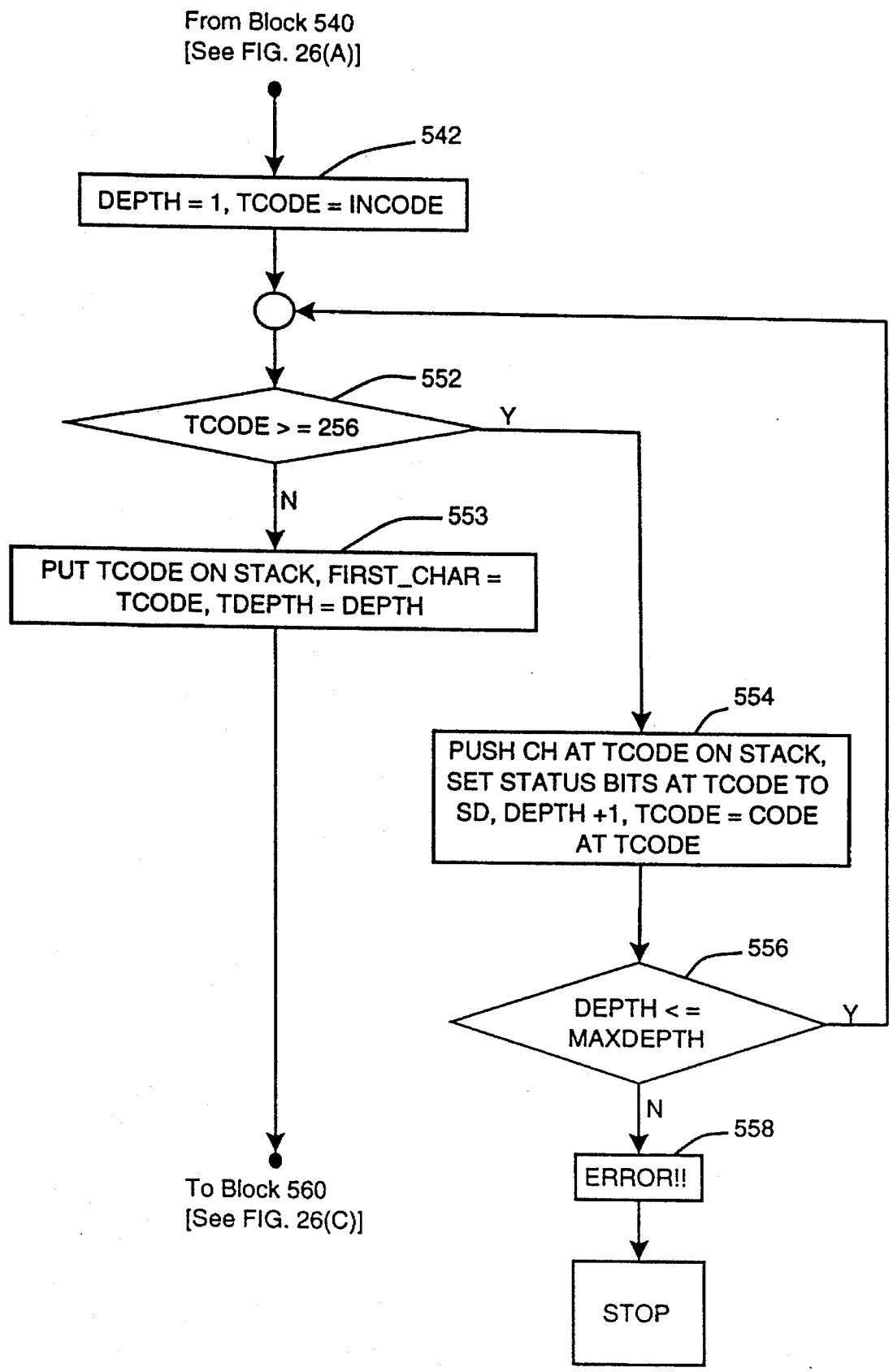
Figure 26C:
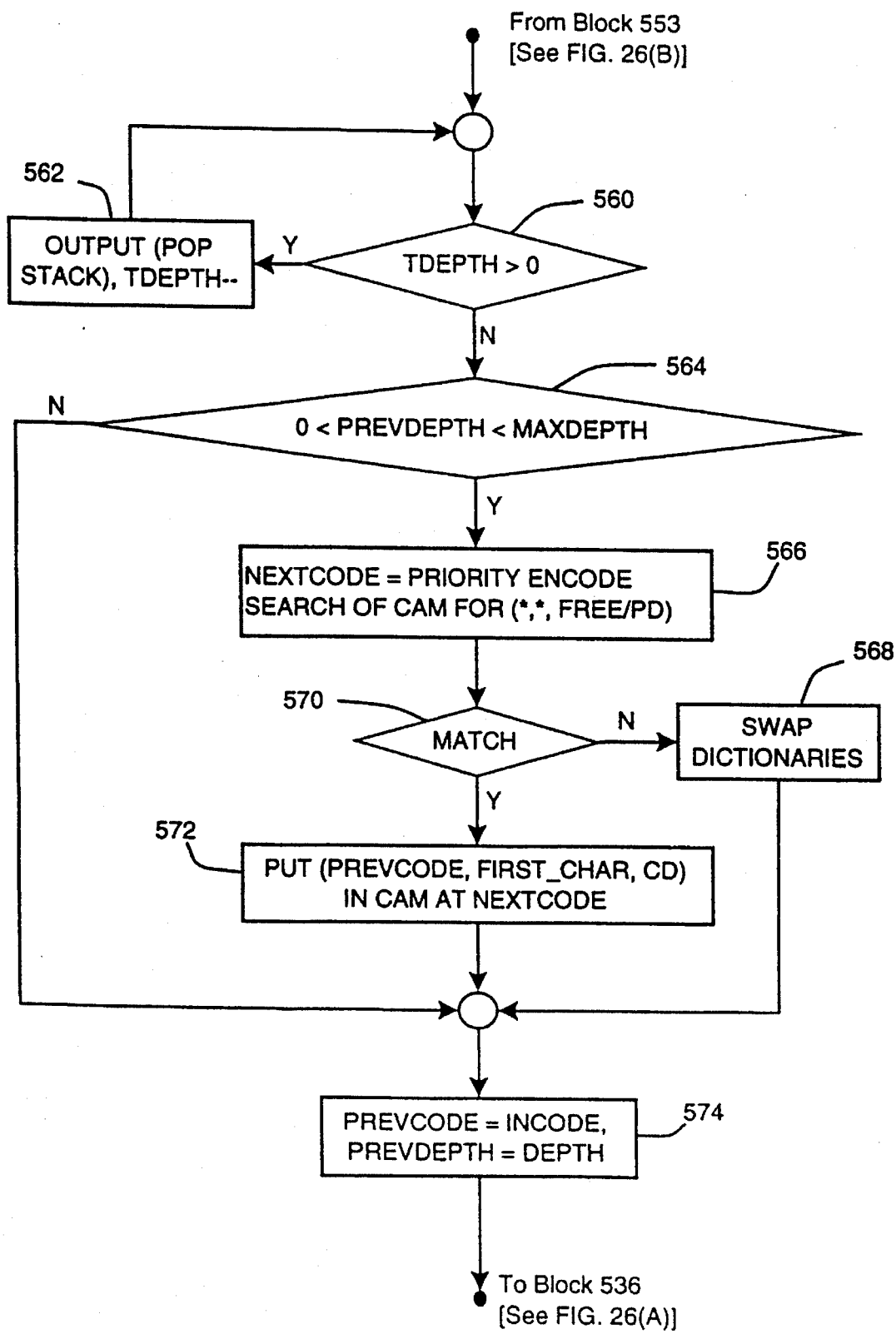

FIGS. 26A–C is a detailed flowchart further describing the LZSD2 decompression scheme shown in FIG. 25. At decompression start up, the CAM must have the same initial state that existed in the compressor when it created the compressed data. Therefore, block 534 in FIG. 26A sets each CAM entry with the same initial values originally set in the LZSD2 compressor. For example, each code, character and status field is typically assigned the values 000 Hex, 00 Hex, and FREE/PD, respectively. The decompressor interprets the initialized data entries as (NULL,NULL,FREE/PD). Alternative initialization schemes are also possible, as described above, but must be the same for both compression and decompression. The input data stream unformatter (i.e., compressed data interface 148 in FIG. 4) is reset to an empty initial state. CODE_SIZE is set to minimum (9) and PREVDEPTH is set to 0 indicating a first pass through the decompression loop.

Block 536 reads single bytes from the compressed input data stream and unpacks the bytes into CODE_SIZE bit codes (i.e., 9 bit codes). If more bits are needed to fill a CODE_SIZE bit code, block 536 reads additional bytes until CODE_SIZE bits are unpacked. The unpacked bit code is then assigned to variable/register INCODE and any leftover bits are used in the next code.

If reading the input code in block 536 fails due to reaching the end of the file (EOF), decision block 538 ends decompression. If the input code read is successful, decompression continues in decision block 540. If INCODE is a reserved code, decision block 540 jumps to decision blocks 544 and 546 to identify the specific reserved code where the appropriate action is taken. Specifically, decision block 544 determines if INCODE is a GROW code. A GROW code notifies the decompressor to start reading one more bit for each compressed code. If other control codes are used in the compression process they are also evaluated at this point.

A CODE_SIZE≧MAXCODE_SIZE indicates that the current code size is sufficient to represent all dictionary entries and therefore only an error could cause this control code to be decoded. Therefore, if the current CODE_SIZE is already at the maximum when a GROW code is encountered, decision block 546 jumps to block 550 where an error signal is generated. If CODE_SIZE is less than the maximum code size, block 548 increases the code size by one bit. All future codes will then be one bit longer than before. Block 548 then jumps back to block 536 to read the next input code (INCODE).

Referring back to decision block 540, if INCODE is not a control code, block 542 (FIG. 26B) sets up the decompressor for decoding INCODE. Since INCODE represents at least a one character string, DEPTH is now set to 1. Since INCODE is needed later in the decompression scheme, a different variable/register TCODE (Temporary INCODE) is used during decoding. Accordingly, block 542 sets TCODE equal to INCODE.

Decision block 552 (FIG. 26B) checks whether TCODE represents a single character string (e.g., less than 256) or a multiple character string (e.g., greater or equal to 256). For a multiple character string, block 554 puts the character at CAM address TCODE onto the top of the STACK. TCODE is then assigned to the Standby Dictionary by setting the Status bits at CAM address TCODE to SD. The value of DEPTH is incremented by one to equal to the present number of characters on the STACK plus one. The "plus one" is the first character of the string that was counted in block 542. The code field at CAM address TCODE is then assigned to TCODE. TCODE now represents the remaining string which has not yet been decoded.

If DEPTH is greater than MAXDEPTH, the STACK will overflow. Therefore, decision block 556 checks the number of characters represented by the code word and generates an error flag in block 558 and terminates decompression if DEPTH is greater than MAXDEPTH. An error can occur, for example, if the data input to the decompressor is not created by the LZSD2 compressor. If DEPTH is less than or equal to MAXDEPTH, decision block 556 jumps back to decision block 552. The decompression process continues to loop through block 554 where single characters CH are gleaned from TCODE and TCODE reassigned from the code field at address TCODE.

Decision block 552 jumps to block 553 when TCODE is less than 256. TCODE then represents a single character string (root code). Although not a requirement, all single character strings are mapped to the same code as the ASCII code for that character. This allows TCODE to be placed directly onto the top of the STACK as the first character of the string INCODE without doing a CAM look up. The first character in the STACK will be used later, therefore, TCODE is stored in a separate variable/register FIRST_CHAR. TCODE will not change before FIRST_CHAR is used, therefore, a variable/register FIRST_CHAR could be eliminated by simply using TCODE. However, FIRST_CHAR is used to make FIG. 26A–26C easier to understand.

DEPTH is now equal to the number of characters on the STACK since the final character placed on the STACK was not counted in block 553 but back in block 542. DEPTH is used and changed while emptying the STACK but the original DEPTH value is used later, therefore, the value of DEPTH is also assigned in block 553 to variable/register TDEPTH (Temporary Depth).

Referring to FIG. 26C, if TDEPTH is greater than 0, the STACK is not empty and decision block 560 jumps to block 562 where single characters are popped off STACK and output and TDEPTH decremented. Characters are popped off STACK and output until TDEPTH=0.

When the STACK is empty, the decompressor is ready to read a new encoded character from the compressed character stream. However, before the next encoded character is read, decision block 564 first checks the value of PREVDEPTH. If PREVDEPTH is between 0 and MAXDEPTH, the combined string PREVCODE (previously read encoded character) and FIRST_CHAR are stored in the next available FREE/PD location and assigned to CD (PREVCODE, FIRST_CHAR,CD). If PREVDEPTH=0, it is the first time through the decompressor and, therefore, there is not a new string to add to the CAM. If PREVDEPTH is greater than or equal to MAXDEPTH, then the new string (PREVCODE, FIRST_CHAR) is too long to be input into the CAM. In either case, decision block 564 jumps to block 574, skipping the steps next described for adding a new character string to the CAM.

If PREVDEPTH is between 0 and MAXDEPTH, block 566 searches the CAM for the next available CAM storage location by searching for the dictionary status fields for a FREE/PD value. The Code and Character fields are not searched since a match can be successful regardless of what the Code or Character fields contain. Since it is possible for more than one address to meet the conditions of the FREE/PD search, multiple matches must be reduced to one. Thus, block 566 uses the priority encoder used for compression to select the match address with the lowest value. If a FREE/PD location is found, the MATCH flag is then set and the match address assigned to NEXTCODE.

If the search for a FREE/PD location was successful (i.e., MATCH flag set), block 572 adds the string (PREVCODE, FIRST_CHAR) to the CAM at the matched location (NEXT_CODE) and assigns the string to the current dictionary (CD). If the search for a FREE/PD location failed, block 568 swaps the dictionaries, i.e., (SD–>CD, CD–>FREE/PD, FREE/PD–>INV). Failure to find a FREE/PD location means that the string represented by (PREVCODE, FIRST_CHAR) will not be entered into the CAM.

This extends the previous input string, PREVCODE, by the character FIRST_CHAR. The (PREVCODE,FIRST_CHAR) string stays in CD until the same (PREVCODE, FIRST_CHAR) string occurs again in the compressed data stream. The (PREVCODE,FIRST_CHAR) data entry is then promoted to SD or demoted to FREE/PD when the next dictionary swap is performed.

Block 574 sets PREVCODE equal to the value of INCODE. PREVCODE may be used in the next pass through the decompression to make a new (PREVCODE, FIRST_CHAR) character string for placing in the dictionary by using the first character of the next input code as an extension character. PREVDEPTH is set equal to the value of DEPTH in order to keep track of the string length of PREVCODE to prevent a greater than maximum length string from being added to the CAM. Then the process returns to block 536 (FIG. 26A).

Thus, it has been shown how LZSD2 increases the overall compression ratio of a lossless compression/decompression system by maintaining all data entries in dictionaries after a dictionary swap. Thus all data entries remain capable of matching new input character strings maintaining current compression data. Thus, compression will not drop off immediately following a dictionary swap. The LZSD2 also has the capability of adapting to new input data by selectively overwriting data entries assigned to the dictionary with the lowest priority. Thus, compression performance is optimized for current trends in the input data stream.

Having described and illustrated the principles of the invention in a preferred embodiment thereof, it should be apparent that the invention can be modified in arrangement and detail without departing from such principles. We claim all modifications and variation coming within the spirit and scope of the following claims.

We claim:

1. A method for compressing and decompressing data consisting of character strings using a memory based dictionary, the method comprising:

provide a memory device including a plurality of storage locations, each location having a unique address for storing a codeword for a character string as a data entry;

defining at least first and second dictionaries within the plurality of storage locations of the memory device;

storing a codeword that uniquely corresponds to a character string as each data entry;

assigning each stored data entry to at least one of the first and second dictionaries;

generating a codeword value representing an input data character string, the codeword value associated in memory with a previously stored codeword that corresponds to a portion of the input character string and is assigned to one of said dictionaries; and selectively overwriting one of the data entries currently assigned to one of the dictionaries with a new codeword associated with a new character string thereby using all data entries in the first and second dictionaries for generating codewords for character strings at all times during data compression and decompression.

2. A method according to claim 1 wherein at least one of said dictionaries is assigned an overwrite priority and data entries are selectively overwritten according to the overwrite priority of the data entries assigned in said one dictionary.

3. A method according to claim 1 wherein a plurality of selected data entries are sequentially overwritten with successive new codewords for new character strings not presently stored in memory.

4. A method according to claim 1 wherein the memory device has multiple states and the dictionary assignment for each data entry is determined according to a current state of the memory device.

5. A method according to claim 4 wherein each dictionary is assigned an overwrite priority and changing the state of the memory device changes the overwrite priority of at least one of the dictionaries so that data entries assigned to said dictionary become available for overwriting with new character strings.

6. A method according to claim 1 wherein storing codewords for character strings in the memory device comprise the following steps:

locating a storage location in the first dictionary that is available to be overwritten with a new codeword for a character string;

storing the new codeword in the available storage location of the first dictionary as a new data entry;

reassigning the new data entry to the second dictionary; and reassigning all data entries in the second dictionary to the first dictionary after all available storage locations in the first dictionary have been overwritten.

7. A method according to claim 6 wherein locating available storage locations in the first dictionary comprises locating one of said storage locations that do not contain a data entry and said storage locations that were previously assigned to the second dictionary.

8. A method according to claim 1 wherein data entries are selected for overwriting with new codewords according to the order in which the data entries were stored in the dictionary.

9. A method according to claim 1 wherein each codeword value is associated with an address in memory of a previously-stored codeword.

10. A method for compressing and decompressing data in a memory based dictionary comprising:

providing a content addressable memory, having a plurality of storage locations;

defining first, second, and third dictionaries within the plurality of storage locations of the content addressable memory;

storing unique codewords as data entries in said storage locations, each codeword corresponding to a data character string;

assigning each data entry to at least one of the first, second, and third dictionaries;

generating a codeword value representing a data character string, the codeword value associated in memory with a previously stored codeword that corresponds to the character string and is assigned to one of said dictionaries;

prioritizing each data entry in one of said dictionaries for selectable replacement with a new codeword not presently stored as a data entry in any of said dictionaries; and selectively overwriting the prioritized data entries currently assigned to said one dictionary with new codewords corresponding to new character strings not currently stored in the memory device while at the same time using all data entries of each dictionary for generating codeword values at all times during the compression and decompression process.

11. A method according to claim 10 wherein the content addressable memory has multiple states and the dictionary assignment for each data entry depends upon the state of the content addressable memory.

12. A method according to claim 11 wherein changing the state of the content addressable memory keeps each data entry assigned to at least one dictionary.

13. A method according to claim 10 wherein the data entries are selectively replaced with new codewords according to the data entries address locations.

14. A method according to claim 10 wherein each data entry is promoted to a dictionary with a higher priority thereby making the data entry less likely to be replaced with a new character string according to the number of times said data entry has been previously used for generating codeword values.

15. A method according to claim 10 wherein data entries are only available for selective replacement from a single dictionary.

16. A dictionary based data compression and decompression circuit comprising:

a memory device having a plurality of storage locations, each storage location having a data field for storing a codeword corresponding to an input character string as a data entry and a status field comprising at least two bits for assigning the data entry to at least one of the dictionaries;

means for receiving and compressing or decompressing input data to produce encoded or decoded data character strings using the stored codewords;

a status register having multiple fields each field comprising at least two bits for identifying data entries that are assigned to a dictionary, data entries that are not assigned to dictionaries, and data entries that have previously been assigned to a dictionary and are now available for replacement with a new codeword for a new character string;

means for changing the dictionary assignments for each data entry in the memory device by changing the values in the status register fields so that all data entries remain assigned to a dictionary at all times during data compression and decompression.

17. A data compression and decompression circuit according to claim 16 including means for simultaneously searching all data entries in said dictionaries for a stored codeword corresponding to a current character string.

18. A data compression and decompression circuit according to claim 16 including:

means for simultaneously searching the memory device for available storage locations without data entries or with data entries available for replacement with a new character string; and means for writing the new codeword in one of the available storage locations.

19. A data compression and decompression circuit according to claim 17 wherein every data entry available for replacement with a new character string is assigned to the same dictionary.

20. A data compression and decompression circuit according to claim 16 including means for reassigning all data entries from a first dictionary to a second dictionary after all storage locations in the first dictionary have been assigned data entries, the second dictionary having a priority that allows each assigned data entry to be overwritten with a new character string while at the same time allowing each data entry to be used for matching input data for producing encoded and decoded data strings.

21. A method according to claim 10 wherein each dictionary has an overwrite priority for determining whether the assigned data entries are available for overwriting with new codewords, data entries that match a new codeword value being reassigned to a dictionary with a high overwrite priority not available for overwriting with a new codeword value and data entries that do not match a new codeword value reassigned to a dictionary with a low overwrite priority available for overwriting with new codeword values.

22. A method for compressing and decompressing data in a character string using a memory based dictionary, the method comprising:

providing a memory device including a plurality of storage locations, each storage location having a unique address for storing codewords representing portions of the character string as data entries;

defining a free dictionary, current dictionary and standby dictionary within the plurality of storage locations of the memory device;

assigning each stored data entry to at least one of the dictionaries;

first generating a codeword value OMEGA representing a portion of the input character string associated with a data entry previously stored in memory and assigned to one of said dictionaries;

combining a second portion of the input character string CH to OMEGA to create a new codeword value (OMEGA,CH);

comparing (OMEGA,CH) with each stored data entry in each dictionary;

overwriting one data entry assigned to the free dictionary with (OMEGA, CH) and assigning (OMEGA,CH) to the current dictionary when (OMEGA, CH) represents a unique data character string not presently stored as a data entry;

assigning a data entry that matches (OMEGA,CH) to the standby dictionary; and resetting the memory device when each storage location contains a codeword assigned to one of said current and standby dictionaries so that each data entry previously assigned to the standby dictionary is reassigned to the current dictionary and each data entry previously assigned to the current dictionary is reassigned to the free dictionary.

23. A method according to claim 22 including assigning storage locations not currently storing codewords to the free dictionary.

* * * * *